(12) United States Patent
Wada

(10) Patent No.: US 6,453,399 B2
(45) Date of Patent: *Sep. 17, 2002

(54) SEMICONDUCTOR MEMORY DEVICE AND COMPUTER HAVING A SYNCHRONIZATION SIGNAL INDICATING THAT THE MEMORY DATA OUTPUT IS VALID

(75) Inventor: Tomohisa Wada, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/844,949

(22) Filed: Apr. 23, 1997

Related U.S. Application Data

(60) Continuation of application No. 08/901,938, filed on Jul. 29, 1997, now Pat. No. 5,859,806, which is a division of application No. 08/376,151, filed on Jan. 20, 1995, now abandoned.

(30) Foreign Application Priority Data

Jan. 20, 1994 (JP) ............................................. 6-004677

(51) Int. Cl.[7] ............................ G06F 12/00; G11C 7/00
(52) U.S. Cl. ....................................... 711/167; 711/100
(58) Field of Search ............................... 365/233.5, 198, 365/196, 191, 189.05; 395/309; 711/1, 167; 710/129, 61; 375/369, 370, 354; 369/59.19; 713/400

(56) References Cited

U.S. PATENT DOCUMENTS 3,564,507 A * 2/1971 Faivre et al. ............... 395/309
3,735,360 A * 5/1973 Anderson et al. .......... 711/149

4,150,361 A * 4/1979 Baltzer ....................... 365/220

(List continued on next page.)

FOREIGN PATENT DOCUMENTS

| JP | 2-7141 | 1/1990 |
| JP | 2-71488 | 2/1990 |
| JP | 4-159690 | 6/1992 |

OTHER PUBLICATIONS

Niijima, et al., "QRAM–Quick Access Memory System", IEEE International Conference on Compute Design: VLSI in Computers and Processors, pp. 417–420 (Sep. 17, 1990).*
"A I mV MOS Comparator" by Yen S. Yee et al. IEEE Journal of Solid–State Circuits, vol. SC–13, No. 3, Jun. 1978.
"Introduction to VLSI Systems" by Caryer Mead et al. Chapter 7.7, pp. 252–254.
"Design Techniques for High–Speed, High–Resolution Comparators" by Behzad Razayi et al., IEEE Journal of Solid–State Circuits, vol. 27, No. 12, Dec. 1992.

*Primary Examiner*—Do Hyun Yoo
*Assistant Examiner*—Yamir Encarnación
(74) *Attorney, Agent, or Firm*—McDermott, Will & Emery

(57) ABSTRACT

A computer includes a storage device having a plurality of memory cells, being operable to output data stored in the memory cell corresponding to an address signal, and being operable to output a data output fixing signal attaining a predetermined level in response to output of the data, and a processing device operable to apply the address signal to the storage device, take in the data from the storage device in response to the fact that the data output fixing signal attains the predetermined level, and perform processing in accordance with the data. The storage device and the processing device may be formed on a single chip. The processing device can take in and process the data whenever the data output fixing signal is output. When the storage device operates under conditions better than the worst conditions, data processing can be performed before elapse of a maximum access time determined in a specification prescribed taking the worst conditions into consideration.

9 Claims, 39 Drawing Sheets

U.S. PATENT DOCUMENTS

| | | | | |
|---|---|---|---|---|
| 4,479,178 A | * | 10/1984 | Schabowski | 395/309 |
| 4,656,614 A | * | 4/1987 | Suzuki | 365/189.04 |
| 4,811,202 A | * | 3/1989 | Schabowski | 710/127 |
| 4,839,796 A | * | 6/1989 | Rorden et al. | 711/157 |
| 5,034,922 A | * | 7/1991 | Burgess | 365/189.05 |
| 5,235,694 A | * | 8/1993 | Umeda | 711/167 |
| 5,239,639 A | * | 8/1993 | Fischer et al. | 711/167 |
| 5,422,859 A | * | 6/1995 | Masuda | 365/233.5 |
| 5,448,744 A | * | 9/1995 | Eifert et al. | 395/800.4 |
| 5,521,863 A | | 5/1996 | Kobayashi | |
| 5,528,551 A | | 6/1996 | Pinkham | |
| 5,530,944 A | * | 6/1996 | Stones | 711/167 |
| 5,557,582 A | | 9/1996 | Rawamoto | |
| 5,673,398 A | * | 9/1997 | Takeda | 710/61 |
| 5,761,735 A | * | 6/1998 | Huon et al. | 711/167 |
| 5,805,912 A | * | 9/1998 | Johnson et al. | 711/167 |

* cited by examiner

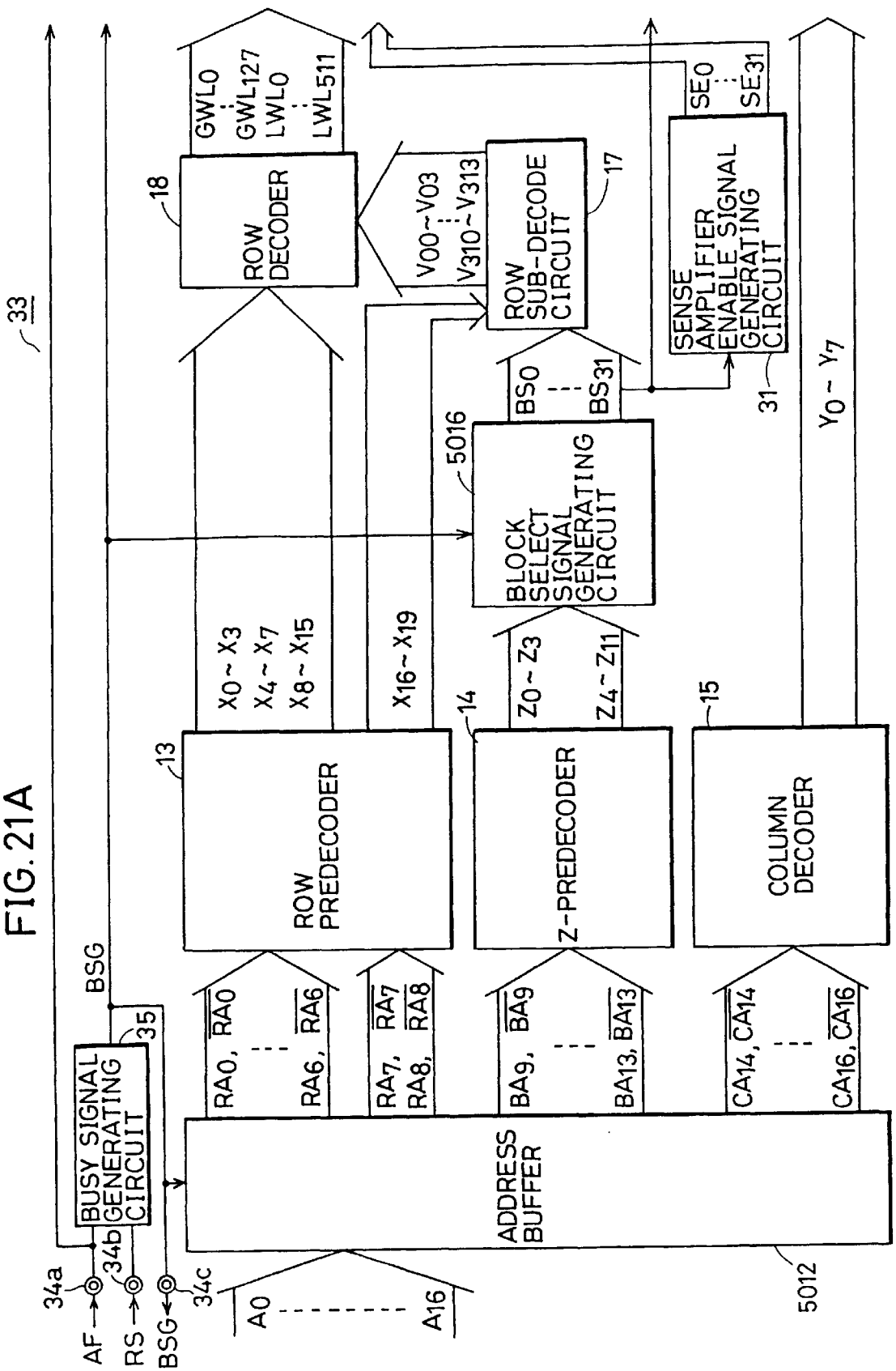

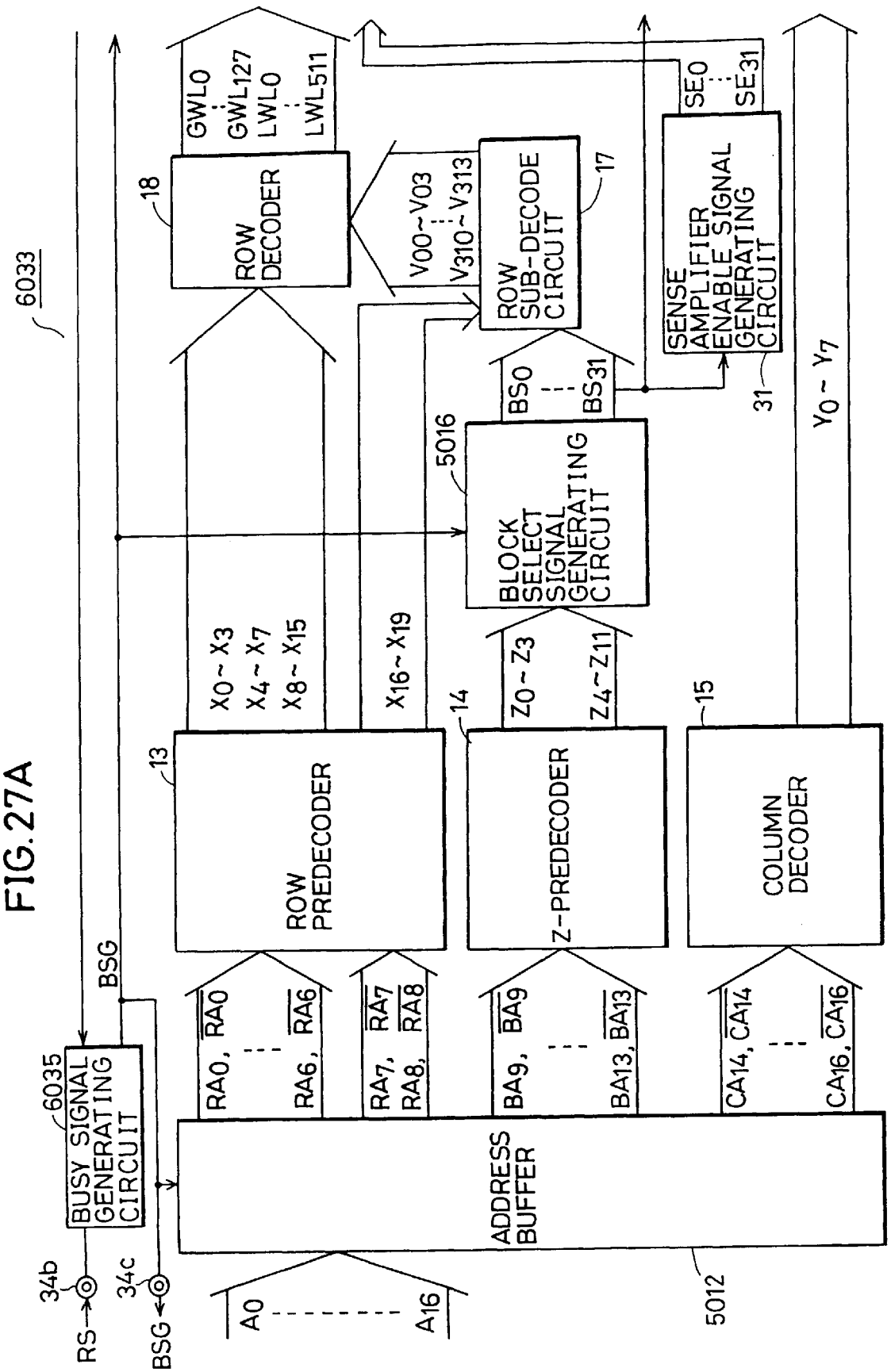

SEMICONDUCTOR MEMORY DEVICE AND COMPUTER HAVING A SYNCHRONIZATION SIGNAL INDICATING THAT THE MEMORY DATA OUTPUT IS VALID

This application is a division of application Ser. No. 08/376,151 filed Jan. 20, 1995, now abandoned in favor of continuation application Ser. No. 08/901,938, filed Jul. 29, 1997 now U.S. Pat. No. 5,859,806.

BACKGROUND OF THE INVENTION

1. Field of the Invention

The present invention relates to a semiconductor memory device and a computer, and in particular to a semiconductor memory device which produces a signal indicative of the fact that output is fixed in the operation of outputting stored data as well as a computer provided with this semiconductor memory device.

The semiconductor memory device according to the invention is applicable to any kinds of computer such as a super computer, a large scale computer, a work station and a personal computer.

2. Description of the Related Art

FIG. 1 shows a conventional semiconductor memory device such as a DRAM (Dynamic Random Access Memory) or an SRAM (Static Random Access Memory). In FIG. 1, an RAM (Random Access Memory) 1 receives address signals $A_0, A_1, \ldots$ as well as a control signal CTR which includes a row address strobe signal $\overline{RAS}$, a column address strobe signal $\overline{CAS}$ and a write enable signal $\overline{WE}$, if it is a DRAM, or control signal CTR includes a chip select signal $\overline{CS}$ and a write enable signal $\overline{WE}$, if it is an SRAM. In accordance with a state of control signal CTR, RAM 1 writes externally applied input data $D_{in}$ into memory cells selected by address signals $A_0, A_1, \ldots$, or reads potentials corresponding data stored in memory cells selected by address signals $A_0, A_1, \ldots$ for externally applying the same as output data $D_{out}$.

A read operation of the conventional semiconductor memory device thus constructed will be described below with reference to timing charts of FIGS. 2 and 3. FIG. 2 is the timing chart showing the read operation in the case where RAM 1 is the SRAM. In the read operation, chip select signal $\overline{CS}$ is set to the L-level as shown at (a) in FIG. 2 to activate the SRAM, and write enable signal $\overline{WE}$ is set to the H-level as shown at (b) in FIG. 2. Externally applied address signals $A_0, A_1, \ldots$ change at time $t_0$ as shown at (c) in FIG. 2.

In accordance with data stored in the memory cells selected by address signals $A_0, A_1, \ldots$, output data $D_{out}$ changes its state, as shown at (d) in FIG. 2, from a high impedance (Hi-Z) state to the H-level or L-level at time $t_1$ when an address access time $t_{AAC}$ (e.g., 10 ns) elapses from the time to of change of address signals $A_0, A_1, \ldots$ When chip select signal $\overline{CS}$ is set to the H-level at time $t_2$ as shown at (a) in FIG. 2, the SRAM is deactivated, and output data $D_{out}$ attains the high impedance (Hi-Z) state again as shown at (d) in FIG. 2.

FIG. 3 is the timing chart showing the read operation in the case where RAM 1 is the DRAM. Before time $t_0$ at which row address strobe signal $\overline{RAS}$ falls to the L-level as shown at (a) in FIG. 3, address signals $A_0, A_1, \ldots$ are set to the X-address of the memory cell to be selected as shown at (d) in FIG. 3. When row address strobe signal $\overline{RAS}$ falls to the L-level at time $t_0$ as shown at (a) in FIG. 3, the DRAM responding it takes in and latches the same using address signals $A_0, A_1, \ldots$ as the X-address. Then, write enable signal $\overline{WE}$ is set to the H-level at time $t_1$ as shown at (c) in FIG. 3, and the DRAM responds to the same and is controlled to perform the reading.

Column address strobe signal $\overline{CAS}$ is raised to the L-level at time $t_3$ as shown at (b) in FIG. 3. At time $t_2$ preceding time $t_2$, address signals $A_0, A_1, \ldots$ are set to the Y-address of the memory cell to be selected as shown at (d) in FIG. 3. Column address strobe signal $\overline{CAS}$ falls to the L-level at time $t_3$ as shown at (b) in FIG. 3. In accordance with data stored in the memory cell selected by the X-address and Y-address, output data $D_{out}$ changes its state from the high impedance (Hi-Z) state to the H-level or L-level at time $t_4$ after elapsing of an $\overline{RAS}$ access time $t_{RAS}$ (e.g., 50 ns) from time to and hence after elapsing of a $\overline{CAS}$ access time $t_{CAS}$ from time $t_3$. When column address strobe signal $\overline{CAS}$ is raised to the H-level at time $t_5$ as shown at (b) in FIG. 3, output data $D_{out}$ attains the high impedance (Hi-Z) state again as shown at (e) in FIG. 3.

In the conventional semiconductor memory device thus constructed, the specification of RAM prescribes the maximum access times ($t_{AAC}$(max), $t_{RAS}$(max), $t_{CAS}$(max) and others) in connection with the access time. The specification also prescribes the operation conditions of RAM. For example, a prescribed power supply potential is 5V±10% (4.5 V–5.5 V), and a prescribed operation temperature is from 0° C. to 70° C.

The access time of RAM mainly depends on the performance of transistors forming the RAM. In general, a current drive capability of the MOS transistor decreases as the power supply potential decreases, and also decreases as the operation temperature decreases. The operation speed decreases as the current drive capability decreases. The maximum access time is equal to the access time required under the worst environmental conditions of RAM, i.e., at a low power supply potential in a high temperature.

When designing the timing of a system using a conventional RAM, the designed access time must be equal to the maximum access time in view of a margin for allowing use or operation under the worst conditions of a low power supply potential and a high temperature, even if the system will not be used under the worst conditions in practice. Therefore, in spite of the fact that the actual access time can be shorter than the maximum access time unless it is used under the worst conditions, the speed of the system is unduly low due to the timing margin determined in view of the use under the worst conditions.

In a system operating in synchronization with a clock of a fixed frequency, it is necessary to design the system to operate with a low frequency allowing correct operation of the RAM under the worst conditions of the system. In practice, the system may not be used under the worst conditions. Even in such a case that the system can be operated at a higher speed because, e.g., the RAM can be accessed at a higher speed, the system must actually operate at the low speed as if it were operating under the worst conditions due to the fact that the clock frequency is fixed, so that the system speed is unduly reduced.

SUMMARY OF THE INVENTION

Accordingly, it is an object of the invention to provide a semiconductor memory device which can perform a normal operation at an increased speed without changing a manufacturing process as well as a computer provided with the same.

Another object of the invention is to increase an operation speed of a semiconductor memory device and a computer by eliminating undue restriction relating to the operation speed of a system under conditions other than the worst conditions.

Still another object of the invention is to increase an operation speed of a semiconductor memory device and a computer by using data immediately when the data is supplied from the semiconductor memory device under conditions other than the worst conditions.

An additional object of the invention is to provide a semiconductor memory device and a computer allowing a faster operation by increasing a data output speed itself of the semiconductor memory device and by allowing immediate use of the data when the data is output.

A further additional object of the invention is to provide a semiconductor memory device and a computer which can coexist with a conventional system and can perform a conventional operation at a higher speed.

A computer according to the invention includes a storage device having a plurality of memory cells, being operable to output data stored in the memory cell corresponding to an address signal applied through an address input terminal to a data output terminal, and being operable to output a data output fixing signal attaining a predetermined level in response to output of the data to an output fixing signal output terminal; and a processing device operable to apply the address signal to the address input terminal, receive the data from the data output terminal, take in the data in response to the data output fixing signal attaining the predetermined level, and perform processing in accordance with the data. The storage device and the processing device may be formed on a single chip.

When the storage device outputs the data, it also outputs the data output fixing signal at the predetermined level in response to the output of the data. The processing device can take in and process the data whenever the data output fixing signal is output. When the storage device operates under conditions better than the worst conditions, data processing can be performed before elapsing of a maximum access time determined in a specification taking the worst conditions into consideration, so that the time can be effectively utilized and the data processing can be performed at a high speed. In the structure where the storage device and the processing device are formed on the single chip, data output fixing signal is used only on the chip, and external input/output of the signal into and from the chip can be performed by the same manner as the conventional system.

According to another aspect of the invention, a semiconductor memory device includes a plurality of memory cell arrays each including a plurality of sub-memory cell arrays each including a plurality of memory cells; a plurality of data output line pairs provided correspondingly to the plurality of sub-memory cell arrays and each receiving a potential corresponding to data stored in a selected memory cell among the plurality of memory cells contained in the corresponding sub-memory cell array; a plurality of differential amplifiers connected to the plurality of data output line pairs, respectively, and each amplifying a potential difference of the corresponding data output line pair to output two complementary amplified signals; an output circuit receiving the amplified signals from each of the differential amplifier circuit and outputting data corresponding to the amplified signals selected by an address signal to an output terminal corresponding to the amplified signals; a plurality of sub-output fixing signal generating circuits each outputting a sub-output fixing signal attaining a first predetermined level in response to the fact that one of the amplified signals supplied from the corresponding differential amplifier circuit attains the H-level and the other of the same attains the L-level; and an output fixing signal generating circuit connected to the plurality of sub-output fixing signal generating circuits and outputting a data output fixing signal to an output fixing signal output terminal in accordance with the plurality of sub-output fixing signals.

When the storage device outputs data formed of multiple bits, the storage device also outputs the data output fixing signal attaining the predetermined level in accordance with the fact that the multiple bit data is output onto the data output line pair. A processing device receiving the data from the storage device can take in and process the data whenever the data output fixing signal is output. When the storage device operates under conditions better than the worst conditions, the data can be processed before elapsing of the maximum access time determined in the specification based on the assumptive worst conditions, so that the time can be effectively utilized and fast data processing is allowed.

According to still another aspect of the invention, a semiconductor memory device includes a memory cell array having a plurality of memory cells; a data output line pair receiving potentials being in a range from a first potential (e.g., ground potential) to a second potential (e.g., power supply potential) higher than the first potential and corresponding to data stored in the memory cell selected in accordance with an address signal from the plurality of memory cells in the memory cell array, and producing a potential difference between one of the potentials and the other of the same; a precharge device receiving a precharge signal to set the data output line pair to a precharge potential higher than the first potential and lower than the second potential in accordance with the precharge signal; a differential amplifier circuit receiving one and the other of the potentials of the data output line pair and amplifying signals on the data output line pair for outputting the amplified signals; and an output fixing signal generating circuit receiving the amplified signals from the differential amplifier circuit and outputting an output fixing signal attaining a predetermined level in response to the fact that one of the received signals attains the H-level and the other attains the L-level.

When the storage device outputs data formed of multiple bits, the storage device also outputs the data output fixing signal attaining the predetermined level in accordance with the fact the multiple bit data is output onto the data output line pair. A processing device receiving the data from the storage device can take in and process the data whenever the data output fixing signal is output. When the storage device operates under conditions better than the worst conditions, the data can be processed before elapsing of the maximum access time determined in the specification based on the assumptive worst conditions, so that the time can be effectively utilized and fast data processing is allowed. Further, since the data output line pair is precharged to the potential between the first and second potentials prior to the output of the data, the potentials of the data output line pair are rapidly set to the potentials corresponding to the read data, so that data output can be rapidly performed.

According to yet another aspect of the invention, a computer includes a storage device having a plurality of memory cells, receiving a first signal indicative of existence and absence of request of operation and responding to predetermined change of the first signal indicative of generation of the request of the operation and an address signal by outputting a busy signal at a predetermined level, data from the memory cell corresponding to the address signal and a data output fixing signal attaining a predetermined level in accordance with the output of the data; and a processing device applying the address signal and an operation request signal indicative of the request of the operation to the storage device only when the busy signal is at a level other than the predetermined level, and taking in the data supplied from the storage device in accordance with the fact that the data output fixing signal supplied from the storage device attains the predetermined level for processing the same.

According to the above computer, when the storage device outputs the data, it also outputs the data output fixing signal attaining the predetermined level in response to the output of the data. The processing device can take in and process the data whenever the data output fixing signal is output. When the storage device operates under conditions better than the worst conditions, data processing can be performed before elapsing of a maximum access time determined in a specification based on the assumptive worst conditions, so that the time can be effectively utilized and the data processing can be performed at a high speed. Upon receipt of the request of the operation, the storage device outputs the busy signal, so that it is also possible to use the processing device for suppressing the storage device from requesting the operation.

According to further another aspect of the invention, a semiconductor memory device includes a plurality of memory cells; and a device being responsive to a signal indicative of generation of request of operation and an address signal to output a busy signal at a predetermined level, data from the memory cell corresponding to the address signal and a data output fixing signal attaining a predetermined level in accordance with the fact that the data is output.

When the storage device outputs the data, it also outputs the data output fixing signal attaining the predetermined level in response to the output of the data. An external processing device can take in and process the data whenever the data output fixing signal is output. When the storage device operates under conditions better than the worst conditions, data processing can be performed before elapsing of a maximum access time determined in a specification based on the assumptive worst conditions, so that the time can be effectively utilized and the data processing can be performed at a high speed. Upon receipt of the request of the operation, the storage device outputs the busy signal, so that it is also possible to use the processing device for suppressing the storage device from requesting the operation.

According to an additional aspect of the invention, a semiconductor memory device includes a main memory having a plurality of DRAM memory cells, and receiving a main memory address signal to output data stored in the DRAM memory cell selected by the main memory address signal and a main memory output fixing signal attaining a first predetermined level in response to the output of the data; and a cache memory. The cache memory includes an SRAM memory array and a tag memory array. The SRAM memory array includes a plurality of SRAM memory cells, and receives a cache memory address signal to output the data stored in the SRAM memory cell selected in accordance with the cache memory address signal and output a cache memory output fixing signal attaining a second predetermined level in response to the output of the data. The tag memory array includes a plurality of SRAM memory cells, and receives the cache memory address signal to output tag address data stored in the SRAM memory cell selected in accordance with the cache memory address signal. The semiconductor memory device further includes a comparator circuit receiving a portion of the main memory address signal corresponding to the tag address data and the tag address data, and outputting a cache-hit signal attaining a first level or a second level depending on whether they agree or not; and a select circuit receiving the data and the cache memory output fixing signal from the cache memory and receiving the cache-hit signal sent from the comparator circuit to select, depending on the cache-hit signal, the data and the cache memory data output fixing signal sent from the cache memory, or the data and the main memory data output fixing signal sent from the main memory for outputting the same as output data and an output fixing signal.

When the storage device outputs the data, it also outputs the data output fixing signal attaining the predetermined level in response to the output of the data. A processing device can take in and process the data whenever the data output fixing signal is output. When the storage device operates under conditions better than the worst conditions, data processing can be performed before elapsing of a maximum access time determined in a specification based on the assumptive worst conditions, so that the time can be effectively utilized and the data processing can be performed at a high speed. Further, the device can generate the output fixing signal indicative of the facts that the data is output from the cache memory, if the read data is on the cache memory, and that the data is output from the main memory, if the read data is on the main memory. Accordingly, an operation speed of the storage system including the cache memory can be further increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 21A and 21B are block diagrams of the SRAM in the sixth embodiment of the invention;

FIGS. 27A and 27B are block diagrams showing an SRAM of a seventh embodiment of the invention;

DESCRIPTION OF THE PREFERRED EMBODIMENTS

First Embodiment

Figure 4:
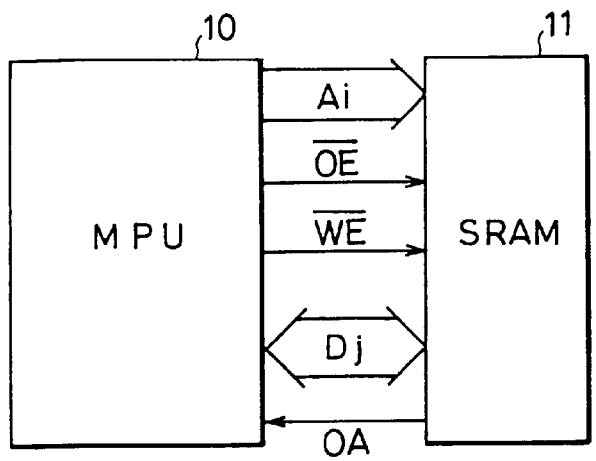
FIG. 4 is a block diagram showing a computer of a first embodiment of the invention.

A first embodiment of the invention will be described below with reference to FIGS. 4 to 12. FIG. 4 shows a computer provided with an MPU (Micro Processor Unit) 10 and an SRAM 11. MPU 10 is an example of processing means in the invention. MPU 10 generates address signals $A_i$ (i=0, 1, ..., 16), an output enable signal $\overline{OE}$ for reading data $D_j$ (j=0, 1, ..., 7) from SRAM 11, and a write enable signal $\overline{WE}$ for writing data $D_j$ into SRAM 11, and supplies them to SRAM 11. MPU 10 receives data $D_j$ and a data output fixing signal OA from SRAM 11. MPU 10 sets output enable signal $\overline{OE}$ and write enable signal $\overline{WE}$ to the L-level and H-level, respectively, when reading data $D_j$ from SRAM 11, and latches data $D_j$ supplied thereto for taking in and processing the same when data output fixing signal OA attains the H-level. In this operation, MPU 10 accesses SRAM 11 without using a clock signal. For writing data into SRAM 11, MPU 10 sets output enable signal $\overline{OE}$ and write enable signal $\overline{WE}$ to the H-level and L-level, respectively, for supplying write data $D_j$ to SRAM 11.

SRAM 11 is an example of the storage means and semiconductor memory device of the invention. SRAM 11 receives address signal $A_i$, output enable signal $\overline{OE}$ and write enable signal $\overline{WE}$ from MPU 10. SRAM 11 outputs data $D_j$ from a memory cell selected by the address signal when output enable signal $\overline{OE}$ is at the L-level and write enable signal $\overline{WE}$ is at the H-level, and outputs data output fixing signal OA which attains the H-level when data $D_j$ is settled. SRAM 11 writes data $D_j$ into the memory cell selected by the address signal when output enable signal $\overline{OE}$ is at the H-level and write enable signal $\overline{WE}$ is at the L-level.

Figure 5:
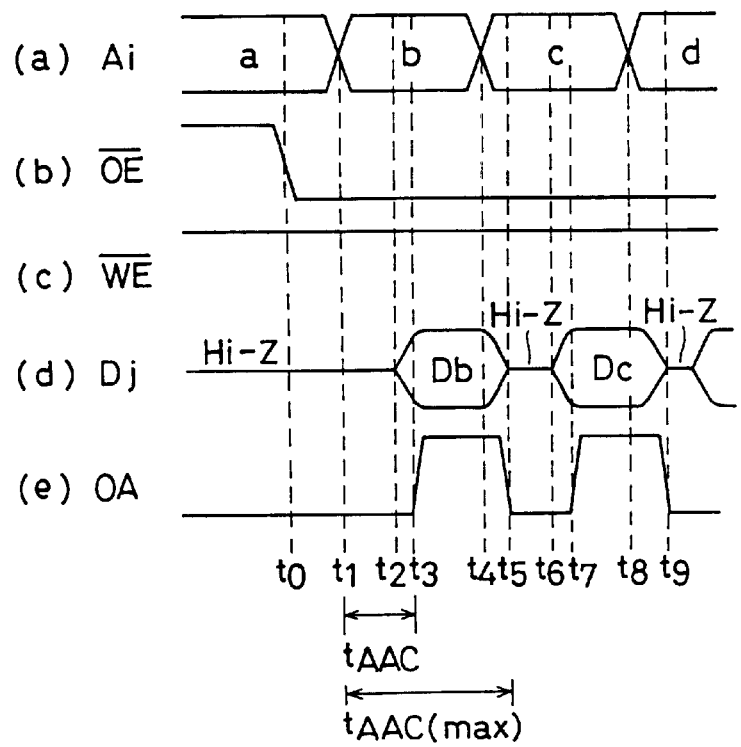
FIG. 5 is a timing chart showing an operation of the computer of the first embodiment of the invention.

FIG. 5 is a timing chart showing operations of the computer shown in FIG. 4 for reading data $D_j$ from SRAM 11 into MPU 10 under conditions better than the worst conditions of a high temperature and a low power supply voltage. While write enable signal $\overline{WE}$ supplied from MPU 10 is kept at the H-level as shown at (c) in FIG. 5, output enable signal $\overline{OE}$ is lowered to the L-level at time $t_0$ as shown at (b) in FIG. 5. An intended address signal $A_i$ (=b) is applied at time $t_1$ as shown at (a) in FIG. 5. At time $t_2$, data $D_j$ (=$D_b$) starts to be output from the memory cell selected by address signal $A_i$ as shown at (b) in FIG. 5. In accordance with this, data output fixing signal OA indicative of settling of data $D_j$ is raised to the H-level at time $t_3$ as shown at (c) in FIG. 5.

In response, MPU 10 latches and takes in data $D_j$ for processing the same, and then it applies a next address signal $A_i$ (=c) to SRAM 11 at time $t_4$ as shown at (a) in FIG. 5. SRAM 11 performs a precharge operation in response to this. In this operation, data $D_j$ is maintained at a high impedance (Hi-Z) during a period from time $t_5$ to time $t_6$ as shown at (d) in FIG. 5, and data output fixing signal OA falls to the L-level as shown at (e) in FIG. 5. After data $D_j$ (=$D_c$) starts to be output from the memory cell selected by address signal $A_i$ at time $t_6$ as shown at (d) in FIG. 5, data output fixing signal OA indicative of fixing of data $D_j$ rises to the H-level in response to it at time $t_7$ as shown at (e) in FIG. 5, and performs operations similar to those from time $t_2$ to time $t_5$.

In the operation of the prior art under conditions better than the worst conditions of a high temperature and a low power supply voltage, an MPU latches data $D_j$ for taking in and processing the same, and generates next address signal $A_i$ only after elapsing of a maximum address access time $t_{AAC}$(max). In contrast to this, MPU 10 of the first embodiment latches data $D_j$ for internally taking in and processing the same, and generates next address signal $A_i$ when an address access time $t_{AAC}$ (=$t_3$-$t_1$) elapses. As a result, a useless wait time can be suppressed, and an operation speed can be increased.

Figure 6A:
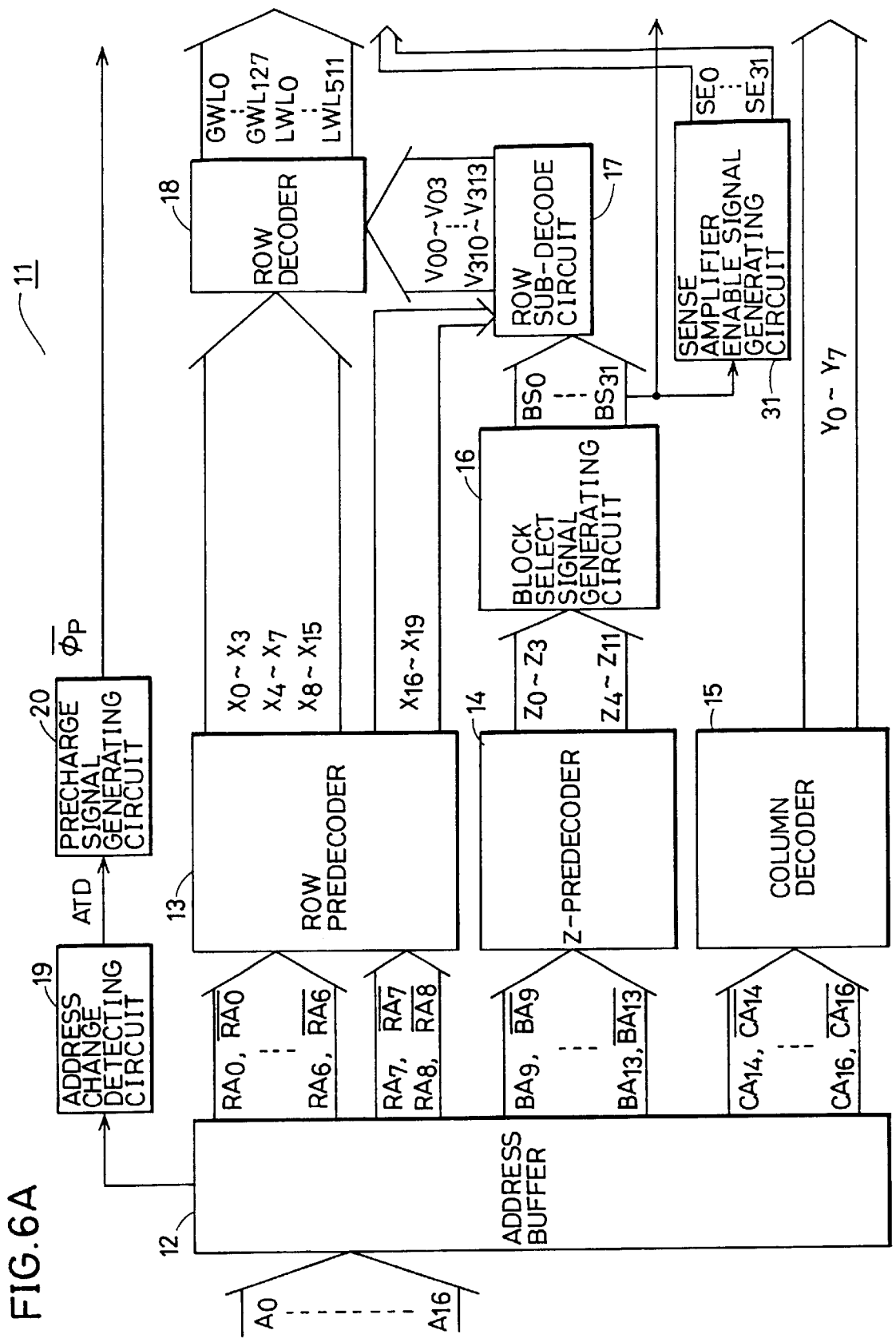
FIGS. 6A and 6B are block diagrams of an SRAM in the first embodiment of the invention.
Figure 6B:
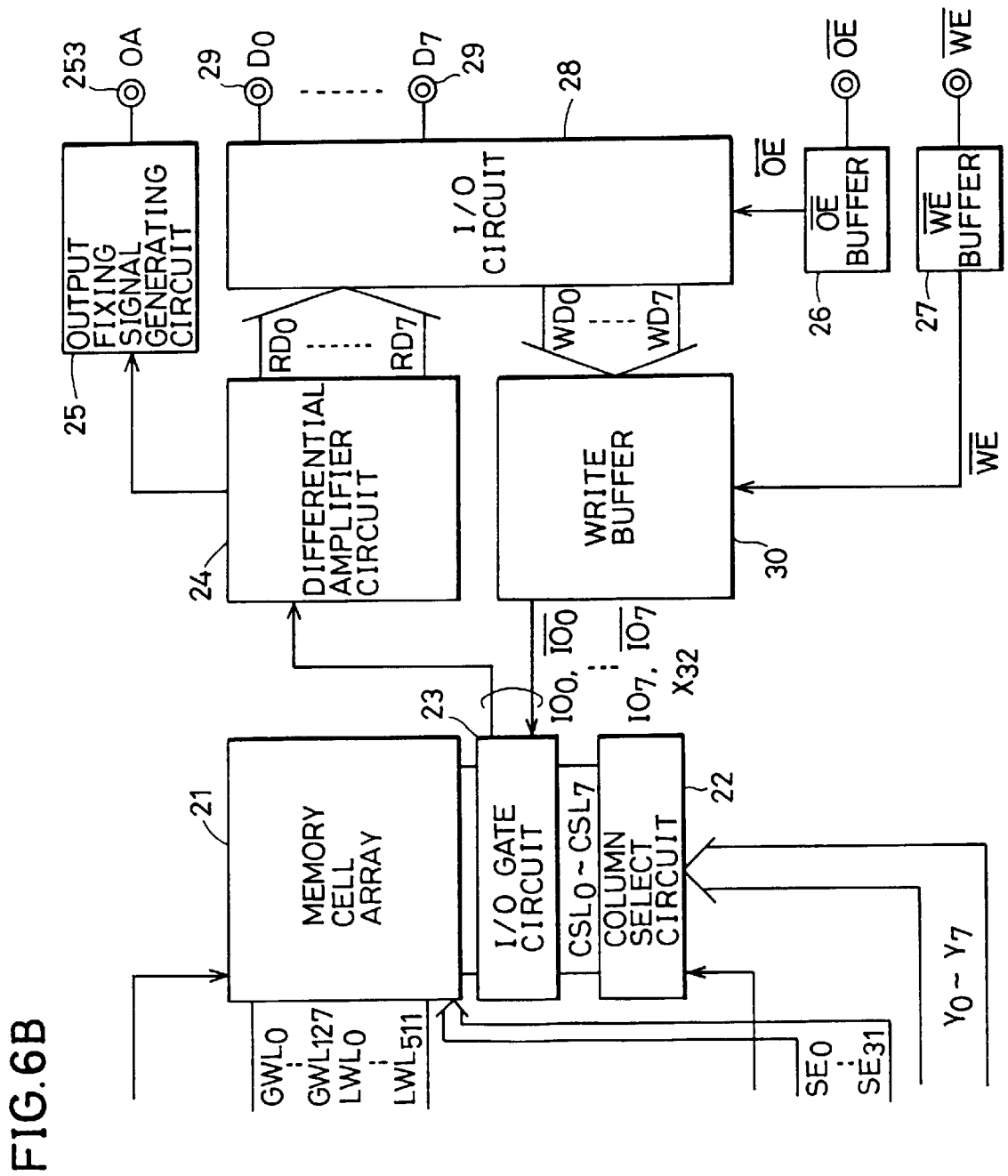

Then, a structure of SRAM 11 of the first embodiment shown in FIG. 4 will be described below with reference to FIGS. 6A and 6B and FIGS. 7 to 11. FIGS. 6A and 6B are block diagrams of SRAM 11. In FIGS. 6A and 6B, SRAM 11 includes an address buffer 12, which receives externally applied address signals $A_i$ (i=0, 1, . . . , 16), and produces row address signals $RA_0$–$RA_8$, block address signals $BA_9$–$BA_{13}$ and column address signals $CA_{14}$–$CA_{16i}$ of the same logic as received address signals A as well as inverted signals $\overline{RA_0}$–$\overline{RA_8}$, $\overline{BA_9}$–$\overline{BA_{13}}$ and $\overline{CA_{14}}$–$\overline{CA_{16}}$ thereof for an internal circuit, and a row predecoder 13 receiving row address signals $RA_0$, $\overline{RA_0}$–$RA_8$, $\overline{RA_8}$ from address buffer 12 for outputting row predecode signals $X_0$–$X_3$, one of which attains the H-level in accordance with $RA_0$, $\overline{RA_0}$ and $RA_1$, $\overline{RA_1}$, row predecode signals $X_4$–$X_7$, one of which attains the H-level in accordance with $RA_2$, $\overline{RA_2}$ and $RA_3$, $\overline{RA_3}$, row predecode signals $X_8$–$X_{15}$, one of which attains the H-level in accordance with $RA_4$, $\overline{RA_4}$, $RA_5$, $\overline{RA_5}$ and $RA_6$, $\overline{RA_6}$, and row predecode signals $X_{16}$–$X_{19}$, one of which attains the H-level in accordance with $RA_7$, $\overline{RA_7}$ and $RA_8$, $\overline{RA_8}$.

SRAM 11 further includes a Z-predecoder 14 receiving block address signals $BA_9$, $\overline{BA_9}$–$BA_{13}$, $\overline{BA_{13}}$ from address buffer 12 for outputting Z-predecode signals $Z_0$–$Z_3$, one of which attains the H-level in accordance with $BA_9$, $\overline{B_9}$ and $BA_{10}$, $\overline{BA_{10}}$, and Z-predecode signals $Z_4$–$Z_{11}$, one of which attains the H-level in accordance with $BA_{11}$, $\overline{BA_{11}}$, $BA_{12}$, $\overline{BA_{12}}$ and $BA_{13}$, $\overline{BA_{13}}$, a column decoder 15 receiving column address signals $CA_{14}$, $\overline{CA_{14}}$–$CA_{16}$, $\overline{CA_{16}}$ from address buffer 12 for outputting column decode signals Y0–Y7, one of which attains the H-level in accordance with $CA_{14}$, $\overline{CA_{14}}$, $CA_{15}$, $\overline{CA_{15}}$, and $CA_{16}$, $\overline{CA_{16}}$, and a block select signal generating circuit 16 for generating block select signals $BS_0$–$BS_{31}$, one of which attains the H-level in accordance with Z-predecode signals $Z_0$–$Z_{11}$ sent from Z-predecoder 14.

SRAM 11 further includes a row sub-decode circuit 17 receiving block select signals $BS_k$ (k=0, 1, . . . , 31) from block select signal generating circuit 16 and row predecode signals $X_1$ (l=16, 17, 18, 19) from row predecoder 13 and outputting sub-decode signals $V_{k(1-16)}$, one of which attains the H-level in such a manner that, for example, $V_{71}$ is at the H-level when $BS_7$ is at the H-level and $X_{17}$ is at the H-level, and $V_{173}$ is at the H-level when $BS_{17}$ is at the H-level and $X_{19}$ is at the H-level, and a row decoder 18 which receives row predecode signals $X_0$–$X_{15}$ sent from row predecoder 13 and sub-decode signals $V_{k(1-16)}$ sent from row sub-decode circuit 17 for setting one of 128 global select lines to the H-level and setting one of 512 local word lines in the block corresponding to block select signal $BS_k$ at the H-level to the H-level.

SRAM 11 further includes an address change detecting circuit 19 which receives the address signal from address buffer 12 for outputting an address change signal ATD which is formed of a one-shot pulse and is kept at the H-level for a predetermined period in response to change of the received address signal, and a precharge signal generating circuit 20 which receives address change signal ATD from address change detecting circuit 19 for outputting a precharge signal $\overline{\phi}_p$ which is kept at the L-level for a predetermined period in response to the change of address change signal ATD to the H-level.

Referring to FIG. 6B, SRAM 11 further includes a memory cell array 21 having a plurality of global word lines, a plurality of local word lines, a plurality of bit line pairs arranged perpendicularly to these word lines, a plurality of memory cells arranged correspondingly to crossings between the respective bit line pairs and local word lines, and a plurality of bit line precharge circuits which are provided correspondingly to the respective bit line pairs for precharging the corresponding bit line pairs to a power supply potential $V_{cc}$ (e.g., 5.0 V) when precharge signal $\overline{\phi}_p$ sent from precharge signal generating circuit 20 attains the L-level. SRAM 11 further includes a column select circuit 22 receiving block select signals $BS_k$ sent from block select signal generating circuit 16 and column decode signals Y0–Y7 sent from column decoder 16 for setting one of column select signals $CSL_0$–$CSL_7$ for the block, which corresponds to block signals $BS_K$ attaining the H-level, to the H-level.

SRAM 11 further includes an I/O gate circuit 23, which receives column select signals $CSL_0$–$CSL_7$ from column select circuit 22 and selectively connects the bit line pair corresponding to the column select signal attaining the H-level to the I/O line pair, a differential amplifier circuit 24, which amplifies potentials $IO_0$, $\overline{IO_0}$–$IO_7$, $\overline{IO_7}$ transmitted from I/O gate circuit 23 via the I/O line pair for producing amplified signals $RD_0$–$RD_7$, an output fixing signal generating circuit 25, which receives the amplified signals from differential amplifier circuit 24 to produce data output fixing signal OA corresponding to it, an $\overline{OE}$ buffer 26, which externally receives output enable signal $\overline{OE}$ to produce internal output enable signal $\overline{OE}$ for the internal circuitry, a $\overline{WE}$ buffer 27, which externally receives write enable signal $\overline{WE}$ to produce internal write enable signal $\overline{WE}$ for the internal circuitry, an I/O circuit 28, which receives internal output enable signal $\overline{OE}$ from $\overline{OE}$ buffer 26 for supplying data $D_0$–$D_7$ corresponding to amplified signals $RD_0$–$RD_7$ sent from differential amplifier circuit 24 to an I/O terminal 29 when internal write enable signal $\overline{OE}$ is at the L-level, and for supplying write data $WD_0$–$WD_7$ corresponding to data $D$–$D_7$ applied to I/O terminal 29 when internal output enable signal $\overline{OE}$ is at the H-level.

SRAM 11 further includes a write buffer 30, which receives internal write enable signal $\overline{WE}$ from $\overline{WE}$ buffer 27 for sending, as $IO_0$, $\overline{IO_0}$–$IO_7$, $\overline{IO_7}$, the potentials corresponding to write data $WD_0$–$WD_7$ sent from I/O circuit 28 to the I/O line pairs in I/O gate circuit 23 when internal write enable signal $\overline{WE}$ is at the L-level, and a sense amplifier enable signal generating circuit 31 (FIG. 6A), which receives block select signals $BS_0$–$BS_{31}$ from block select signal generating circuit 16 for producing sense amplifier enable signals $SE_0$–$SE_{31}$ respectively corresponding to block select signals $BS_0$–$BS_{31}$. Sense amplifier enable signal $SE_k$ attains the L-level when corresponding block select signal $BS_k$ is at the L-level, and attains a potential higher than the ground potential but slightly lower than power supply potential $V_{cc}$ when block select signal $BS_k$ is at the H-level.

Figure 7:
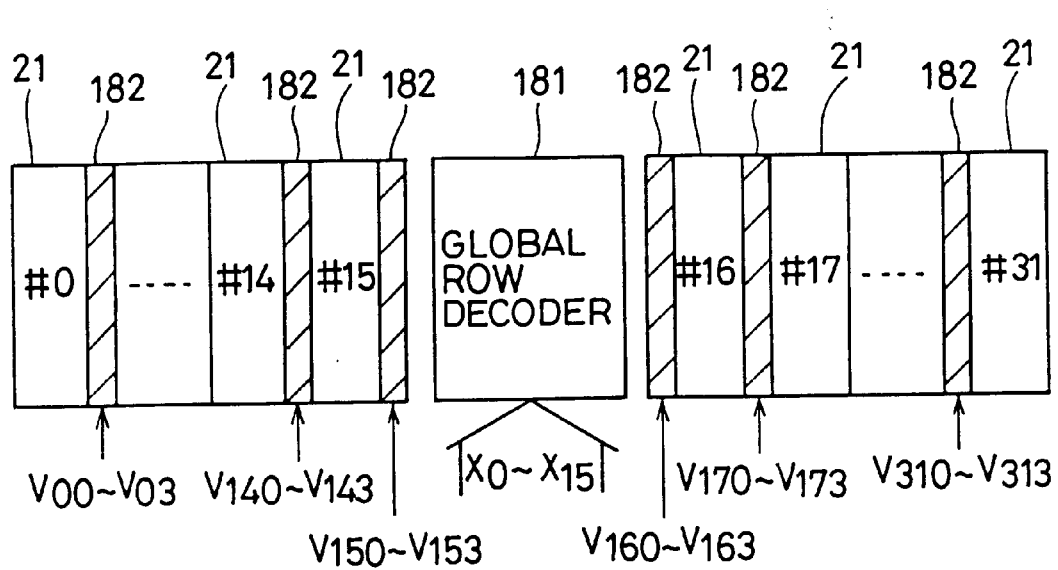
FIG. 7 shows a layout of memory cell arrays of the SRAM in the first embodiment of the invention.
Figure 8:
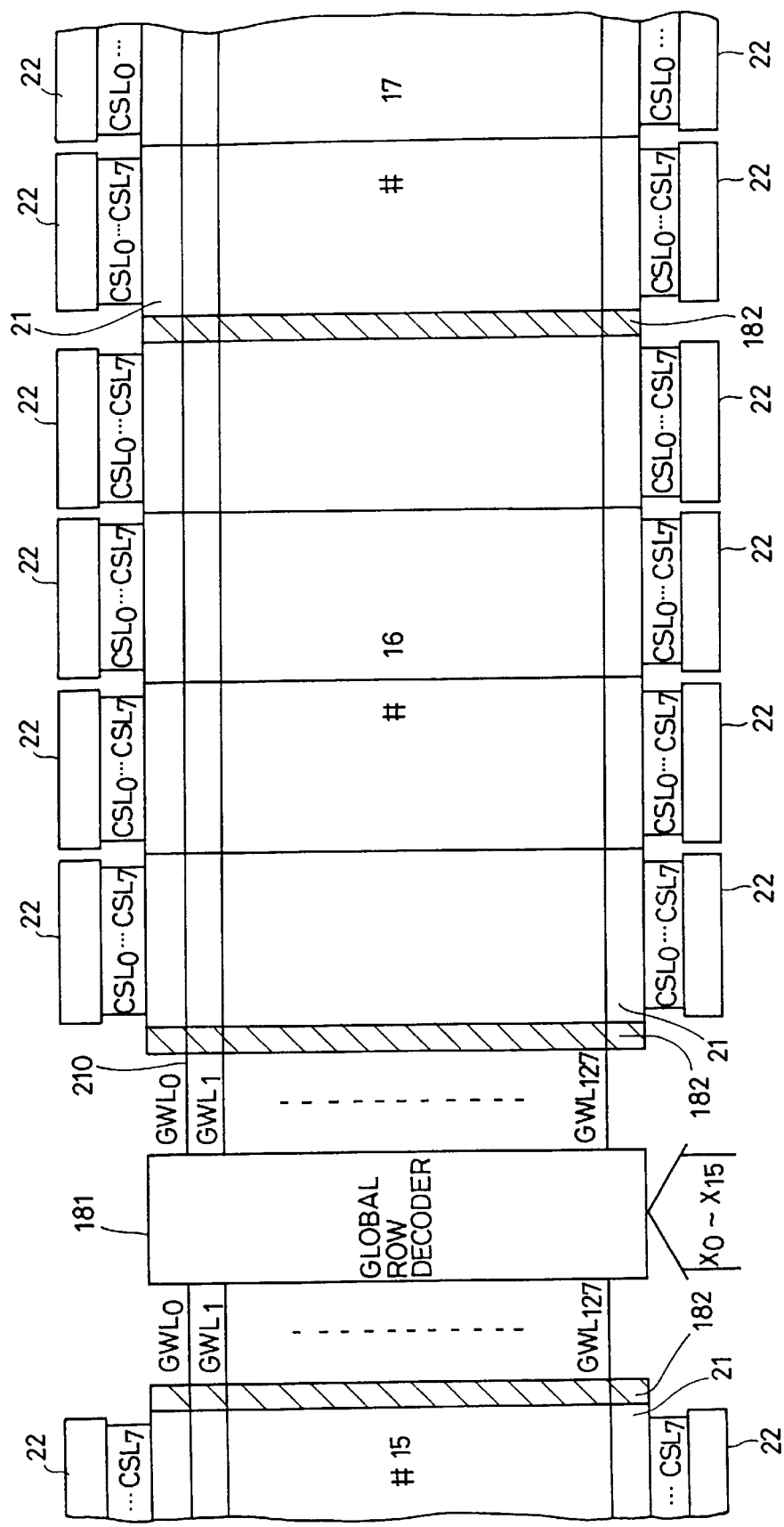
FIG. 8 is a block diagram showing a relationship between one of the memory cell arrays and its peripheral circuitry of the SRAM in the first embodiment of the invention.

FIG. 7 is a schematic block diagram of memory cell array 21 and row decoder 18 shown in FIGS. 6A and 6B. FIG. 8 shows, on an enlarged scale, a major portion in FIG. 7. Referring to FIGS. 7 and 8, row decoder 18 includes a global row decoder 181, which receives row predecode signals $X_0$–$X_{15}$ from row predecoder 13 for setting one of potentials $GWL_0$, $GWL_1$, . . . , $GWL_{127}$ of global word lines 210, and local row decoders 182, which receive sub-decode signals $V_{00}$–$V_{03}$, $V_{10}$–$V_{12}$, . . . , $V_{310}$–$V_{313}$ from row sub-decode circuit 17 for setting the corresponding local word lines to the H-level. As shown in FIG. 7, SRAM 11 is divided into 32 memory cell arrays 21 by local row decoders 182, and 16 divided portions are arranged at each side of global row decoder 181.

Figure 9:
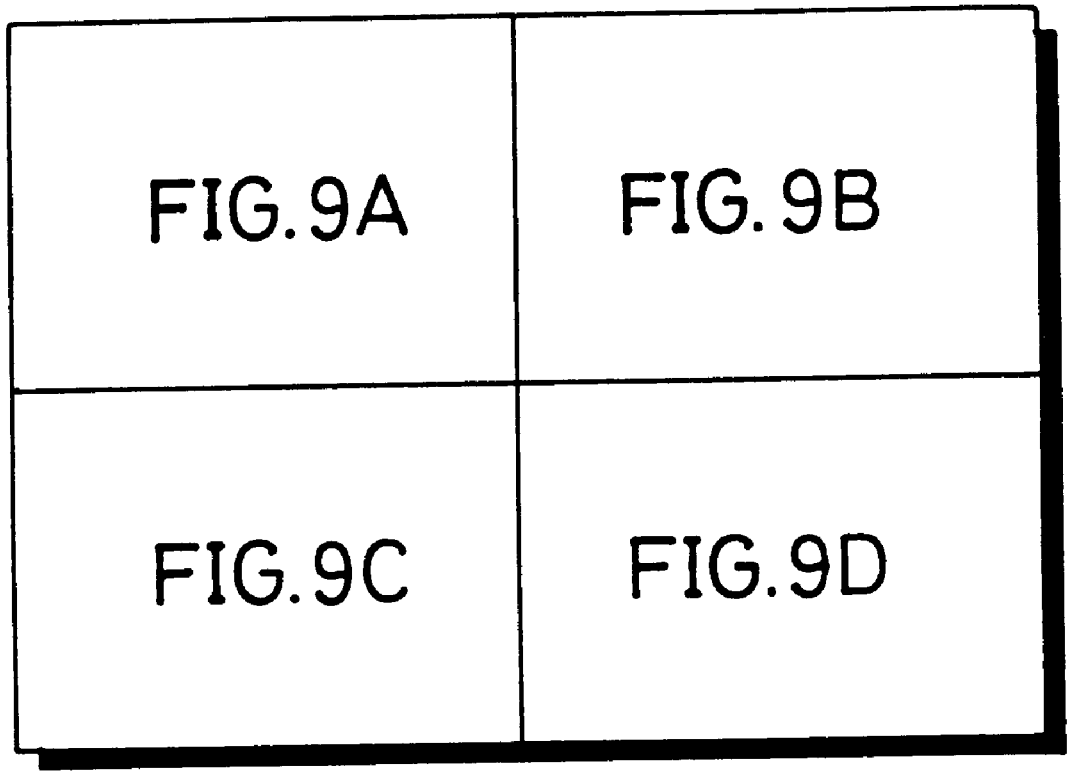
FIGS. 9 and 9A–9D are circuit diagrams of one of the memory cell arrays and its peripheral circuitry of the SRAM in the first embodiment of the invention.
Figure 9A:
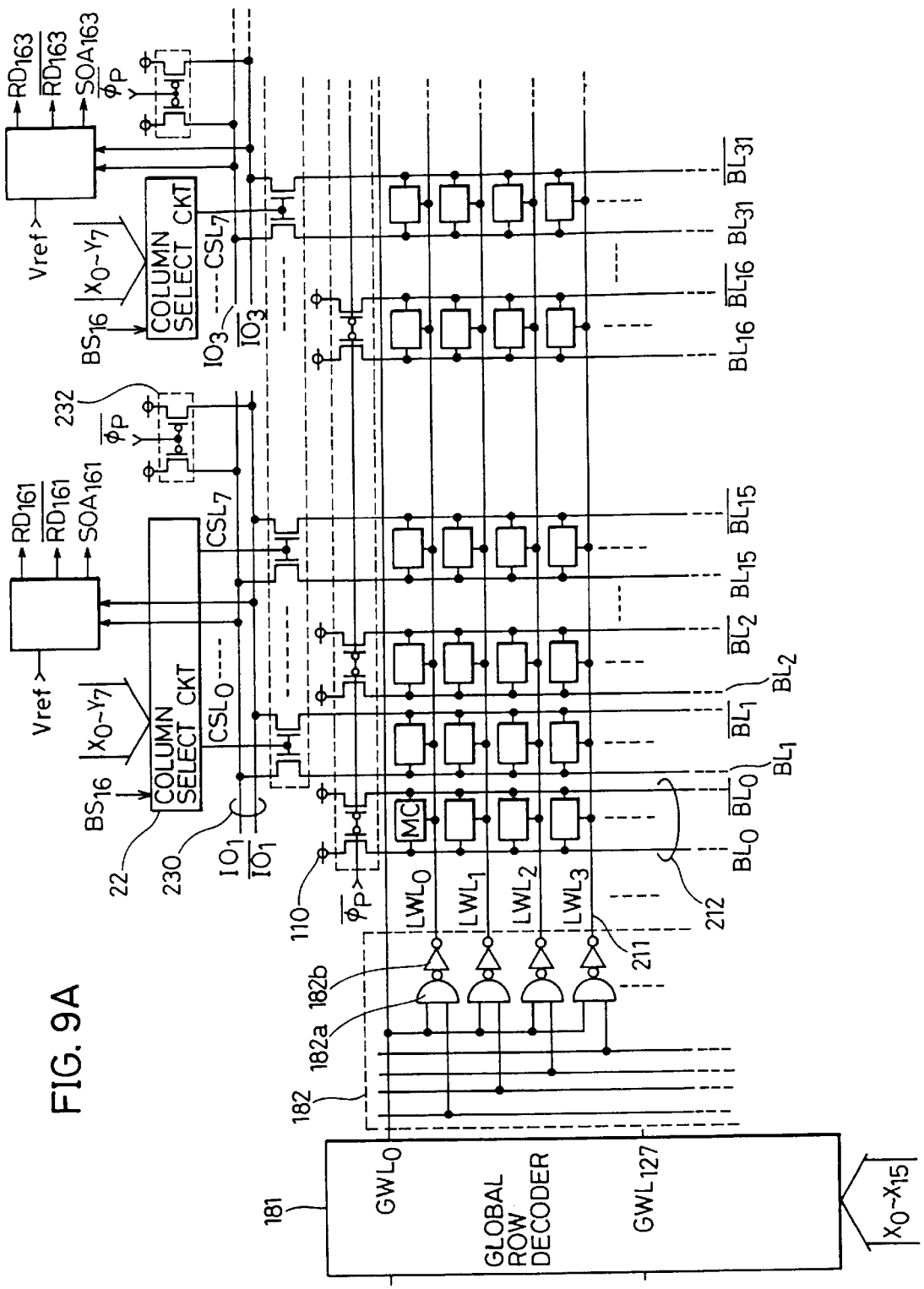
Figure 9B:
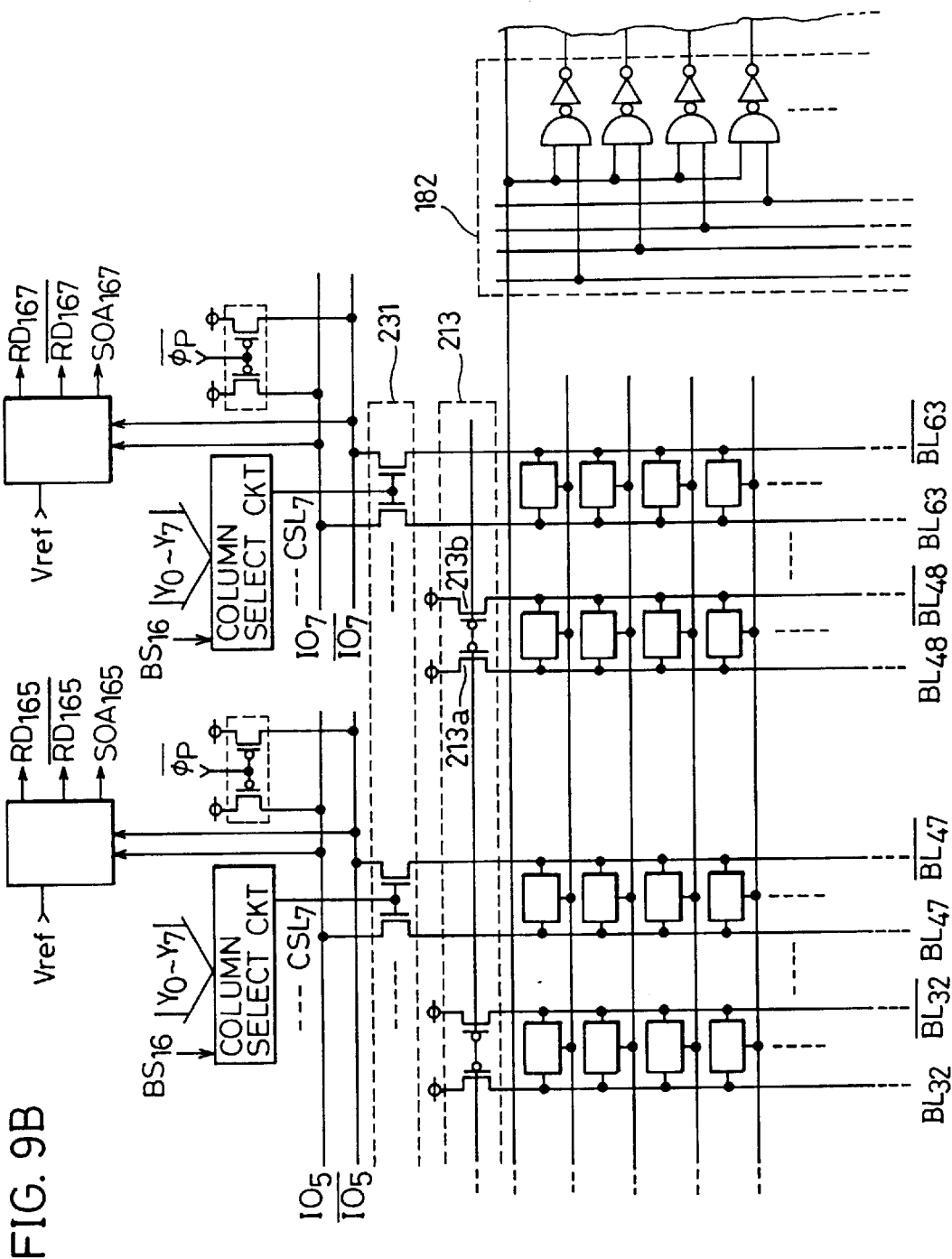

FIGS. 9A–9D show portions combined as shown in FIG. 9, and in particular, are specific circuit diagrams showing memory cell array 21 and row decoder 18. As shown in FIGS. 9A–9D, 8 I/O line pairs 230 included in I/O gate circuit 23 are provided corresponding to each memory cell array 21, and specifically 4 I/O line pairs 230 are arranged at each of the upper and lower sides of the memory cell array 21. Each memory cell array 21 is connected such that it forms 8 sub-memory cell arrays depending on which of the 8 I/O line pairs 230 the bit line pair 212 connected to memory cell MC is connected. Further, local row decoder 182 includes NAND circuits 182a, each of which has one input connected to the global word line and the other input receiving one of sub-decode signals $V_{k0}$–$V_{k3}$, and inverters 182b, each of which receives at its input the output of NAND circuit 182a and has an output connected to the local word line.

Column select circuit 22 in the memory cell array is divided into eight circuits, which are provided correspondingly to respective I/O line pairs 230, and each receive block select signal $BS_k$ and column decode signals Y0–Y7. Each circuit 22 generates column select signals $CSL_0$–$CSL_7$, all of which attain the L-level if block select signal $BS_k$ is at the L-level. If block select signal $BS_k$ is at the H-level, one of column select signals $CSL_0$–$CSL_7$ attains the H-level correspondingly to one of column decode signals Y0–Y7 at the H-level. Among I/O gates 231 included in I/O gate circuit 23, n-channel MOS transistors 231a and 231b which receive column select signal $CSL_m$ at the H-level on their gate electrodes are turned on, so that bit-line pair 212 corresponding to them are connected to I/O line pair 230. Between each bit line pair 212 and power supply nodes 110 supplied with the power supply potential, there is connected a bit line precharge circuit 213 formed of p-channel transistors 213a and 213b receiving precharge signal $\bar{\phi}_p$ on their gate electrodes.

Figure 9C:
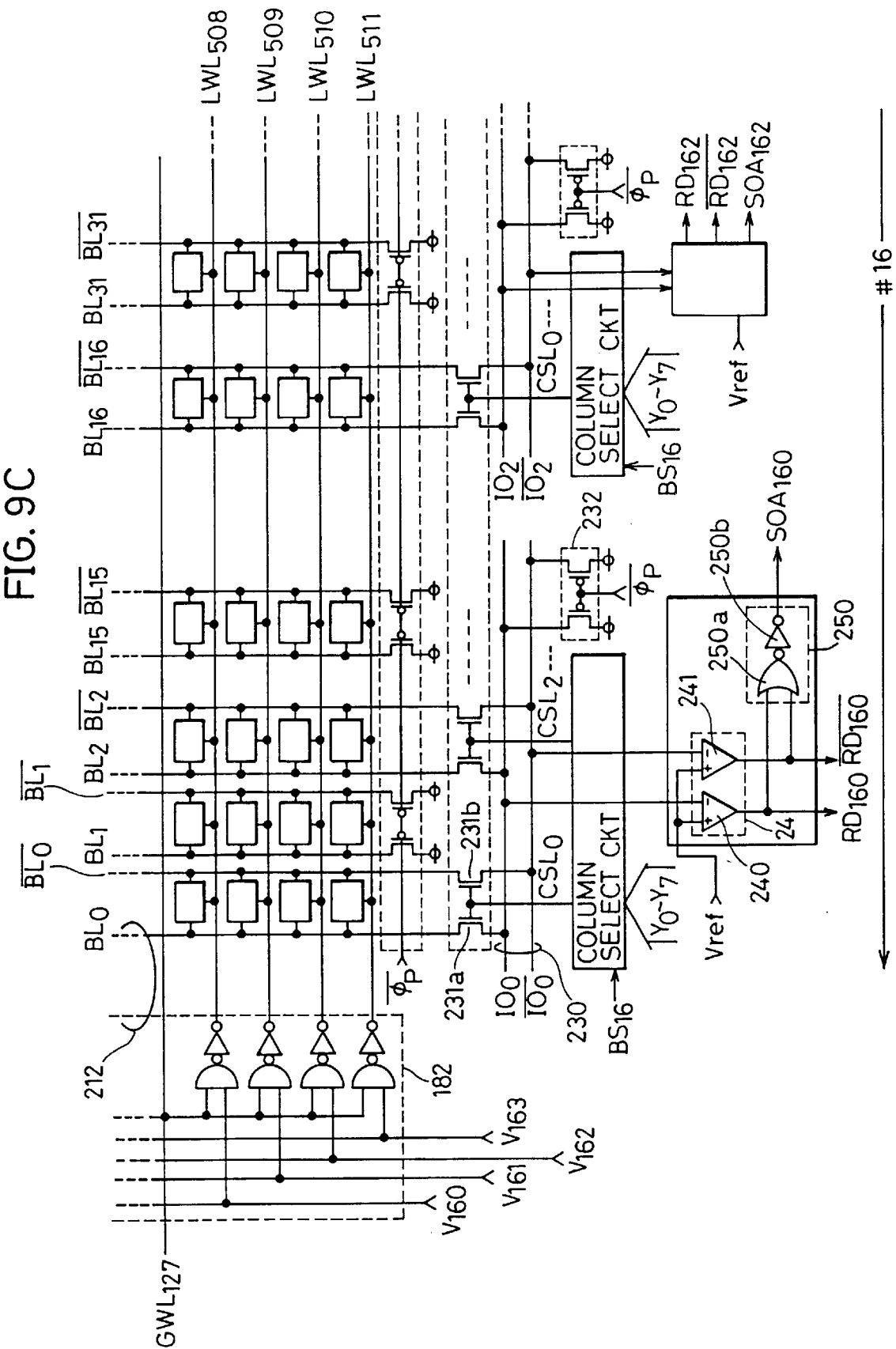
Figure 9D:
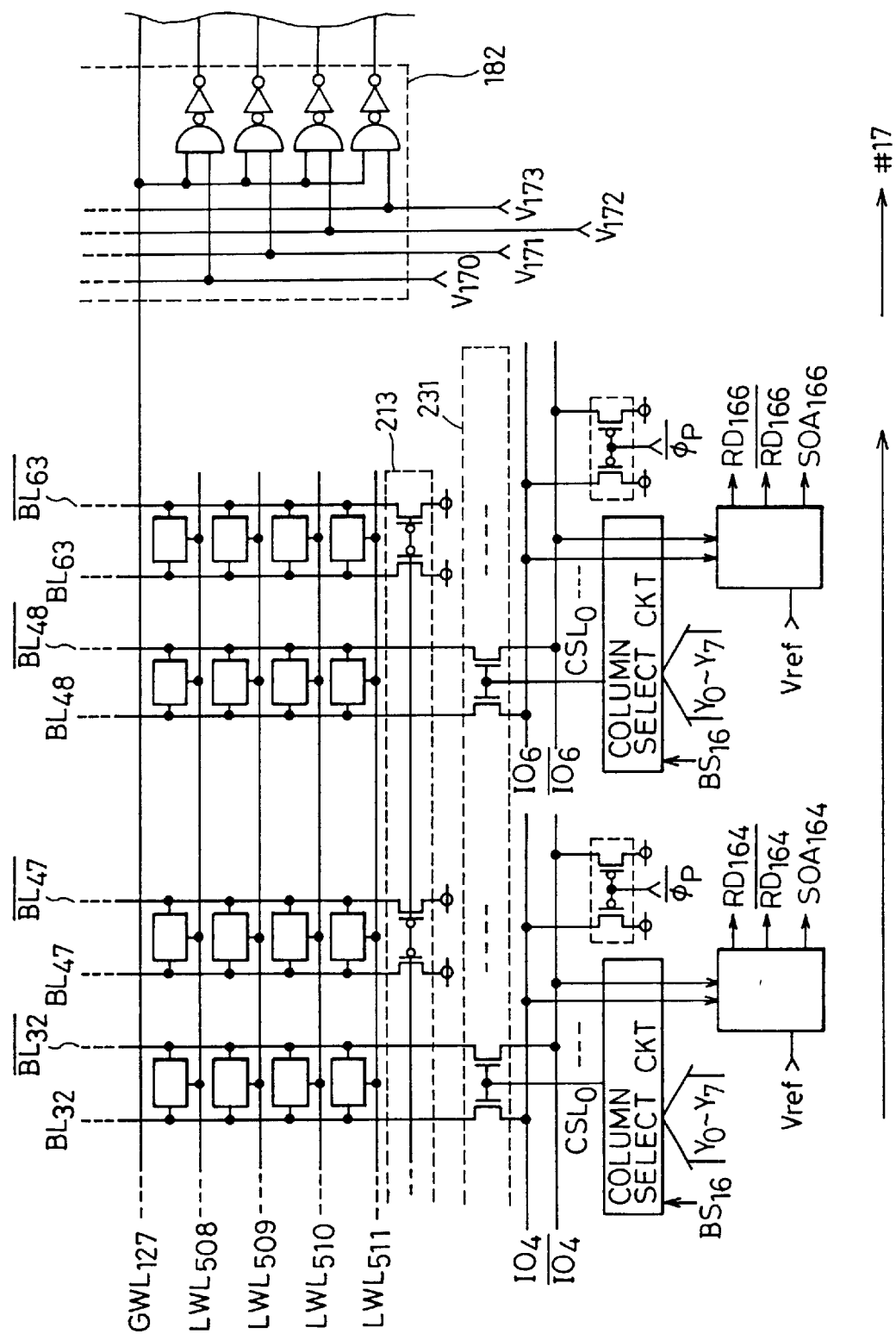

I/O line pairs 230 are connected to power supply nodes 110 via the respective p-channel transistors forming I/O line precharge circuit 230 and receiving precharge signal $\bar{\phi}_p$ on their gate electrodes. Each I/O line pair 230 is connected to differential amplifier circuit 24 (FIG. 9C).

The differential amplifier circuit 24 includes a first amplifier circuit 240, which receives reference potential $V_{ref}$ (4.9 V, if $V_{cc}$=5.0 V) lower than precharged power supply potential $V_{cc}$ by about 100 mV on its positive phase side and also receives potential $IO_n$ of one of paired I/O lines 230 on its negative phase side for outputting amplified signal $RD_{kn}$, and a second amplifier circuit 242, which receives reference potential $V_{ref}$ on its positive phase side and receives the potential $\overline{IO}_n$ of the other of paired I/O lines 230 on its negative phase side for outputting amplified signal $\overline{RD}_{kn}$. The purpose for setting reference potential $V_{ref}$ to a value lower than the power supply potential by about 100 mV is to prevent such operation that an offset voltage causes first amplifier circuit 240 to output amplifying signal $RD_{kn}$ at the H-level when I/O line pair 230 is precharged.

Correspondingly to each differential amplifier circuit 24, there is provided a sub-output fixing signal generating circuit 250. Each sub-output fixing signal generating circuit 250 receives corresponding amplified signals $RD_{kn}$ and $\overline{R}_{kn}$, and generates a sub-output fixing signal which attains the H-level when one of the amplified signals $RD_{kn}$ and $\overline{RD}_{kn}$ attains the H-level. Sub-output fixing signal generating circuit 250 is formed of an NOR circuit 250a having inputs, one of which is connected to the output of first amplifier circuit 240 of differential amplifier circuit 24, and the other of which is connected to the output of second amplifier circuit 241, and an inverter 250b having an input connected to the output of NOR circuit 250a and generating a sub-output fixing signal $SOA_{kn}$.

Figure 10:
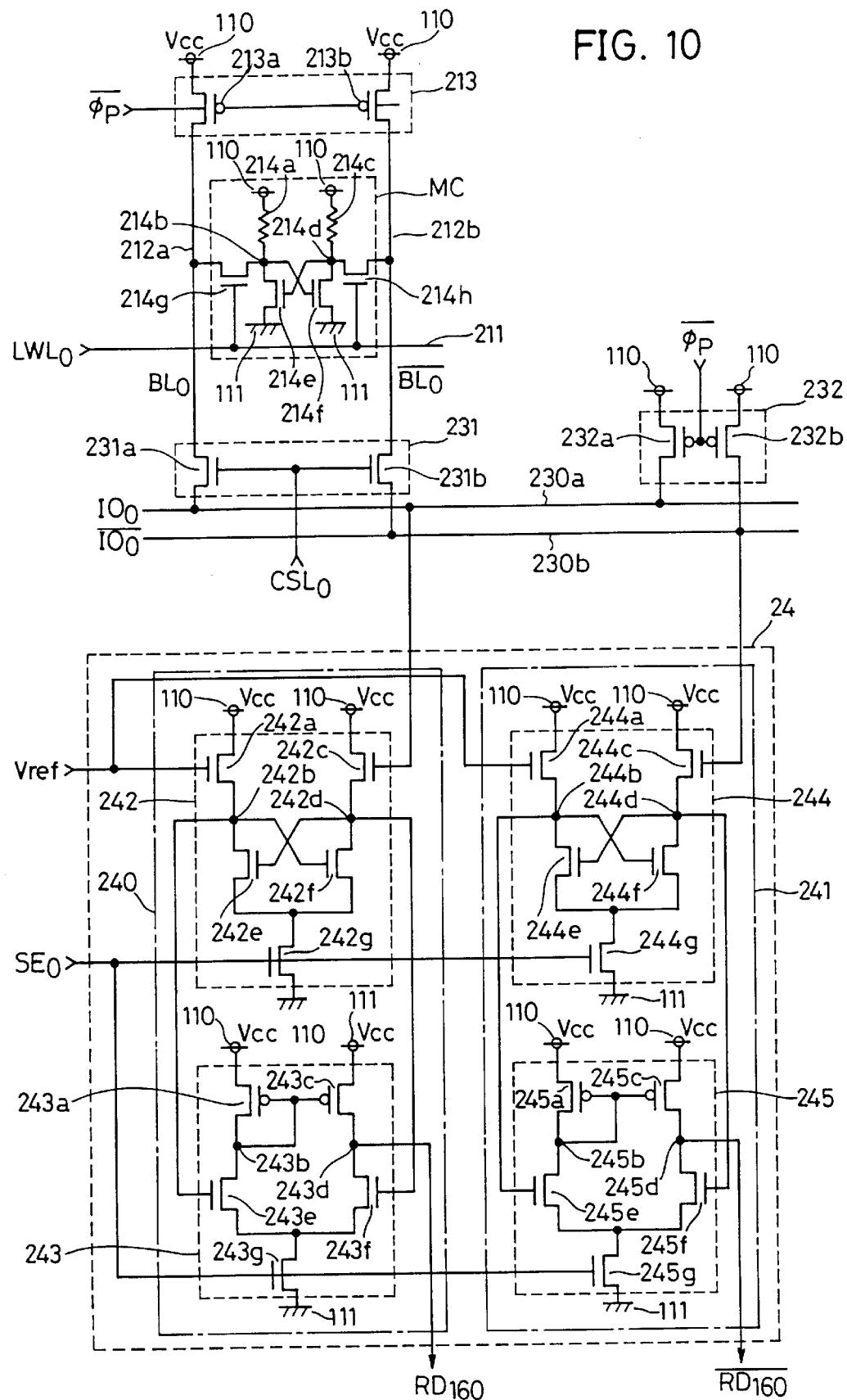
FIG. 10 is a circuit diagram showing a differential amplifier circuit and its peripheral circuitry of the SRAM in the first embodiment of the invention.

FIG. 10 is a circuit diagram specifically showing memory cell MC and differential amplifier circuit 24. Referring to FIG. 10, memory cell MC includes a resistor 214a connected between power supply potential node 110 and a node 214b, a resistor 214c connected between power supply potential node 110 and a node 214d, a driver transistor 214e which is an n-channel MOS transistor connected between node 214b and a ground potential node 111 and having a gate electrode connected to node 214d, a driver transistor 214f which is an n-channel MOS transistor connected between node 214d and ground potential node 111 and having a gate electrode connected to node 214b, an access transistor 214g which is an n-channel MOS transistor connected between node 214b and bit line 212a and having a gate electrode connected to local word line 211, and an access transistor 214h which is an n-channel MOS transistor connected between node 214d and bit line 212b and having a gate electrode connected to local word line 211.

In differential amplifier circuit 24, first amplifier circuit 240 includes a level shifter 242 and a current mirror amplifier 243. Second amplifier circuit 241 includes a level shifter 244 and a current mirror amplifier 245. Level shifter 242 includes an n-channel MOS transistor 242a connected between power supply potential node 110 and a node 242b and having a gate electrode receiving reference potential $V_{ref}$, an n-channel MOS transistor 242c connected between power supply potential node 110 and a node 242d and having a gate electrode receiving potential $IO_n$ of I/O line 230a, an n-channel MOS transistor 242e having a drain electrode connected to node 242b and a gate electrode connected to node 242d, an n-channel MOS transistor 242f connected between node 242d and a source electrode of n-channel MOS transistor 242c and having a gate electrode connected to node 242b for forming a cross-coupled circuit together with n-channel MOS transistor 242c, and an n-channel MOS transistor 242g connected between the source electrodes of n-channel MOS transistors 242c and 242f and ground potential node 111, and receiving on its gate electrode a sense amplifier enable signal $SE_k$ (k=0, 1, . . . , 31), which attains a potential higher than the ground potential but slightly lower than power supply potential $V_{cc}$ when block select signal $BS_k$ is at the H-level, for operating in a saturated range to form a constant current supply.

Current mirror sense amplifier 243 includes a p-channel MOS transistor 243a connected between power supply potential node 110 and a node 243b and having a gate electrode connected to node 243b, a p-channel MOS transistor 243c connected between power supply potential node 110 and an output node 243d from which amplified signal $RD_{kn}$ is output, and having a gate electrode connected to node 243b to form a current mirror circuit together with p-channel MOS transistor 243a, an n-channel MOS transistor 243e having a drain electrode connected to node 243b and a gate electrode connected to node 242b in level shifter 242, an n-channel MOS transistor 243f connected between output node 243d and a source electrode of n-channel MOS transistor 243e, and having a gate electrode connected between level shifter 242 and node 242d, and an n-channel MOS transistor 243g connected between the source electrodes of n-channel MOS transistors 243e and 243f and ground potential node 111, and receiving sense amplifier enable signal $SE_k$ on its gate for operating in a saturated range to form a constant current supply.

Level shifter 244 includes an n-channel MOS transistor 244a connected between power supply potential node 110 and a node 244b and having a gate electrode receiving reference potential $V_{ref}$, an n-channel MOS transistor 244c connected between power supply potential node 110 and a node 244d and having a gate electrode receiving potential $\overline{IO}_n$ of I/O line 230b, an n-channel MOS transistor 244e having a drain electrode connected to node 244b and a gate electrode connected to node 244d, an n-channel MOS transistor 244f connected between node 244d and a source electrode of n-channel MOS transistor 244e and having a gate electrode connected to node 244d for forming a cross-coupled circuit together with n-channel MOS transistor 244e, and an n-channel MOS transistor 244g connected between the source electrodes of n-channel MOS transistors 244e and 244f and ground potential node 111 and having a gate electrode receiving sense amplifier enable signal $SE_k$ for operating in a saturated range to form a constant current supply.

Current mirror sense amplifier 245 includes a p-channel MOS transistor 245a connected between power supply potential node 110 and a node 245b and having a gate electrode connected to node 245b, a p-channel MOS transistor 245c connected between power supply potential node 110 and an output node 245d through which amplified signal $RD_{kn}$ is output, and having a gate electrode connected to node 245b for forming a current mirror circuit together with p-channel MOS transistor 245a, an n-channel MOS transistor 245e having a drain electrode connected to node 245b and a gate electrode connected to node 244b of level shifter 244, an n-channel MOS transistor 245f connected between output node 245d and a source electrode of n-channel MOS transistor 245e and having a gate electrode connected to node 244d of level shifter 244, and an n-channel MOS transistor 245g connected between the source electrodes of n-channel MOS transistors 245c and 245f and ground potential node 111, and having a gate electrode receiving sense amplifier enable signal $SE_k$ for operating in a saturated range to form a constant current supply.

In the first and second amplifier circuits 240 and 241 of the first embodiment thus constructed, bit line pair 212 and I/O line pair are precharged to power supply potential $V_{cc}$. Therefore, level shifters 242 and 244 are arranged at a stage preceding current mirror amplifiers 243 and 245 to reduce the level of input potentials of current mirror sense amplifiers 243 and 245. Thereby, current mirror sense amplifiers 243 and 245 operate in a range of a high gain, which achieves high-speed operation of first and second amplifier circuits 240 and 241 themselves. By setting reference potential $V_{ref}$ (4.9 V) to a value lower than the precharged potential, i.e., power supply potential $V_{cc}$ (5.0 V) by about 100 mV, it is possible to suppress the H-level of amplified signals $RD_{kn}$ and $\overline{RD}_{kn}$, which may be caused by the fact that first and second amplifier circuits 240 and 241 have the offset voltage characteristics. The offset voltage characteristics are such characteristics, according to which the potential of output, which is produced when two input potentials are equal to each other and must be ideally equal to the potential intermediate the ground potential and power supply potential, actually attains one of the L-level and H-level due to deviation of the size of transistors forming the amplifier circuit.

Figure 11:
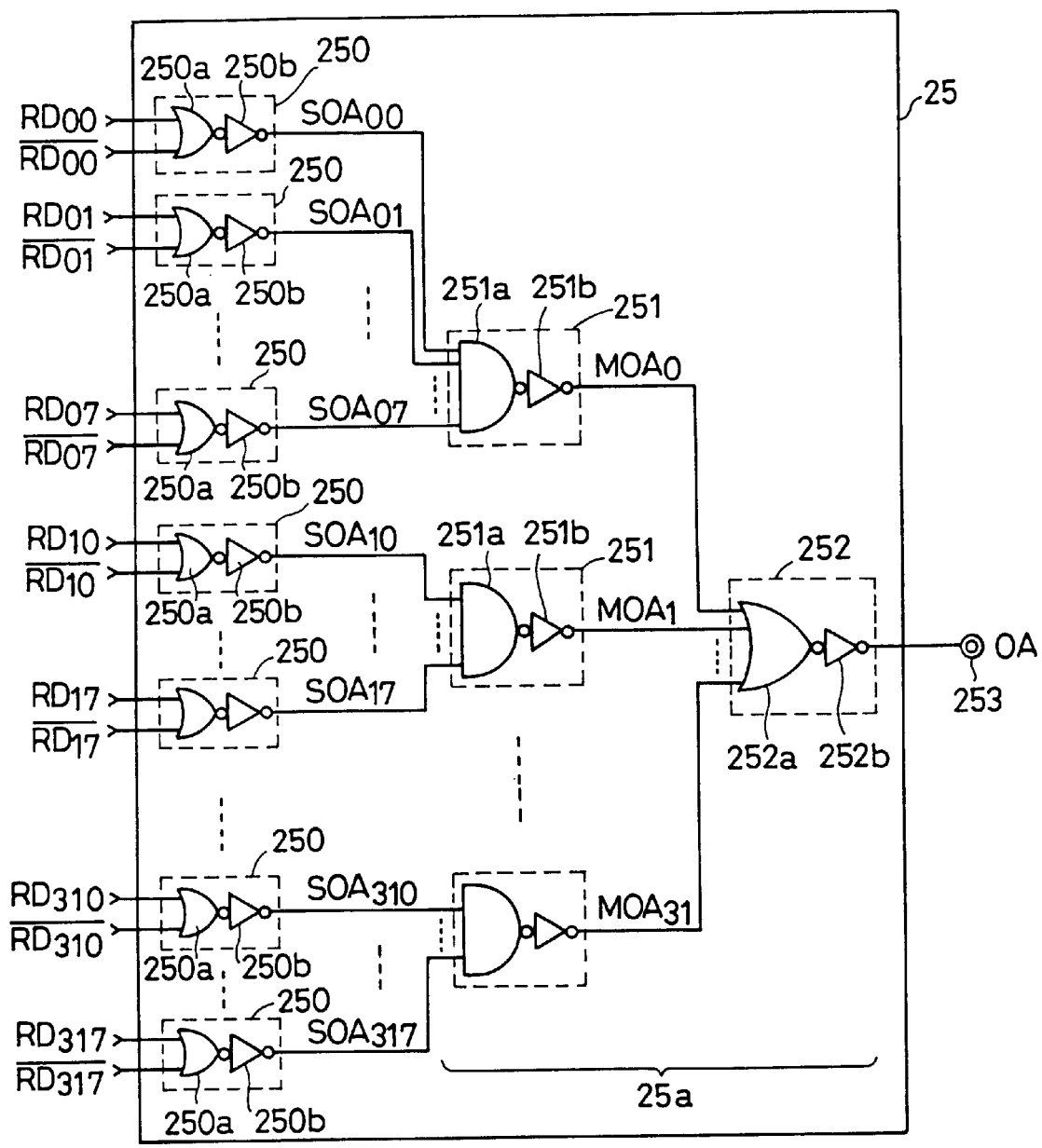
FIG. 11 is a circuit diagram showing an output fixing signal generating circuit of the SRAM in the first embodiment of the invention.

FIG. 11 shows output fixing signal generating circuit 25. Referring to FIG. 11, output fixing signal generating circuit 25, which is provided correspondingly to each memory cell array 21, includes sub-output fixing signal generating circuits 250 provided correspondingly to the 8 sub-memory cell arrays included in the corresponding memory cell array, as already described, and further includes array output fixing signal generating circuits 251 receiving sub-output fixing signals $SOA_{k0}$–$SOA_{k7}$ from sub-output fixing signal generating circuits 250 and producing array output fixing signal $MOA_k$ which attains the H-level when all sub-output fixing signals $SOA_{k0}$–$SOA_{k7}$ attain the H-level, and a data output fixing signal generating circuit 252 receiving array output fixing signals $MOA_k$ from 32 array output fixing signal generating circuit 251 provided at each memory cell array 21, and producing a data output fixing signal OA which attains the H-level when at least one of array output fixing signals $MOA_k$ attains the H-level.

Each array output fixing signal generating circuit 251 is formed of an 8-input NAND circuit 251a receiving sub-output fixing signals $SOA_{k0}$–$SOAk_7$, and an inverter receiving on its input side the output of NAND circuit 251a and outputting array output fixing signal $MOA_k$.

Data output fixing signal generating circuit 252 includes a 32-input NOR circuit 252a receiving array output fixing signals $MOA_k$ from 32 array output fixing signal generating circuits 251, and an inverter 252b receiving on its input the output of NOR circuit 252a and outputting data output fixing signal OA. Data output fixing signal generating circuit 252 forms together with 32 array output fixing signal generating circuits 251 a main output fixing signal generating circuit 25a.

Operation of SRAM 11 of the first embodiment thus constructed will be described below with reference to FIG. 12. In particular, the following description will be given on the operation of SRAM 11, in which data is first read from the memory cell MC corresponding to column select signal $CSL_0$ and local word line potential $LWL_0$ of the local word line of the memory cell array of #16, and subsequently data is read from memory cell MC corresponding to column select signal $CSL_7$ and potential $LWL_{511}$ of the local word line of the memory cell array of #31.

Figure 12:
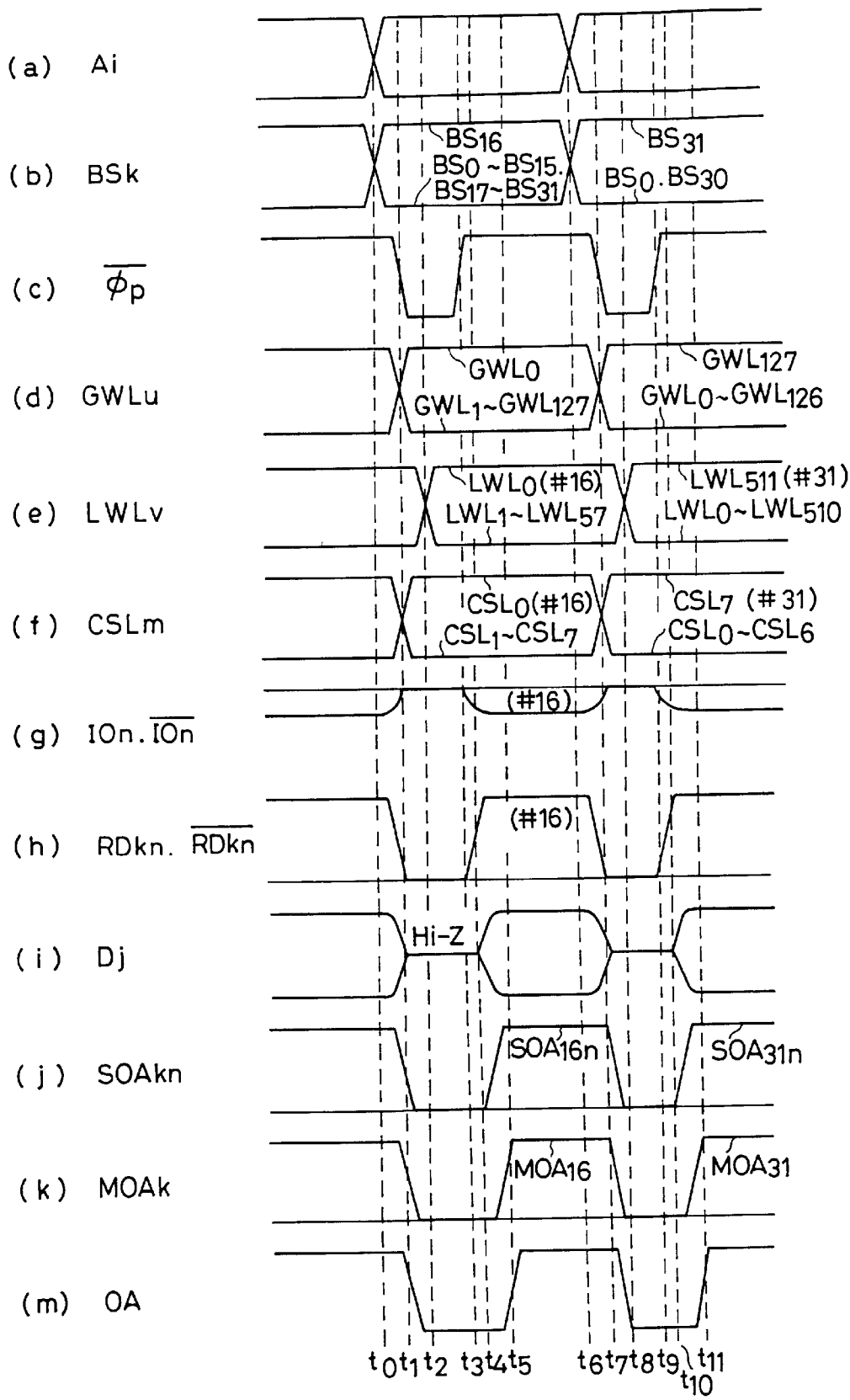
FIG. 12 is a timing chart showing an operation of the SRAM in the first embodiment of the invention.

First, address signal $A_i$ is changed at time $t_0$ as shown at (a) in FIG. 12 while externally applied write enable signal $\overline{WE}$ is kept at the H-level and output enable signal $\overline{OE}$ is kept at the L-level. In response, block select signal $BS_{16}$ supplied from block select signal generating circuit 16 attains the H-level as shown at (b) in FIG. 12, and other signals $BS_k$ attain the L-level.

In accordance with the change of address signal $A_i$, address change detecting circuit 19 (FIG. 6A) outputs address change signal ATD of one-shot pulse. In response, precharge signal $\overline{\phi}_p$ attains the L-level at time $t_1$ as shown at (c) in FIG. 12. Bit line precharge circuit 213 receiving it precharges bit line pairs 212 to power supply potential $V_{cc}$.

I/O line precharge circuit 232 precharges I/O line pairs 230 to attain potentials $IO_n$, $\overline{IO}_n$ (n=0, 1, . . . , 7) equal to power supply potential $V_{cc}$ as shown at (g) in FIG. 12. Because potentials $IO_n$ and $\overline{IO}_n$ of I/O line pairs 230 are precharged to power supply potential $V_{cc}$, the negative phase inputs (5.0 V) of first and second amplifier circuits 240 and 241 in differential amplifier circuit 24 become higher than the positive phase inputs of $V_{ref}$ (4.9 V). Amplified signals $RD_{kn}$ and $\overline{RD}_k$ supplied from first and second amplifier circuits 240 and 241 attain the L-level as shown at (h) in FIG. 12. In response, sub-output fixing signal $SOA_{kn}$ supplied from sub-output fixing signal generating circuit 250 attains the L-level as shown at (j) in FIG. 12. In response, all array output fixing signals $MOA_k$ supplied from array output fixing signal generating circuits 251 attain the L-level as shown at (k) in FIG. 12. In response, data output fixing signal OA supplied from data output fixing signal generating circuit 252 attains the L-level as shown at (m) in FIG. 12.

Global row decoder 181 raises potential $GWL_0$ of the global word line to the H-level, and sets potentials $GWL_u$ of the remaining global word lines to the L-level. Column select circuit 22 corresponding to memory cell array 21 of #16 receives block select signal $BS_{16}$ at the H-level to raise column select signal $CSL_0$ to the H-level as shown at (f) in FIG. 12 and set remaining column select signals $CSL_m$ to the L-level. Column select circuits 22 corresponding to remaining memory cell arrays 21 receive block select signals $BS_k$ at the L-level to set all column select signals $CSL_0$–$CSL_7$ to the L-level.

Local row decoder 182 corresponding to the memory cell array 21 of #16 raises potential $LWL_0$ of the local word line to the H-level at time $t_2$ as shown at (e) in FIG. 12, and sets remaining potentials $LWL_v$ to the L-level. Local row decoders 182 corresponding to other memory cell arrays 21 set potentials $LWL_0$–$LWL_{511}$ of all the corresponding local word lines to the L-level. Thereafter, precharge signal $\bar{\phi}_p$ rises to the H-level at time $t_3$ as shown at (c) in FIG. 12. In response, potential $LWL_0$ of the local word line in memory cell array 21 of #16 is received, and the potentials corresponding to data stored in the memory cell MC connected to bit line pair 212 corresponding to column select signal $CSL_0$ are transmitted onto I/O line pair 230 via the same bit line pair 212 and I/O gate 231.

One of potentials $IO_n$ and $\overline{IO}_n$ of the I/O line pair remains at power supply potential $V_{cc}$ (5.0 V) and the other goes to the potential (4.5 V) lower than that by about 500 mV. In differential amplifier circuit 24, the negative phase input of one of first and second amplifier circuits 240 and 241 receiving reference potential $V_{ref}$ (4.9 V) on the positive phase inputs is set to precharged power supply potential $V_{cc}$ higher than reference potential $V_{ref}$, and the negative input of the other is set to a potential lower than reference potential $V_{ref}$. Therefore, one of amplified signals $RD_{16n}$ and $\overline{RD}_{16n}$ attains the H-level and the other attains the L-level as shown at (h) in FIG. 12. Amplified signals $RD_{kn}$ and $\overline{RD}_{kn}$ corresponding to other memory cell arrays 21 remain at the L-level because the memory cells are not selected.

I/O circuit 28 receives amplified signals $RD_{160}$, $\overline{RD}_{160}$–$RD_{167}$, $\overline{RD}_{167}$ from differential amplifier circuit 24, and supplies data $D_0$–$D_7$ corresponding to them to I/O terminals 29. In response to the fact that one of amplified signals $RD_{16n}$ and $\overline{RD}_{16n}$ corresponding to the memory cell array 21 of #16 attain the H-level and the other attains the L-level, sub-output fixing signal $SOA_{16n}$ supplied from sub-output fixing signal generating circuit 250 corresponding to this memory cell array 21 attains the H-level as shown at (j) in FIG. 12. Array output fixing signal $MOA_{16}$, which is supplied from array output fixing signal generating circuit 251 receiving this sub-output fixing signals $SOA_{16n}$ and corresponding to this memory cell array 21, attains the H-level as shown at (k) in FIG. 12 when all the eight sub-output fixing signals $SOA_{160}$–$SOA_{167}$ attain the H-level.

Meanwhile, both amplified signals $RD_{kn}$ and $\overline{RD}_{kn}$ corresponding to the other memory cell arrays 21 which are not selected remain at the L-level. Sub-output fixing signals $SOA_{kn}$ supplied from sub-output fixing signal generating circuits 250 receiving them remain at the L-level. Array output fixing signals $MOA_0$–$MOA_{15}$ and $MOA_{17}$–$MOA_{31}$ supplied from array output fixing signal generating circuits 251 receiving them remain at the L-level.

In response to array output fixing signals $MOA_0$–$MOA_{31}$ supplied from respective array output fixing signal generating circuits 251, data output fixing signal generating circuit 252 supplies data output fixing signal OA. Data output fixing signal OA attains the H-level at time $t_5$ as shown at (m) in FIG. 12 and is externally output to inform the fact the data output is fixed, when array output fixing signal $MOA_{16}$ corresponding to data supplied to I/O terminal 29 has settled.

When address signal $A_i$ changes at time $t_6$ as shown at (a) in FIG. 12, SRAM 11 performs the operation substantially similar to that from time $t_0$ to time $t_5$ already described. First, in response to address signal $A_i$, block select signal $BS_{31}$ supplied from block select signal generating circuit 16 attains the H-level as shown at (b) in FIG. 12, and other signals $BS_k$ attain the L-level.

In accordance with the change of address signal $A_i$, address change detecting circuit 19 outputs address change signal ATD of one-shot pulse. In response, precharge signal generating circuit 20 outputs the signal at the L-level at time $t_7$ as shown at (c) in FIG. 12. In response, bit line precharge circuit 213 precharges bit line pairs 212 to power supply potential $V_{cc}$. I/O line precharge circuits 232 precharge potentials $IO_n$ and $\overline{IO}_n$ (n=0, 1, . . . , 7) of I/O line pairs 230 to power supply potential $V_{cc}$ as shown at (g) in FIG. 12. Because potentials $IO_n$ and $\overline{IO}_n$ of I/O line pair 230 are precharged, the negative phase inputs (5.0 V) of first and second amplifier circuits 240 and 241 in differential amplifier circuit 24 exceed $V_{ref}$ (4.9 V) of the positive phase inputs. Amplified signals $RD_{kn}$ and $\overline{RD}_{kn}$ supplied from first and second amplifier circuits 240 and 241 attain the L-level as shown at (h) in FIG. 12. In response, sub-output fixing signals $SOA_{kn}$ supplied from sub-output fixing signal generating circuits 250 attain the L-level as shown at (j) in FIG. 12. In response, all array output fixing signals $MOA_k$ supplied from array output fixing signal generating circuits 251 attain the L-level as shown at (k) in FIG. 12. In response, data output fixing signal OA supplied from data output fixing signal generating circuit 252 attains the L-level as shown at (m) in FIG. 12.

After global row decoder 181 raised the potential $GWL_{127}$ to the H-level, potentials $GWL_u$ of the global word lines are set to the L-level. Column select circuit 22 corresponding to memory cell array 21 of #31 receives block select signal $BS_{31}$ at the H-level to raise column select signal $CSL_7$ to the H-level as shown at (f) in FIG. 12 and set other column select signals $CSL_m$ to the L-level. In response to block select signals $BS_k$ at the L-level, column select circuits 22 corresponding to the other memory cell arrays 21 set all column select signals $CSL_0$–$CSL_7$ to the L-level.

Local row decoder 182 corresponding to memory cell array 21 of #31 raises potential $LWL_{511}$ of the local word line to the H-level at time $t_8$ as shown at (e) in FIG. 12, and potentials LWL of other local word lines are set to the L-level. Local row decoders 182 corresponding to other memory cell arrays 21 set potentials $LWL_0$–$LWL_{511}$ of all the local word lines to the L-level. Thereafter, precharge signal $\bar{\phi}_p$ rises to the H-level at time $t_9$ as shown at (c) in FIG. 12. In response, potential $LWL_{511}$ of the local word line in the memory cell array 21 of #31 is received, and the potential corresponding to data stored in memory cell MC connected to bit line pair 212 corresponding to column select signal $CSL_7$ is transmitted to I/O line pair 230 via bit line pair 212 and I/O gate 231. One of the potentials $IO_n$ and $\overline{IO}_n$, of this I/O line pair remains at power supply potential $V_{cc}$ (5.0 V), and the other goes to a value (4.5 V) lower than that by about 500 mV as shown at (g) in FIG. 12.

In differential amplifier circuit 24, one of the negative phase inputs of first and second amplifier circuits 240 and 241, which receive reference potential $V_{ref}$ (4.9 V) on their positive phase inputs, is set to precharged power supply potential $V_{cc}$ higher than reference potential $V_{ref}$, and the other is set to the potential lower than reference potential $V_{ref}$. Therefore, amplified signals $RD_{31}$ and $\overline{RD}_{31}$ attain the H-level and L-level, respectively, as shown at (h) in FIG. 12. Amplified signals $RD_{kn}$ and $\overline{RD}_{kn}$ corresponding to other memory cell arrays 21 remain at the L-level because the memory cells are not selected.

I/O circuit 28 receives amplified signals $RD_{310}$, $\overline{RD}_{310}$–$RD_{317}$, $\overline{RD}_{317}$ from differential amplifier circuits 24, and supplies data $D_0$–$D_7$ corresponding to them to I/O terminals 29 as shown at (i) in FIG. 12. In response to the fact that one of amplified signals $RD_{31n}$ and $\overline{RD}_{31n}$ corresponding to memory cell array 21 of #31 attains the H-level and the other attains the L-level, sub-output fixing signal generating circuits 250 corresponding to this memory cell array 21 output sub-output fixing signals $SOA_{31n}$ which attain the H-level as shown at (j) in FIG. 12. Array output fixing signals $MOA_{31}$ supplied from array output fixing signal generating circuit 251 receiving these sub-output fixing signals $SOA_{31n}$ and corresponding to the above memory cell array 21 attains the H-level as shown at (k) in FIG. 12 when all the eight sub-output fixing signals $SOA_{310}$–$SOA_{317}$ attain the H-level.

Meanwhile, amplified signals $RD_{kn}$ and $\overline{RD}_{kn}$ corresponding to other memory cell arrays 21 which are not selected remain at the L-level. Sub-output fixing signals $SOA_{kn}$ supplied from sub-output fixing signal generating circuits 250 receiving them remain at the L-level. Array output fixing signals $MOA_0$–$MOA_{30}$ supplied from array output fixing signal generating circuits 251 receiving them remain at the L-level.

In response to array output fixing signals $MOA_0$–$MOA_{31}$ supplied from respective array output fixing signal generating circuits 251, data output fixing signal generating circuit 252 produces data output fixing signal OA. When array output fixing signal $MOA_{31}$ corresponding to data supplied to I/O terminal 29 attains the H-level, data output fixing signal OA attains the H-level at time $t_{11}$ as shown at (m) in FIG. 12. Data output fixing signal OA is externally supplied from output fixing signal output terminal 253 to inform the fact that the data output is fixed.

According to the computer having SRAM 11 of the first embodiment, as described above, SRAM 11 outputs data $D_0$–$D_7$ from the memory cells corresponding to the address signals to data I/O terminals 29, and also outputs data output settling signal OA, which attains the H-level in accordance with fixing of output of data $D_0$–$D_7$, to output fixing signal output terminal 253. MPU 10 receives data $D_0$–$D_7$ sent from data I/O terminals 29 of SRAM 11 and data output fixing signal OA sent from output fixing signal output terminal 253. MPU 10 latches and takes in data $D_0$–$D_7$ for processing the same when data output fixing signal OA attains the predetermined level.

Accordingly, when the computer is not used under the worst conditions of a high temperature and a low power supply voltage, data output fixing signal OA attains the H-level in a time $t_{AAC}$ shorter than maximum address access time $t_{AAC}$(max). It is not necessary to perform the operation of latching, taking in and processing data $D_0$–$D_7$ in the same manner as the prior art, which performs the above operation after elapsing of the maximum address access time $t_{AAC}$(max), i.e., in synchronization with the clock signal having a frequency larger than that determined by taking the maximum address access time $t_{AAC}$(max) into consideration in order to ensure completion of reading from RAM before elapsing of the maximum address access time $t_{AAC}$(max). Therefore, a useless wait time of ($t_{AAC}$(max)–$t_{AAC}$) is suppressed, and thus an operation speed can be increased.

In SRAM 11 of this first embodiment, the memory cells are grouped into 32 memory cell arrays 21. In the unselected 31 memory cell arrays 21, deactivation of differential amplifiers 24 or the like is performed so as to prevent reading. Therefore, SRAM 11 can operate with a low current consumption.

In SRAM 11 divided into 32 memory cell arrays 21, thirty-two array output fixing signal generating circuits 251 are provided correspondingly to the respective memory cell arrays 21. Array output fixing signals $MOA_0$–$MOA_{31}$ are supplied from these circuits 251 for indicating the fact that data sent from the corresponding memory cell arrays 21 are fixed. In connection with this, data output fixing set signal generating circuit 252 is configured to produce data output fixing signal OA at the H-level, when one ($MOA_k$) of these signals $MOA_0$–$MOA_{31}$ corresponding to data $D_0$–$D_7$ supplied to I/O terminal 29 attains the H-level. Therefore, data output fixing signal OA can be surely output in spite of the fact that other 31 array output fixing signals $MOA_k$ corresponding to unselected memory cell arrays 21 remain at the L-level.

Each memory cell array 21 is divided into 8 sub-memory cell arrays corresponding to the respective I/O terminals 29. Sub-output fixing signal generating circuit 250 provided correspondingly to each sub-memory cell array produces 8 sub-output fixing signals $SOA_{k0}$–$SOA_{k7}$. In connection with this, array output fixing signal generating circuit 251 is configured such that array output fixing signal $MOA_k$ corresponding to this memory array 21 attains the H-level only when all sub-output fixing signals $SOA_{k0}$–$SOA_{k7}$ attain the H-level indicative of the fixing of output of all data. Therefore, in the multiple (×8) bit product, data output fixing signal OA rises to the H-level only when all data $D_0$–$D_7$ are fixed, so that output of data output fixing signal OA is ensured.

First and second amplifier circuits 240 and 241 in differential amplifier circuit 24 receive one of potentials $IO_n$ and $\overline{IO}_n$ of I/O line pair 230 and reference potential $V_{ref}$ (4.9 V) intermediate the ground potential and precharge potential $V_{cc}$ (5.0 V). Therefore, when I/O line pair 230 is precharged to the precharge potential, first and second amplifier circuits 240 and 241 produce amplified signals $RD_{kn}$ and $\overline{RD}_{kn}$ at the L-level without utilizing the offset voltage, respectively. It is possible to prevent such a state during precharging of I/O line pair 230 that the offset voltage causes one of amplified signals $RD_{kn}$ and $\overline{RD}_{kn}$ to the H-level and causes the other to the L-level, and thereby the sub-output fixing signal attains the H-level.

In the first embodiment, first and second amplifier circuits 240 and 241 are provided at the stage preceding current mirror sense amplifiers 243 and 245 with level shifters 242 and 244 so as to reduce the levels of input potentials of current mirror sense amplifiers 243 and 245 for operating them at the high gain ranges. Therefore, first and second amplifier circuits 240 and 241 can operate at a high speed.

First and second amplifier circuits 240 and 241 are activated by sense amplifier enable signal $SE_k$ of the potential which is not completely equal to power supply potential $V_{cc}$ but is lower than that. This increases the gain of first and second amplifier circuits 240 and 241, and thus allows high speed operation of these circuits.

Second Embodiment

Figure 13:
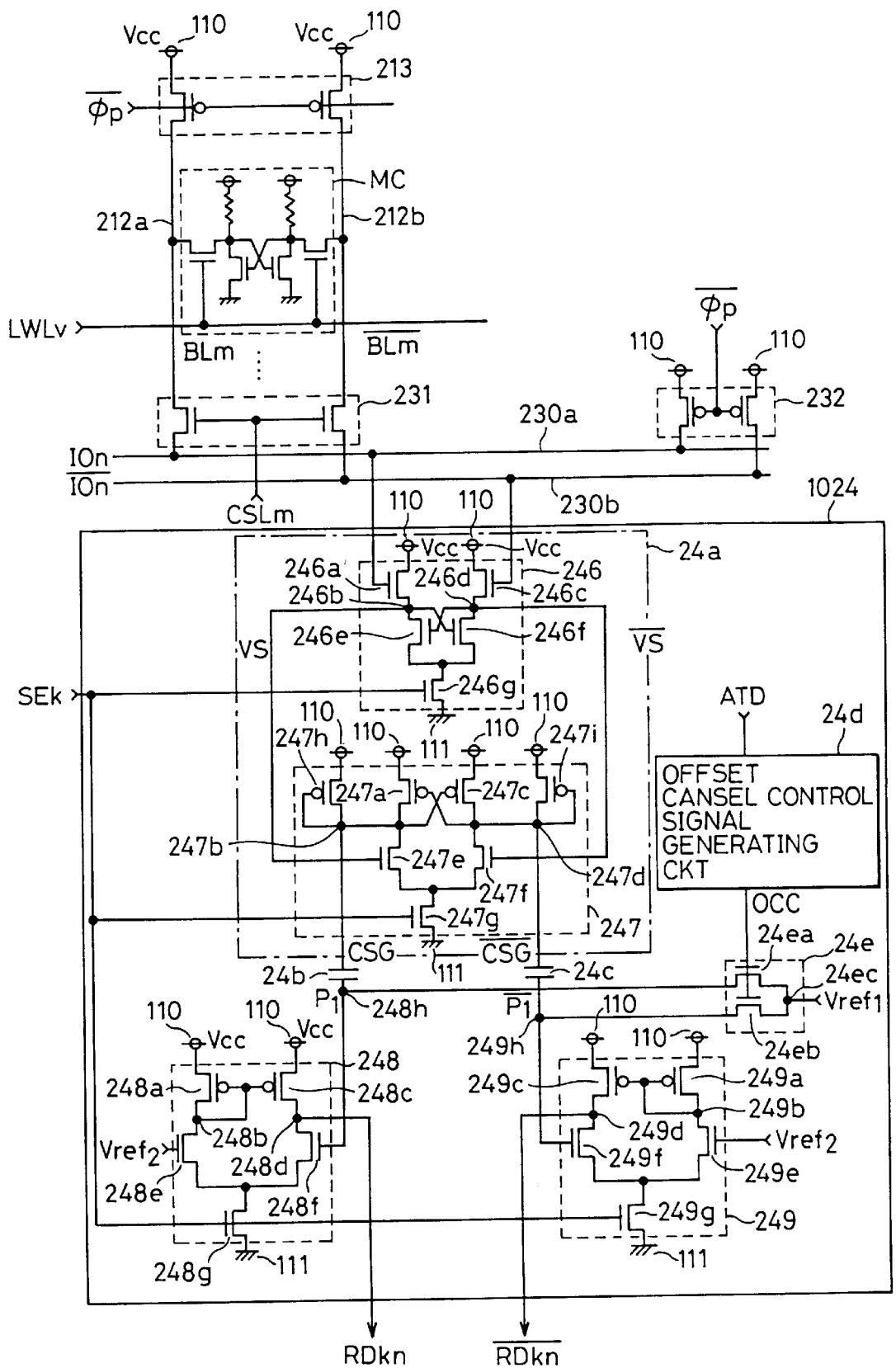
FIG. 13 is a circuit diagram showing a differential amplifier circuit and its peripheral circuitry of an SRAM in a second embodiment of the invention.

A second embodiment of this invention will be described below with reference to FIG. 13. The second embodiment differs from the first embodiment in the circuit structure of a differential amplifier circuit. FIG. 13 is a circuit diagram of a differential amplifier circuit 1024 and its peripheral circuitry of this second embodiment.

Differential amplifier circuit 1024 includes a level shifter 246, which receives potentials $IO_n$, and $\overline{IO}_n$ of I/O line pair 230 and shifts down them to produce shifted potentials VS and $\overline{VS}$, and a cross-coupled sense amplifier 247, which receives shifted potentials VS and $\overline{VS}$ from level shifter 246 and amplifies them to supply complementary signals CSC and $\overline{CSC}$ to first and second output nodes 247b and 247d, respectively. Cross-coupled sense amplifier 247 and level shifter 246 form a complementary amplifier circuit 24a.

Differential amplifier circuit 1024 further includes a first capacitor 24b having electrodes, one of which is connected to first output node 247b in complementary amplifier circuit 24a, a second capacitor 24c having electrodes, one of which is connected to second output node 247d in complementary amplifier circuit 24a, a first amplifier circuit 248 having a first input node 248h connected to the other electrode of first capacitor 24b, and being configured to receive a second reference $V_{ref2}$ (2.4 V) and potential $P_1$ of the first input node and produce amplified signal $RD_{kn}$, which attains the L-level when potential $P_1$ of the first input node is higher than second reference potential $V_{ref2}$, and attains the H-level when potential $P_1$ is lower than potential $V_{ref2}$, and a second amplifier circuit 249 having a second input node 249h connected to the other electrode of second capacitor 24c, and being configured to receive second reference $V_{ref2}$ (2.4 V) and potential $\overline{P}_1$ of the second input node and produce amplified signal $\overline{RD}_{kn}$, which attains the L-level when potential $\overline{P}_1$ of the second input node is higher than second reference potential $V_{ref2}$, and attains the H-level when potential $\overline{P}_1$ is lower than potential $V_{ref2}$.

Differential amplifier 1024 further includes an offset cancel control signal generating circuit 24d receiving address change signal ATD from address change detecting circuit 19 and producing an offset cancel control signal OCC, which attains the H-level in response to rise of address change signal ATD to the H-level and holds the H-level for a predetermined time period, and an offset cancel circuit 24e receiving a first reference potential $V_{ref1}$ (2.5 V) equal to $V_{cc}/2$ and offset cancel control signal OCC sent from offset cancel control signal generating circuit 24d, and applying first reference potential $V_{ref1}$ to first input node 248h of first amplifier circuit 248 and second input node 249h of second amplifier circuit 249 when offset cancel control signal OCC attains the H-level.

Offset cancel circuit 24e includes an n-channel MOS transistor 24ea, which is connected between a node 24ec receiving first reference potential $V_{ref1}$ and first input node 248h and receives offset cancel control signal OCC on its gate electrode, and an n-channel MOS transistor 24eb, which is connected between node 24e and second input node 249h and receives offset cancel control signal OCC.

Level shifter 246 includes an n-channel MOS transistor 246a, which is connected between power supply potential node 110 and a node 246b outputting shifted potential VS, and receives potential $IO_n$ of I/O line 230a on its gate, an n-channel MOS transistor 246c, which is connected between power supply potential node 110 and a node 246d outputting shifted potential $\overline{VS}$, and receives potential $\overline{IO}_n$ of I/O line 230b on its gate, an n-channel MOS transistor 246e having a drain electrode connected to node 246b and a gate electrode connected to node 246d, an n-channel MOS transistor 246f, which is connected between node 246d and a source electrode of n-channel MOS transistor 246e, and has a gate electrode connected to node 246b to form a cross-coupled circuit together with n-channel MOS transistor 246e, and an n-channel MOS transistor 246g, which is connected between the source electrodes of n-channel MOS transistors 246e and 246f and ground potential node 111, receives sense amplifier enable signal $SE_k$ on its gate electrode, and operates in a saturated range to form a constant current supply. Sense amplifier enable signal $SE_k$ is higher than the ground potential and is slightly lower than power supply potential $V_{cc}$ when block select signal $BS_k$ is at the H-level.

Cross-coupled sense amplifier 247 includes a p-channel MOS transistor 247a, which is connected between power supply potential node 110 and first output node 247b outputting complementary signal CSG, and has a gate electrode connected to second output node 247d outputting complementary signal $\overline{CSG}$, a p-channel MOS transistor 247c, which is connected between power supply potential node 110 and second output node 247d, and has a gate electrode connected to first output node 247d to form a cross-coupled circuit together with p-channel MOS transistor 247a, an n-channel MOS transistor 247e, which has a drain electrode connected to first output node 247d and receives shifted potential VS from level shifter 246 on its gate electrode, an n-channel MOS transistor 247f, which is connected between second output node 247d and a source electrode of n-channel MOS transistor 247e, and receives shifted potential $\overline{VS}$ from level shifter 246 on its gate electrode, an n-channel MOS transistor 247g, which is connected between the source electrodes of n-channel MOS transistors 247e and 247f and ground potential node 111, receives sense amplifier enable signal $SE_k$ on its gate, and operates in a saturated range to form a constant current supply, a p-channel MOS transistor 247h which is diode-connected between power supply potential node 110 and first output node 247b, and a p-channel MOS transistor 247i which is diode-connected between power supply potential node 110 and second output node 247d.

First amplifier circuit 248 includes a p-channel MOS transistor 248a, which is connected between power supply potential node 110 and a node 248b, and has a gate electrode connected to node 248b, a p-channel MOS transistor 248c, which is connected between power supply potential node 110 and an amplified signal output node 248d outputting amplified signal $RD_k$, has a gate electrode connected to node 248b, and forms a current mirror circuit together with p-channel MOS transistor 248a, an n-channel MOS transistor 248e, which has a drain electrode connected to node 248b and receives second reference potential $V_{ref2}$ on its gate electrode, an n-channel MOS transistor 248f, which is connected between amplified signal output node 248d and a source electrode of n-channel MOS transistor 248c, and has a gate electrode connected to a first input node 248h, and an n-channel MOS transistor 248g, which is connected between the source electrodes of n-channel MOS transistors 248e and 248f and ground potential node 111, receives sense amplifier enable signal $SE_k$ on its gate electrode, and operates in a saturated range to form a constant current supply. For low current consumption, the transistors forming first amplifier circuit 248 have sizes smaller than those forming cross-coupled sense amplifier 247.

Second amplifier circuit 249 includes a p-channel MOS transistor 249a, which is connected between power supply potential node 110 and a node 249b, and has a gate electrode connected to node 249b, a p-channel MOS transistor 249c, which is connected between power supply potential node 110 and an amplified signal output node 249d outputting amplified signal $\overline{RD}_{kn}$, has a gate electrode connected to node 249b, and forms a current mirror circuit together with p-channel MOS transistor 249a, an n-channel MOS transistor 249e, which has a drain electrode connected to node 249b and receives second reference potential $V_{ref2}$ on its gate electrode, an n-channel MOS transistor 249f, which is connected between amplified signal output node 249d and a source electrode of n-channel MOS transistor 249c, and has a gate electrode connected to a second input node 249h, and an n-channel MOS transistor 249g, which is connected between the source electrodes of n-channel MOS transistors 249e and 249f and ground potential node 111, receives sense amplifier enable signal $SE_k$ on its gate electrode, and operates in a saturated range to form a constant current supply. For low current consumption, the transistors forming second amplifier circuit 249 also have sizes smaller than those forming cross-coupled sense amplifier 247.

Description will be given on operation of the second embodiment constructed as described above. The operation of this second embodiment is substantially the same to that of the first embodiment shown in the timing chart of FIG. 12. Accordingly, only operation of differential amplifier circuit 1024 having the different circuit structure will be described below with reference to FIG. 14.

Figure 14:
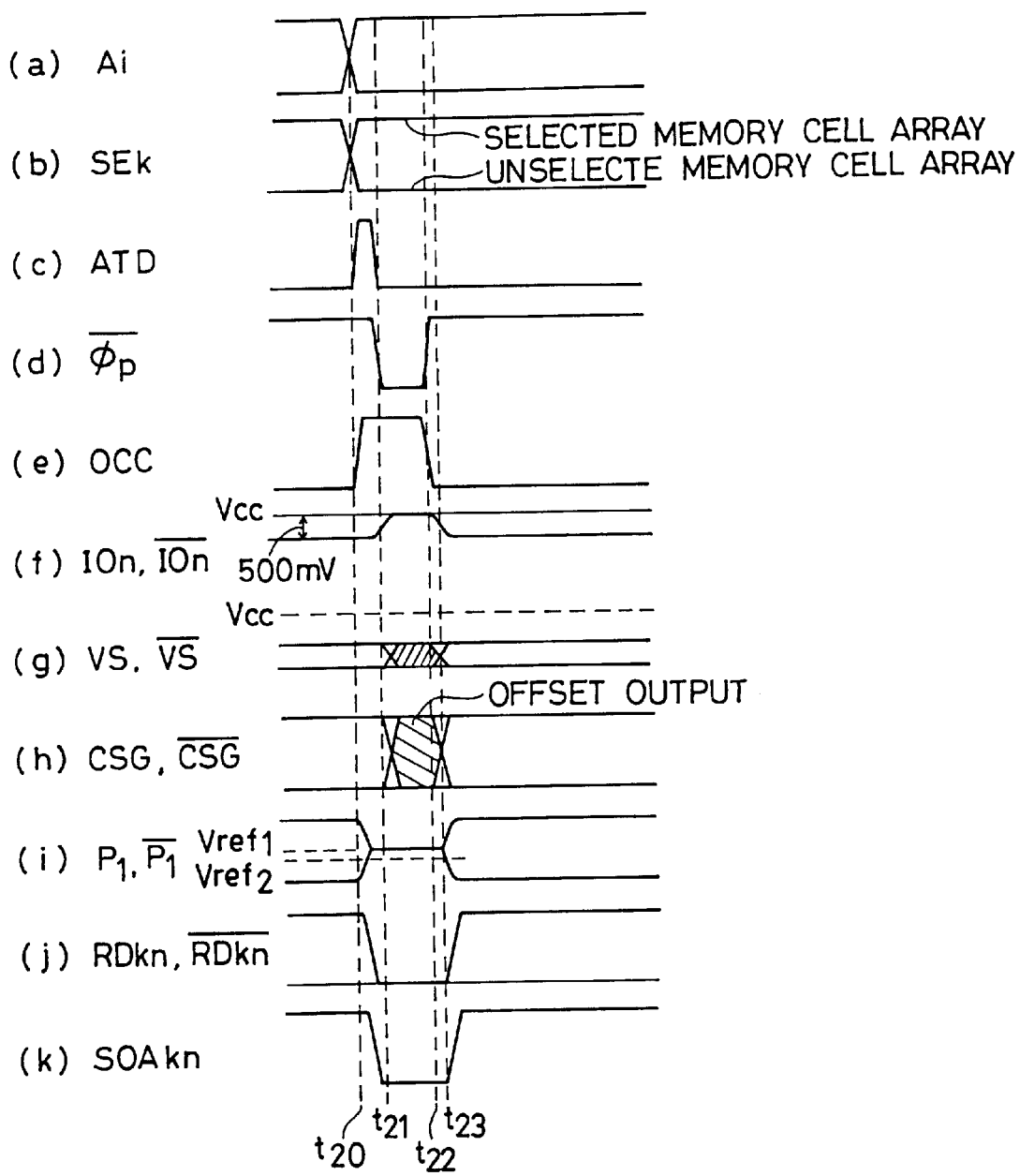
FIG. 14 is a timing chart showing an operation of the SRAM in the second embodiment of the invention.

First, address signal $A_i$ changes at time $t_{20}$ as shown at (a) in FIG. 14. In response to this address signal $A_i$, sense amplifier enable signal $SE_k$ corresponding to the selected memory array rises to the H-level as shown at (b) in FIG. 14. In response, differential amplifier circuit 24 is activated, and address change detecting circuit 19 detecting the change of address signal $A_i$ produces address change signal ATD of one-shot pulse as shown at (c) in FIG. 14. In response, offset cancel control signal OCC generated by offset cancel control signal generating circuit 24d rises to the H-level as shown at (e) in FIG. 14.

In response to offset cancel control signal OCC being raised to the H-level, n-channel MOS transistors 24ea and 24eb in offset cancel circuit 24e are turned on. First reference potential $V_{ref1}$ (2.5 V) is transmitted to first and second input nodes 248h and 249h. Potential $P_1$ of first input node 248h and potential $P_1$ of second input node 249h go to first reference potential $V_{ref1}$ as shown at (i) in FIG. 14. Thereby, first amplifier circuit 248 receives potential $P_1$ of the first input node as well as second reference potential $V_{ref2}$ (2.4 V) lower than first reference potential $V_{ref1}$ by about 100 mV.

First amplifier circuit 248 outputs amplified signal $RD_{kn}$ at the L-level as shown at (j) in FIG. 14, because potential $P_1$ (2.5 V) of the first input node is higher than second reference potential $V_{ref2}$ (2.4 V). By setting second reference potential $V_{ref2}$ to the value lower than first reference potential $V_{ref1}$ by about 100 mV as described above, it is possible to suppress the H-level of amplified signal $RD_{kn}$, which may be caused by the fact that the amplifier circuit has the offset voltage characteristics.

Similarly to first amplifier circuit 248, second amplifier circuit 249 receives potential $\overline{P}_1$ of the second input node and second reference potential $V_{ref2}$ (2.4 V) lower than first reference potential $V_{ref1}$ by about 100 mV. Since potential $P_1$ (2.5 V) of the first input node is higher than second reference potential $V_{ref2}$ (2.4 V), second amplifier circuit 249 outputs amplified signal $\overline{RD}_{kn}$ at the L-level as shown at (j) in FIG. 14. Sub-output fixing signal generating circuit 250 receiving amplified signals $RD_{kn}$ and $\overline{RD}_{kn}$, both of which are at the L-level, outputs sub-output fixing signal $SOA_{kn}$ at the L-level as shown at (k) in FIG. 14.

In response to the address change signal ATD of one-shot pulse, precharge signal $\overline{\phi}_p$ generated from precharge signal generating circuit 20 attains the L-level at time $t_{21}$ as shown at (c) in FIG. 14. I/O line precharge circuit 232 receiving precharge signal $\overline{\phi}_p$ precharges I/O lines 230a and 230b to have potentials $IO_n$, and $\overline{IO}_n$, equal to power supply potential $V_{cc}$ as shown at (f) in FIG. 14.

Level shifter 246 receiving potentials $IO_n$, and $\overline{IO}_n$ of the I/O lines must ideally produce shifted potentials VS and $\overline{VS}$ intermediate the ground potential and power supply potential, but actually produces shifted potentials VS and $\overline{VS}$, one of which is higher than the intermediate potential, and the other of which is lower than the intermediate potential as represented by a hatched portion at (g) in FIG. 14, due to deviation of the sizes of the transistors forming the level shifter 246 also in this case. complementary signals CSG and $\overline{CSG}$, which are supplied to first and second output nodes 247b and 247d of cross-coupled sense amplifier 247 receiving shifted potentials VS and $\overline{Vs}$, respectively, attain the H- and L-level, or the L- and H-level as represented by a hatched portion at (h) in FIG. 14, respectively, when a potential difference exists between shifted potentials VS and $\overline{VS}$. When both shifted potentials VS and $\overline{VS}$ are equal to the ideal intermediate potential, cross-coupled sense amplifier 247 must ideally produce complementary signals CSG and $\overline{CSG}$ of the intermediate potential, however, likewise in this case, it actually produces complementary signals CSG and $\overline{CSG}$, one of which is at the H-level, and the other of which is at the L-level as represented by a hatched portion at (h) in FIG. 14, due to the offset characteristics caused by deviation of sizes of the transistors forming cross-coupled sense amplifier 247. Also at time $t_{21}$, offset cancel circuit 24e applies first reference potential $V_{ref1}$ (2.5 V) to first and second input nodes 248h and 249h. Accordingly, both first and second amplifier circuits 248 and 249 continue to output complementary signals $RD_{kn}$ and $\overline{RD}_{kn}$ at the L-level.

When precharge signal $\overline{\phi}_p$ rises to the H-level at time $t_{22}$ as shown at (d) in FIG. 14, precharging of I/O lines 230a and 230b is completed. Potentials $IO_n$, and $\overline{IO}_n$ of I/O lines 230a and 230b attain the levels depending on data stored in the selected memory cell in such a manner that one of them remains at the precharged power supply potential $V_{cc}$ and the other attains a potential lower than precharged power supply potential $V_{cc}$ by about 500 mV as shown at (f) in FIG. 14.

Offset cancel control signal OCC generated from offset cancel control signal generating circuit 24d also falls to the L-level as shown at (e) in FIG. 14. In response, n-channel MOS transistors 24ea and 24eb of offset cancel circuit 24e are turned off. As a result, first reference potential $V_{ref1}$ is not supplied to first and second input nodes 248h and 249h any longer.

Level shifter 246, which receives potentials $IO_n$ and $\overline{IO}_n$ of I/O lines 230a and 230b having the potential difference, shifts down these potential levels to produce shifted potentials VS and $\overline{VS}$ at time $t_{23}$ as shown at (g) in FIG. 14. Cross-coupled sense amplifier 247 receives shifted potentials VS and $\overline{VS}$ and outputs complementary signals CSG and $\overline{CSG}$, one of which attains the H-level, and the other of which attains the L-level, as shown at (h) in FIG. 14. Owing to the capacitive coupling of first and second capacitors 24b and 24c receiving complementary signals CSG and $\overline{\text{CSG}}$, one of potential $P_1$ of first input node 248h and potential $\overline{P}_1$ of second input node 249h attains the H-level higher than second reference potential $V_{ref2}$ (2.4 V) supplied to first and second amplifier circuits 248 and 249, and the other of them attains the L-level lower than second reference potential $V_{ref2}$ (2.4 V) as shown at (i) in FIG. 14.

One of amplified signal $RD_{kn}$ and $\overline{RD}_{kn}$ supplied from first and second amplifier circuits 248 and 249 attains the H-level, and the other attains the L-level as shown at (j) in FIG. 14. In response, sub-output fixing signal $SOA_{kn}$ supplied from sub-output fixing signal generating circuit 250 rises to the H-level.

In this manner, the computer of the second embodiment can achieve the following effect in addition to the effect by the computer and SRAM of the first embodiment. In differential amplifier circuit 1024, first and second capacitors 24b and 24c are arranged between cross-coupled sense amplifier 247, and first and second input nodes 248h and 249h, respectively, and offset cancel circuit 24c applies first reference potential $V_{ref1}$ to first and second input nodes 248h and 249h during precharging of I/O line pair 230.

Therefore, first and second input nodes 248h and 249h are not affected by the offset voltage of cross-coupled sense amplifier 247 during precharging. As a result, the offset voltage of cross-coupled sense amplifier 247 does not affect amplified signals $RD_{kn}$ and $\overline{RD}_{kn}$, and thus the offset voltage does not erroneously cause sub-output fixing signal $SOA_{kn}$ to attain the H-level.

Further, in differential amplifier circuit 1024, first and second amplifier circuits 248 and 249 receive second reference potential $V_{ref2}$ (2.4 V), which is lower by about 100 mV than first reference potential $V_{ref1}$ (2.5 V) applied to first and second input nodes 248h and 249h during precharging of I/O line pair 230. During precharging, first and second amplifier circuits 248 and 249 produce amplified signals $RD_{kn}$ and $\overline{RD}_{kn}$ both at the L-level regardless of the offset voltage. The offset voltage does not erroneously cause sub-output fixing signal $SOA_{kn}$ to attain the H-level.

Third Embodiment

A third embodiment of the invention will be described below with reference to FIG. 15. An SRAM of the third embodiment differs from the SRAM of the second embodiment in circuit structures of first and second amplifier circuits in a differential amplifier circuit, and in that the first amplifier circuit outputs amplified signal $\overline{RD}_{kn}$ and that the second amplifier circuit outputs amplified signal $RD_{kn}$.

Figure 15:
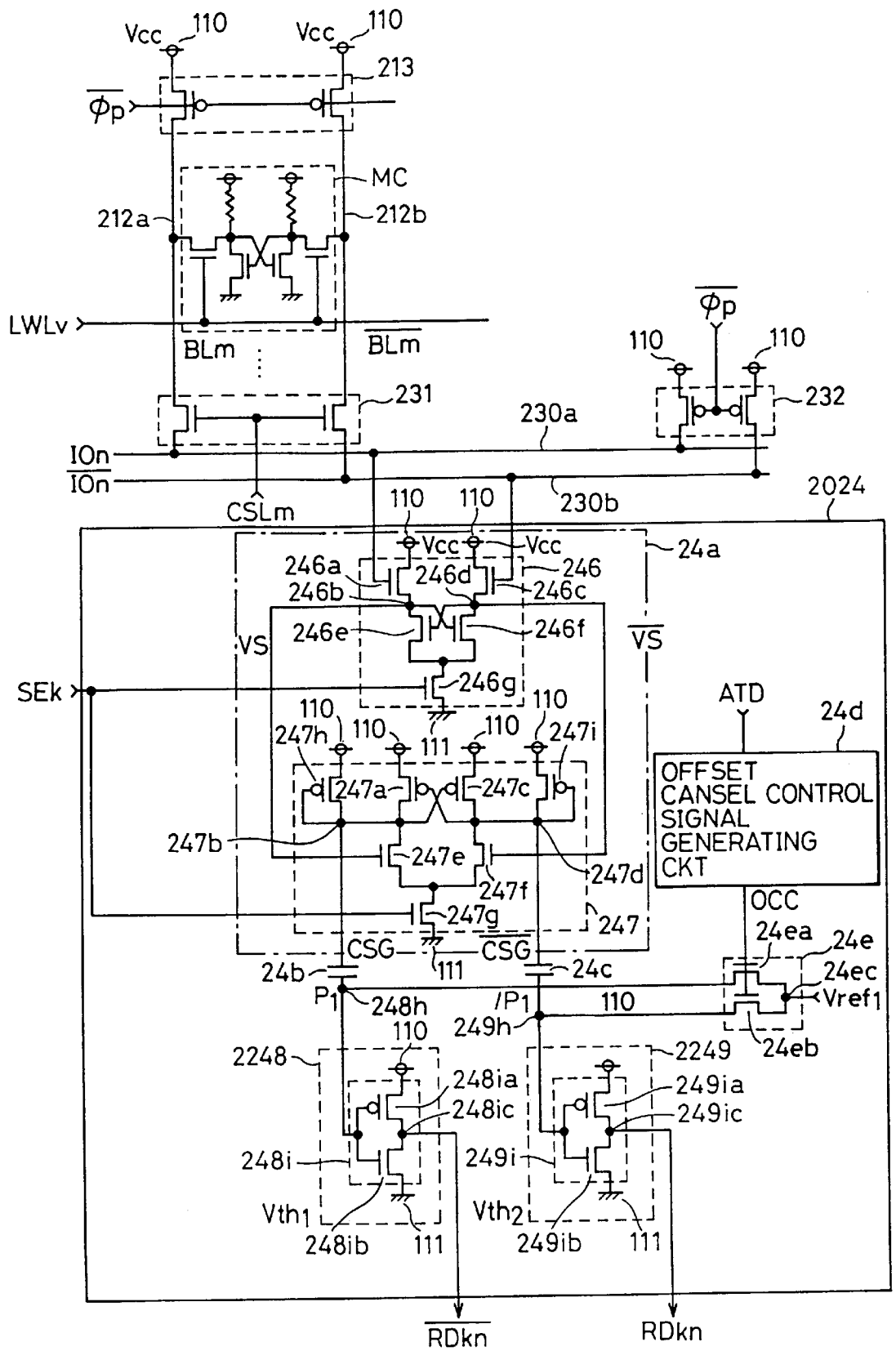
FIG. 15 is a circuit diagram showing a differential amplifier circuit and its peripheral circuitry of an SRAM in a third embodiment of the invention.

FIG. 15 is a circuit diagram showing a differential amplifier circuit 2024 and a peripheral circuitry of the third embodiment. Differential amplifier circuit 2024 includes a first amplifier circuit 2248 and a second amplifier circuit 2249 instead of first amplifier circuit 248 and second amplifier circuit 249 in FIG. 13. First amplifier circuit 2248 includes an inverter 248i, which is connected between first input node 248h and an amplified signal output node 248ic outputting amplified signal $\overline{RD}_{kn}$, receives potential $P_1$ of first input node 248h, has a certain threshold voltage $V_{th1}$ (2.4 V), and supplies amplified signal $\overline{RD}_{kn}$ which attains the L-level when potential $P_1$ of first input node 248h is higher than the threshold voltage $V_{th1}$, and attains the H-level when it is lower than threshold voltage $V_{th1}$. The threshold voltage $V_{th1}$ is lower than first reference potential $V_{ref1}$ which is applied to first input node 248h by offset cancel circuit 24e during precharging of I/O line pair 230. Inverter 248i is formed of a p-channel MOS transistor 248ia, which is connected between power supply potential node 110 and amplified signal output node 248ic and has a gate electrode connected to first input node 248h, and an n-channel MOS transistor 248ib, which is connected between amplified signal output node 248ic and ground potential node 111 and has a gate electrode connected to first input node 248h.

Second amplifier circuit 2249 includes an inverter 249i, which is connected between second input node 249h and amplified signal output node 249ic outputting amplified signal $RD_{kn}$, receives potential $\overline{P}_1$ of second input node 249h, has a certain threshold voltage $V_{th2}$ (2.4 V), and supplies amplified signal $RD_{kn}$ which attains the L-level when potential $\overline{P}_1$ of second input node 249h is higher than the threshold voltage $V_{th2}$, and attains the H-level when it is lower than threshold voltage $V_{th2}$. The threshold voltage $V_{th2}$ is lower than first reference potential $V_{ref1}$ which is applied to second input node 249h by offset cancel circuit 24e during precharging of I/O line pair 230. Inverter 249i is formed of a p-channel MOS transistor 249ia, which is connected between power supply potential node 110 and amplified signal output node 249ic and has a gate electrode connected to second input node 249h, and an n-channel MOS transistor 249ib, which is connected between amplified signal output node 249ic and ground potential node 111 and has a gate electrode connected to second input node 249h.

Threshold voltages $V_{th1}$ and $V_{th2}$ of inverters 248i and 249i depend on channel lengths of transistors forming inverters 248i and 249i. When first and second input nodes 248h and 249h receive first reference potential $V_{ref1}$ (2.5 V), a through current may flow from power supply potential node 110 to ground potential node 111 via p-channel MOS transistor 248ia and n-channel MOS transistor 248ib, and a through current may flow from power supply potential node 110 to ground potential node 111 via p-channel MOS transistor 249ia and n-channel MOS transistor 249ib. In order to reduce these through currents, these transistors have channel widths smaller than those of transistors forming cross-coupled sense amplifier 247, and thus have a reduced ratio between the channel width and the channel length.

This third embodiment operates substantially similarly to the first embodiment, of which operation is shown in the timing chart of FIG. 12. Differential amplifier circuit 2024 having a circuit structure different from that of the first embodiment operates similarly to differential amplifier circuit 1024 of the second embodiment, of which operation is shown in the timing chart of FIG. 14.

As described above, the computer of the third embodiment achieves the following effect, in addition to the effect by the computers and SRAMs of the first and second embodiments. According to the third embodiment, first and second amplifier circuits 2248 and 2249 in differential amplifier circuit 2024 are formed of inverters 248i and 249i having threshold voltages $V_{th1}$ and $V_{th2}$ (2.4 V) which are lower by about 100 mV than first reference potential $V_{ref1}$ (2.5 V) applied to first and second input nodes 248h and 249h during precharging of I/O line pair 230.

During precharging, sub-output fixing signal $SOA_{kn}$ surely attains the L-level, and the circuitry can be formed of elements which are smaller in number than those of first and second amplifier circuits 248 and 249 formed of the current mirror sense amplifiers in the second embodiment. Since a circuit for generating second reference potential $V_{ref2}$ is not required, a layout area of the third embodiment can be smaller than that of the second embodiment.

Transistors forming inverters 248i and 249i have the channel widths smaller than those of the transistors forming the cross-coupled sense amplifier 247, and hence have a reduced ratio between the channel width and channel length, so that the through current can be reduced, and a power consumption can be reduced.

Fourth Embodiment

Figure 16:
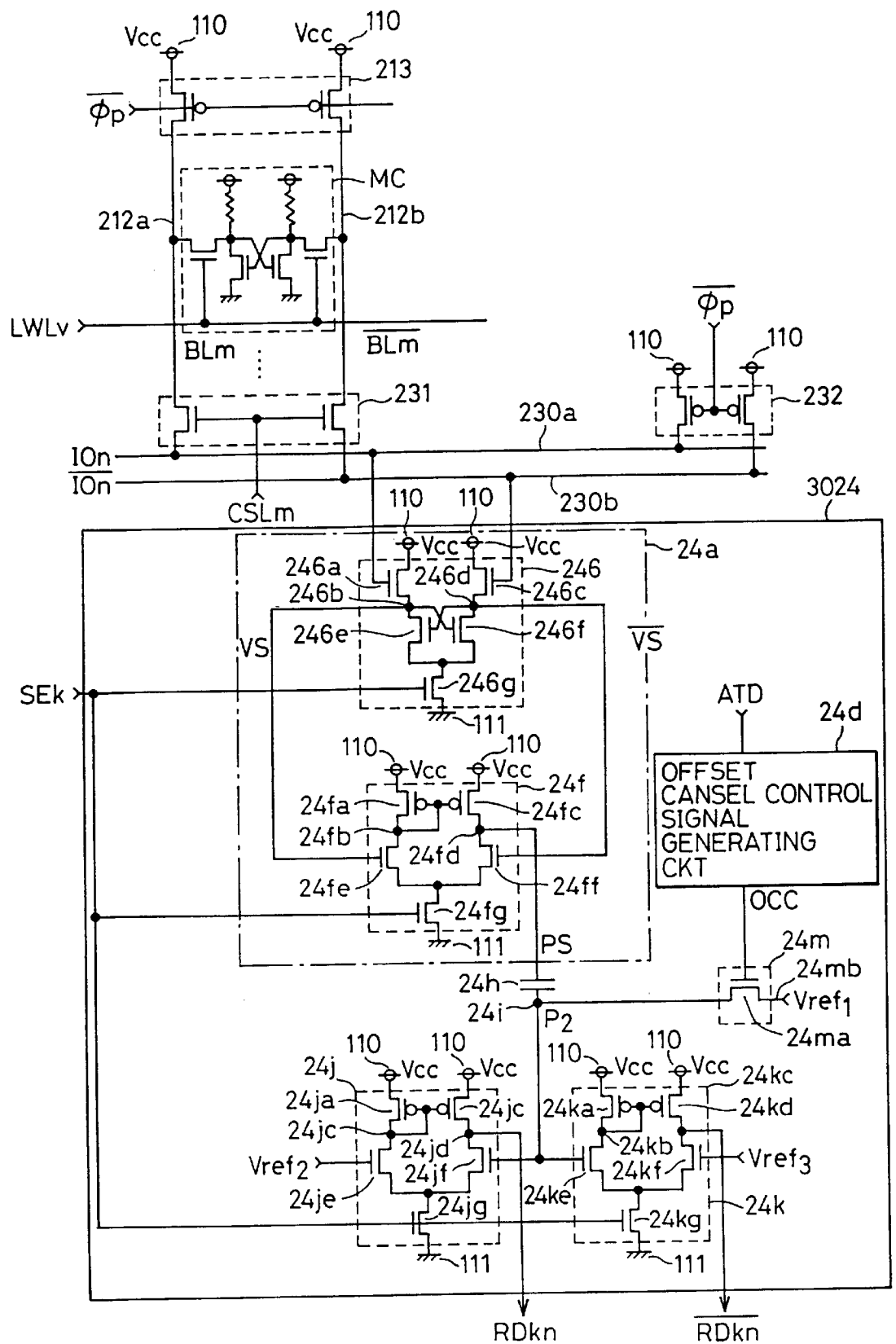
FIG. 16 is a circuit diagram showing a differential amplifier circuit and its peripheral circuitry of an SRAM in a fourth embodiment of the invention.

A fourth embodiment of the invention will be described below with reference to FIG. 16. The fourth embodiment differs from the second embodiment in the circuit structure of the differential amplifier circuit. FIG. 16 is a circuit diagram of a differential amplifier circuit 3024 and its peripheral circuitry of the fourth embodiment. Differential amplifier circuit 3024 includes level shifter 246 having the same structure as the level shifter 246 in the second embodiment, and receives potentials $IO_n$ and $\overline{IO}_n$ of I/O line pair 230 to shift down them for outputting shifted potentials VS and $\overline{VS}$, and a current mirror sense amplifier 24f, which receives shifted potentials VS and $\overline{VS}$ from level shifter 246 and amplifies them to output a preamplified signal PS to an output node 24fd. Current mirror amplifier 24f forms a preamplifier circuit 24g together with level shifter 246.

Differential amplifier circuit 3024 further includes a capacitor 24h having electrodes, one of which is connected to output node 24fd in preamplifier circuit 24g, a first amplifier circuit 24j, which receives second reference potential $V_{ref2}$ (2.4 V) and potential $P_2$ of an input node 24i connected to the other electrode of capacitor 24h, and outputs amplified signal $RD_{kn}$ which attains the L-level when potential $P_2$ of this input node is higher than second reference potential $V_{ref2}$, and attains the H-level when it is lower than second reference potential $V_{ref2}$, and a second amplifier circuit 24k, which receives third reference potential $V_{ref3}$ (2.6 V) and potential $P_2$ of input node 24i commonly used by first amplifier circuit 24j, and outputs amplified signal $\overline{RD}_{kn}$ which attains the H-level when potential $P_2$ of this input node is higher than the third reference potential $V_{ref3}$, and attains the L-level when it is lower than the third reference potential $V_{ref3}$.

Differential amplifier circuit 3024 includes offset cancel control signal generating circuit 24d which is the same as offset cancel control signal generating circuit 24d in the second embodiment. Offset cancel control signal generating circuit 24d receives address change detecting signal ATD from address change detecting circuit 19, and produces offset cancel control signal OCC which attains the H-level in response to rise of address change signal ATD to the H-level and maintains the H-level for a predetermined period.

Differential amplifier circuit 3024 includes an offset cancel circuit 24m, which receives first reference potential $V_{ref1}$ (2.5 V) and offset cancel control signal OCC sent from offset cancel control signal generating circuit 24d, and applies first reference potential $V_{ref1}$ to the common input node 24i of first and second amplifier circuits 24j and 24k when offset cancel control signal OCC attains the H-level. Offset cancel circuit 24m is formed of an n-channel MOS transistor 24ma, which is connected between a node 24mb receiving first reference potential $V_{ref1}$ and input node 24i, and receives offset cancel control signal OCC on its gate electrode.

Current mirror sense amplifier 24f includes a p-channel MOS transistor 24fa, which is connected between power supply potential node 110 and a node 24fb, and has a gate electrode connected to node 24fb, a p-channel MOS transistor 24fc, which is connected between power supply potential node 110 and an output node 24fd outputting preamplified signal PS, has a gate electrode connected to node 24fb and forms a current mirror circuit together with p-channel MOS transistor 24fa, an n-channel MOS transistor 24fe, which has a drain electrode connected to node 24fb and a gate electrode receiving shifted potential VS from level shifter 246, an n-channel MOS transistor 24ff, which is connected between output node 24fd and a source electrode of n-channel MOS transistor 24fe, and receives shifted potential $\overline{VS}$ on its gate electrode from level shifter 246, and an n-channel MOS transistor 24fg, which is connected between the source electrodes of n-channel MOS transistors 24fc and 24ff and ground potential node 111, receives sense amplifier enable signal $SE_k$ on its gate, and operates in a saturated range to form a constant current supply.

First amplifier circuit 24j includes a p-channel MOS transistor 24ja, which is connected between power supply potential node 110 and a node 24jb and has a gate electrode connected to node 24jb, a p-channel MOS transistor 24jc, which is connected between power supply potential node 110 and an amplified signal output node 24jd outputting amplified signal $RD_{kn}$, has a gate electrode connected to node 24jb, and forms a current mirror circuit together with p-channel MOS transistor 24ja, an n-channel MOS transistor 24je, which has a drain electrode connected to node 24jd and receives second reference potential $V_{ref2}$ (2.4 V) on its gate electrode, an n-channel MOS transistor 24jf, which is connected between amplified signal output node 24jd and a source electrode of n-channel MOS transistor 24je and has a gate electrode connected to input node 24i, and an n-channel MOS transistor 24jg, which is connected between ground potential node 111 and the source electrodes of n-channel MOS transistors 24je and 24jf, receives sense amplifier enable signal $SE_k$ on its gate, and operates in a saturated range to form a constant current supply. For reducing a current consumption, first amplifier circuit 24j is formed of the transistors having sizes smaller than those forming current mirror sense amplifier 24f.

Second amplifier circuit 24k includes a p-channel MOS transistor 24ka, which is connected between power supply potential node 110 and a node 24kb and has a gate electrode connected to node 24kb, a p-channel MOS transistor 24kc, which is connected between power supply potential node 110 and an amplified signal output node 24kd outputting amplified signal $\overline{RD}_{kn}$, has a gate electrode connected to node 24kb, and forms a current mirror circuit together with p-channel MOS transistor 24ka, an n-channel MOS transistor 24ke, which has a drain electrode connected to node 24kd and a gate electrode connected to input node 24i, an n-channel MOS transistor 24kf, which is connected between amplified signal output node 24kd and a source electrode of n-channel MOS transistor 24ke and receives third reference potential $V_{ref3}$ (2.6 V) on its gate electrode, and an n-channel MOS transistor 24kg, which is connected between ground potential node 111 and the source electrodes of n-channel MOS transistors 24ke and 24kf, receives sense amplifier enable signal $SE_k$ on its gate, and operates in a saturated range to form a constant current supply. For reducing a current consumption, second amplifier circuit 24k is formed of the transistors having sizes smaller than those forming current mirror sense amplifier 24f.

Operation of the fourth embodiment thus constructed will be described below. Operation of the SRAM of the fourth embodiment is substantially similar to that of the first embodiment shown in the timing chart of FIG. 12. Accordingly, the following description will be given only on the operation of differential amplifier circuit 3024 having the circuit structure different from that of the first embodiment with reference to FIG. 17.

Figure 17:
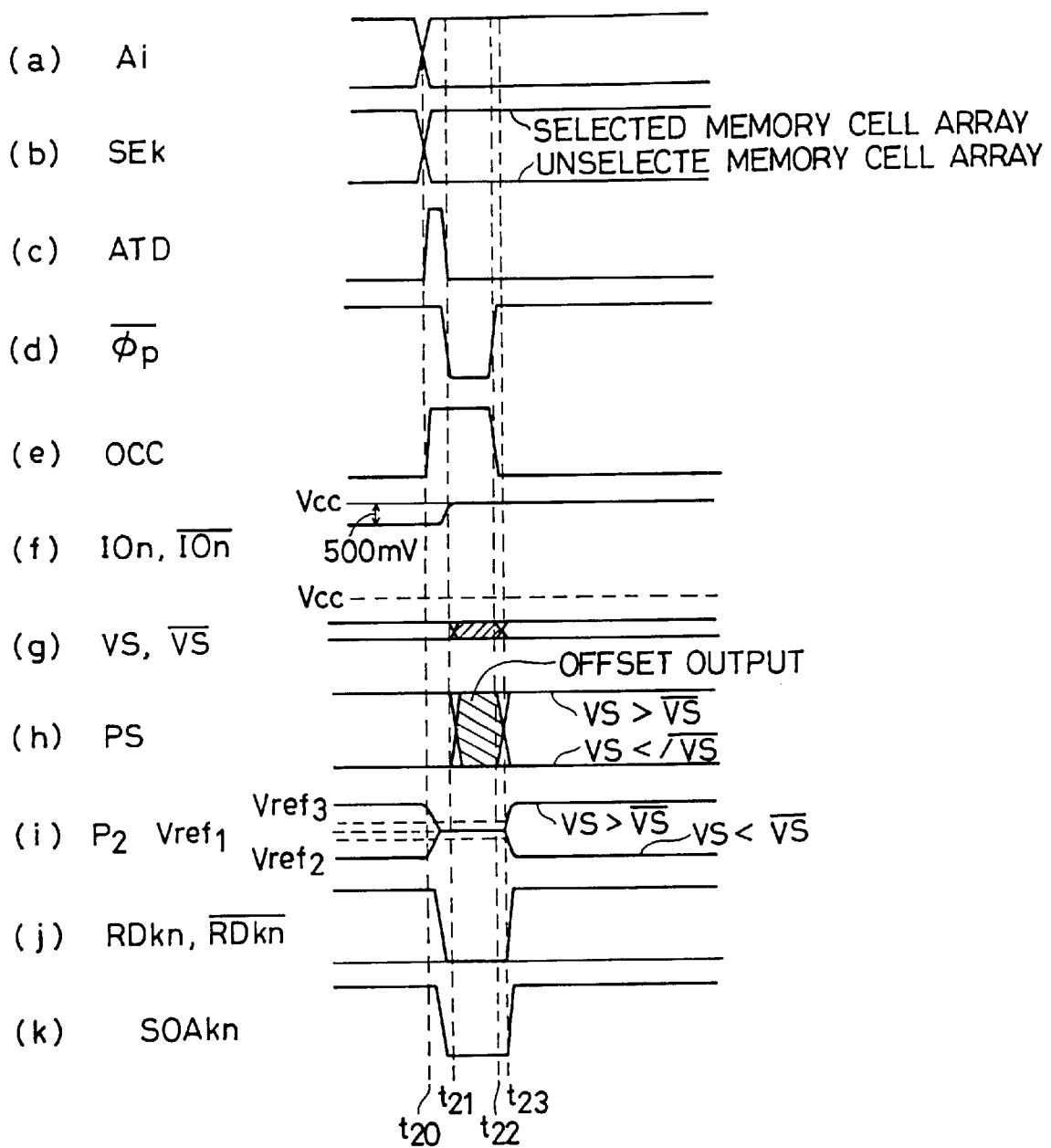
FIG. 17 is a timing chart showing an operation of the SRAM in the fourth embodiment of the invention.

First, address signal $A_i$ changes at time $t_{20}$ as shown at (a) in FIG. 17. In response to this address signal $A_i$, sense amplifier enable signal $SE_k$ corresponding to the selected memory array rises to the H-level as shown at (b) in FIG. 17. In response, differential amplifier circuit 3024 is activated. Address change detecting circuit 19 (FIG. 6A) detecting the change of address signal $A_i$ supplies address change signal ATD of one-shot pulse as shown at (c) in FIG. 17. In response, offset cancel control signal OCC generated by offset cancel control signal generating circuit 24d rises to the H-level as shown at (e) in FIG. 17.

In offset cancel circuit 24m receiving offset cancel control signal OCC raised to the H-level, n-channel MOS transistor 24ma is turned on. First reference potential $V_{ref1}$ (2.5 V) equal to $V_{cc}/2$ is transmitted to input node 24i. Potential $P_2$ of input node 24i goes to first reference potential $V_{ref1}$ as shown at (i) in FIG. 17. Thereby, first amplifier circuit 24j receiving potential $P_2$ of input node 24i and second reference potential $V_{ref2}$ (2.4 V), which is lower by about 100 mV than first reference potential $V_{ref1}$, outputs amplified signal $RD_{kn}$ at the L-level as shown at (j) in FIG. 17, because potential $P_2$ (2.5 V) of input node 24i is higher than second reference potential $V_{ref1}$ (2.4 V).

As described above, by setting second reference potential $V_{ref2}$ to a value lower than first reference potential $V_{ref1}$ by about 100 mV, the H-level of amplified signal $RD_{kn}$, which may be caused by the offset voltage characteristics of the amplifier circuit, can be suppressed.

Similarly to the first amplifier circuit 24j, second amplifier circuit 24k receives potential $P_2$ of input node 24i and third reference potential $V_{ref3}$ (2.6 V) higher than first reference potential $V_{ref1}$ by about 100 mV, and produces amplified signal $\overline{RD}_{kn}$ which attains the L-level as shown at (j) in FIG. 17, because potential $P_1$ of input node 24i is lower than third reference potential $V_{ref3}$ (2.6 V). As described above, by setting third reference potential $V_{ref3}$ to a value higher than first reference potential $V_{ref1}$ by about 100 mV, the H-level of amplified signal $\overline{RD}_{kn}$, which may be caused by the offset voltage characteristics of the amplifier circuit, can be suppressed. Sub-output fixing signal generating circuit 250 receiving amplified signals $RD_{kn}$ and $\overline{RD}_{kn}$ at the L-level produces sub-output fixing signal $SOA_{kn}$ at the L-level as shown at (k) in FIG. 17.

In response to the address change signal ATD of one-shot pulse, precharge signal $\overline{\phi}_p$ generated from precharge signal generating circuit 20 attains the L-level at time $t_{21}$ as shown at (c) in FIG. 17. I/O line precharge circuit 232 receiving precharge signal $\overline{\phi}_p$ precharges I/O lines 230a and 230b so that they have potentials $IO_n$, and $\overline{IO}_n$ equal to power supply potential $V_{cc}$ as shown at (f) in FIG. 17. Level shifter 246 receiving potentials $IO_n$, and $\overline{IO}_n$ of the I/O lines must ideally produce shifted potentials VS and $\overline{VS}$ intermediate the ground potential and power supply potential, but actually produces shifted potentials VS and $\overline{VS}$, one of which is higher than the intermediate potential, and the other of which is lower than the intermediate potential as represented by a hatched portion at (g) in FIG. 17, due to deviation of the sizes of the transistors forming the level shifter 246 also in this case.

Preamplified signal PS, which is supplied to output node 24fd of current mirror sense amplifier 24f receiving shifted potentials VS and $\overline{VS}$, attains the H-level or L-level, if a potential difference exists between shifted potentials VS and $\overline{VS}$, and more specifically, attains the H-level in the case of VS>$\overline{VS}$ as represented by a hatched portion at (h) in FIG. 17 and the L-level in the case of VS<$\overline{VS}$. When both shifted potentials VS and $\overline{VS}$ are ideally equal to the intermediate potential, current mirror sense amplifier 24f must ideally produce preamplified signal PS of the intermediate potential, but, also in this case, actually produces preamplified signal PS at the H-level or the L-level as shown at (h) in FIG. 17, due to the offset characteristics caused by deviation of sizes of the transistors forming current mirror sense amplifier 24f. Also at time $t_{21}$, offset cancel circuit 24m applies first reference potential $V_{ref1}$ (2.5 V) to input node 24i. Accordingly, both first and second amplifier circuits 24j and 24k continue to output amplified signals $RD_{kn}$ and $\overline{RD}_{kn}$ at the L-level.

When precharge signal $\overline{\phi}_p$ rises to the H-level at time $t_{22}$ as shown at (d) in FIG. 17, precharging of I/O lines 230a and 230b is completed. Potentials $IO_n$, and $\overline{IO}_n$, of I/O lines 230a and 230b attain the levels depending on data stored in the selected memory cell in such a manner that one of them remains at precharged power supply potential $V_{cc}$ and the other attains a potential lower than precharged power supply potential $V_{cc}$ by about 500 mV as shown at (f) in FIG. 17. Offset cancel control signal OCC generated from offset cancel control signal generating circuit 24d also falls to the L-level as shown at (e) in FIG. 17. In response, n-channel MOS transistor 24ma of offset cancel circuit 24m is turned off, so that first reference potential $V_{ref1}$ is not supplied to input node 24i any longer.

Level shifter 246, which receives potentials $IO_n$ and $\overline{IO}_n$ of I/O lines 230a and 230b having the potential difference, shifts down these potential levels to output shifted potentials VS and $\overline{VS}$ at time $t_{23}$ as shown at (g) in FIG. 17. Current mirror sense amplifier 24f receives shifted potentials VS and $\overline{VS}$ and outputs preamplified signals PS, which is at the H-level in the case of VS>$\overline{VS}$, and is at the L-level in the case of VS<$\overline{VS}$.

Owing to the capacitive coupling of capacitor 24h receiving preamplified signal PS, potential $P_2$ of input node 24i changes to the H-level higher than second reference potential $V_{ref2}$ (2.4 V) supplied to first amplifier circuit 24i and third reference potential $V_{ref3}$ (2.6 V) supplied to second amplifier circuit 24k, when preamplified signal PS changes to the H-level as shown at (i) FIG. 17. When preamplified signal PS changes to the level, potential $P_2$ attains the L-level lower than second reference potential $V_{ref2}$ (2.4 V) supplied to first amplifier circuit 24i and third reference potential $V_{ref3}$ (2.6 V) supplied to second amplifier circuit 24k.

One of amplified signals $RD_{kn}$ and $\overline{RD}_{kn}$ supplied from first and second amplifier circuits 24j and 24k attains the H-level, and the other attains the L-level as shown at (j) in FIG. 17. In response, sub-output fixing signal $SOA_{kn}$ generated by sub-output fixing signal generating circuit 250 rises to the H-level.

In this manner, the computer of the fourth embodiment can achieve the following effect in addition to the effect by the computers and SRAMs of the first to third embodiments. In differential amplifier circuit 3024, capacitor 24h is arranged between current mirror sense amplifier 24f and input node 24i, and offset cancel circuit 24m applies first reference potential $V_{ref1}$ to input node 24i during precharging of I/O line pair 230. Therefore, input node 24i is not affected by the offset voltage of current mirror sense amplifier 24f during precharging. As a result, the offset voltage of current mirror sense amplifier 24f does not affect amplified signals $RD_{kn}$ and $\overline{RD}_{kn}$, and the offset voltage does not erroneously cause sub-output fixing signal $SOA_{kn}$ to attain the H-level.

Further, in differential amplifier circuit 3024, first and second amplifier circuits 24j and 24k receive second reference potential $V_{ref2}$ (2.4 V), which is lower by about 100 mV than first reference potential $V_{ref1}$ (2.5 V) applied to input node 24i, and third reference potential $V_{ref2}$ (2.6 V), which is higher by about 100 mV than first reference potential $V_{ref1}$ (2.5 V), during precharging of I/O line pair 230, respectively. During precharging, first and second amplifier circuits 24j and 24k produce amplified signals $RD_{kn}$ and $\overline{RD}_{kn}$ at the L-level without utilizing the offset voltage. As a result, the offset voltage does not erroneously cause sub-output fixing signal $SOA_{kn}$ to attain the H-level.

Fifth Embodiment

A fifth embodiment of the invention will be described below with reference to FIG. 18. The fifth embodiment differs from the fourth embodiment in that differential amplifier circuit 24 includes a first amplifier circuit 4024j and a second amplifier circuit 4024k instead of first and second amplifier circuits 24j and 24k, that first amplifier circuit 4024j outputs amplified signal $\overline{RD}_{kn}$ and that second amplifier circuit 4024k outputs amplified signal $RD_{kn}$.

Figure 18:
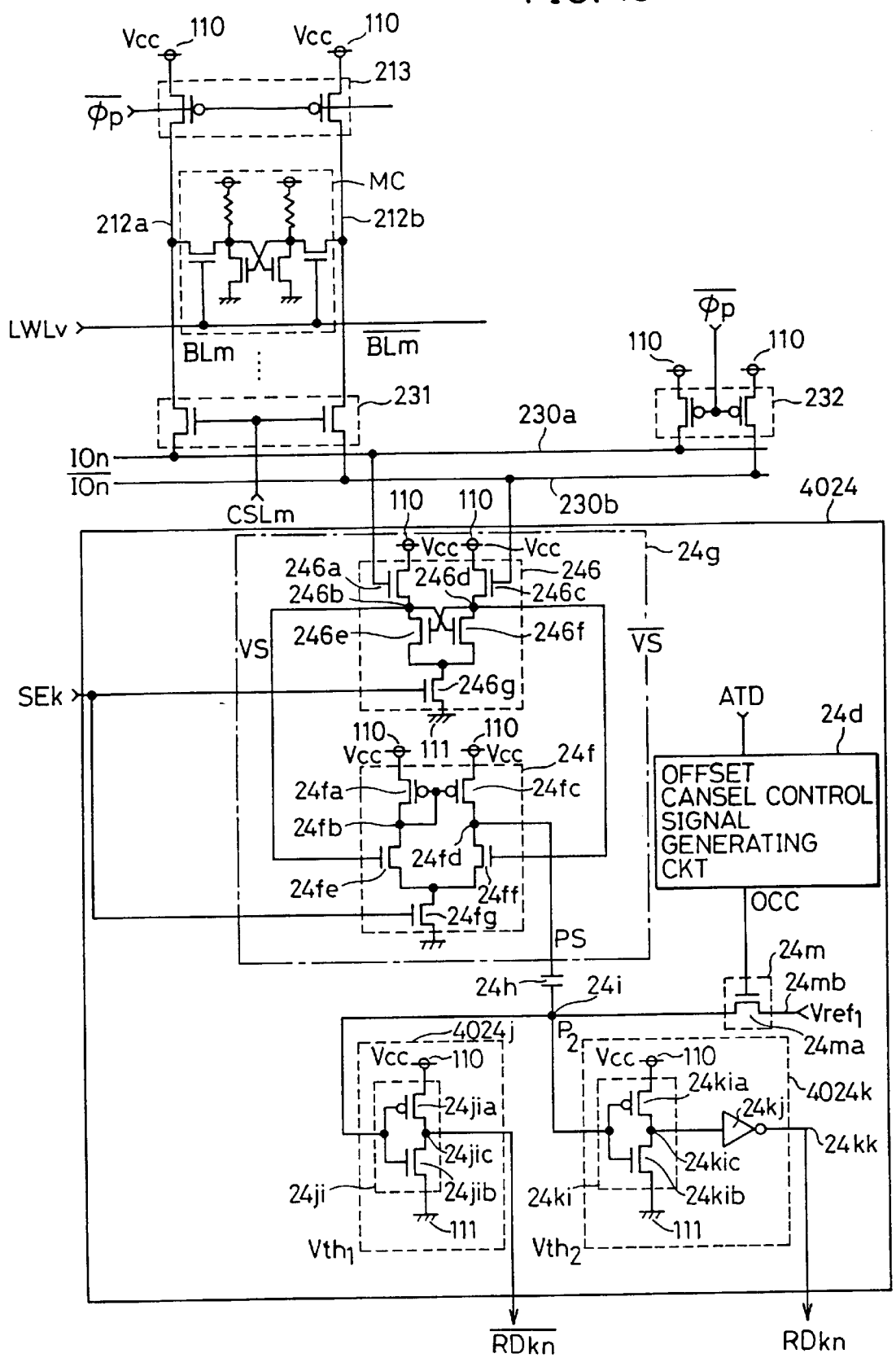
FIG. 18 is a circuit diagram showing a differential amplifier circuit and its peripheral circuitry of an SRAM in a fifth embodiment of the invention.

FIG. 18 is a circuit diagram showing a differential amplifier circuit 4024 and a peripheral circuitry of the fifth embodiment. First amplifier circuit 4024j of differential amplifier circuit 4024 includes an inverter 24ji, which is connected between an input node 24i and an amplified signal output node 24jic outputting amplified signal $\overline{RD}_{kn}$, receives potential $P_2$ of input node 24i, and supplies amplified signal $\overline{RD}_{kn}$ which attains the L-level when potential $P_2$ of input node 24i is higher than a certain threshold voltage $V_{th1}$, and attains the H-level when it is lower than threshold voltage $V_{th1}$. The threshold voltage $V_{th1}$ is lower than first reference potential $V_{ref1}$ (2.5 V) which is applied to input node 24i by offset cancel circuit 24m during precharging of I/O line pair 230. Inverter 24ji is formed of a p-channel MOS transistor 24jia, which is connected between power supply potential node 110 and amplified signal output node 24jic and has a gate electrode connected to input node 24i, and an n-channel MOS transistor 24jib, which is connected between amplified signal output node 24jic and ground potential node 111 and has a gate electrode connected to input node 24i.

Second amplifier circuit 4024k includes an inverter 24ki, which is connected between input node 24i and an amplified signal output node 24kk outputting amplified signal $RD_{kn}$ via inverter 24kj, receives potential $P_2$ of input node 24i, and supplies amplified signal $RD_{kn}$ which attains the L-level when potential $P_2$ of input node 24i is higher than a certain threshold voltage $V_{th2}$, and attains the H-level when it is lower than threshold voltage $V_{th2}$. Threshold voltage $V_{th2}$ is higher than first reference potential $V_{ref1}$ (2.5 V) which is applied to input node 24i by offset cancel circuit 24m during precharging of I/O line pair 230. Inverter 24ki is formed of a p-channel MOS transistor 24kia, which is connected between power supply potential node 110 and output node 24kic and has a gate electrode connected to input node 24i, and an n-channel MOS transistor 24kib, which is connected between output node 24kic and ground potential node 111 and has a gate electrode connected to input node 24i.

Threshold voltages $V_{th1}$ and $V_{th2}$ of inverters 24ji and 24ki depend on channel lengths of transistors forming inverters 24ji and 24ki, respectively. The channel length of n-channel MOS transistor 24jib is shorter than the channel length of n-channel MOS transistor 24kib. The channel length of p-channel MOS transistor 24jia is longer than the channel length of n-channel MOS transistor 24kia.

When input node 24i receives first reference potential $V_{ref1}$ (2.5 V), a through current may flow from power supply potential node 110 to ground potential node 111 via p-channel MOS transistor 24jia and n-channel MOS transistor 24jib, and a through current may flow from power supply potential node 110 to ground potential node 111 via p-channel MOS transistor 24kia and n-channel MOS transistor 24kib. In order to reduce these through currents, these transistors have channel widths smaller than those of transistors forming current mirror sense amplifier 24f, and thus have a reduced ratio between the channel width and the channel length.

This fifth embodiment operates substantially similarly to the first embodiment, of which operation is shown in the timing chart of FIG. 12. Differential amplifier circuit 4024 having a circuit structure different from that of the first embodiment operates similarly to differential amplifier circuit 3024 of the fourth embodiment, of which operation is shown in the timing chart of FIG. 17.

As described above, the computer of the fifth embodiment achieves the following effect, in addition to the effect by the computers and SRAMs of the first to fourth embodiments. According to the fifth embodiment, first and second amplifier circuits 4024j and 4024k in differential amplifier circuit 4024 are provided with inverters 24ji and 24ki having threshold voltages $V_{th1}$ (2.4 V) and $Vth_2$ (2.6 V). Threshold voltage $V_{th1}$ is lower by about 100 mV than first reference potential $V_{ref1}$ (2.5 V) applied to input node 24i during precharging of I/O line pair 230. Second threshold voltage $V_{th2}$ is higher by about 100 mV than first reference potential $V_{th1}$ (2.5 V). During precharging, sub-output fixing signal $SOA_{kn}$ surely attains the L-level. Further, the circuitry can be formed of elements which are smaller in number than those of first and second amplifier circuits 24j and 24k formed of the current mirror sense amplifiers in the fourth embodiment. Since a circuit for generating second and third reference potentials $V_{ref2}$ and $V_{ref3}$ is not required, a layout area of the fifth embodiment can be smaller than that of the fourth embodiment.

Since transistors forming inverters 24ji and 24ki have the channel widths smaller than those of the transistors forming the current mirror sense amplifier 24f, and hence have a reduced ratio between the channel width and channel length, the through current can be reduced, and a power consumption can be reduced.

Sixth Embodiment

A sixth embodiment of the invention will be described below with reference to FIGS. 19 to 26. Similarly to the first embodiment, the sixth embodiment relates to an asynchronous computer having an interface not utilizing a fixed frequency. This sixth embodiment is an improvement for allowing an asynchronous computer to use 4-cycle signaling, which is disclosed in "INTRODUCTION TO VLSI SYSTEMS" (Addison Wesley, by Caryer Mead and Lynn Conway), Chapter 7.7, pp. 252–254.

Figure 19:
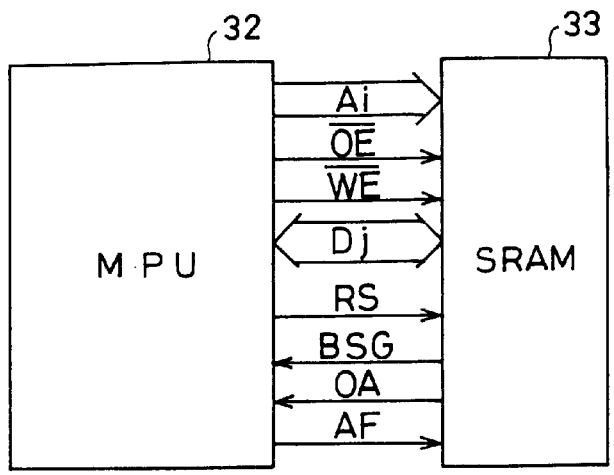
FIG. 19 is a block diagram showing a computer of a sixth embodiment of the invention.

FIG. 19 shows the computer of the sixth embodiment. An MPU 32, which is an example of processing means in this embodiment, produces address signals $A_i$ (i=0, 1, . . . , 16), output enable signal $\overline{OE}$ for reading data $D_j$ (j=0, 1, . . . , 7) from SRAM 33, and write enable signal $\overline{WE}$ for writing data $D_j$ into SRAM 33, and applies them to SRAM 33.

When data $D_j$ is to be read from SRAM 33, MPU 32 sets output enable signal $\overline{OE}$ and write enable signal $\overline{WE}$ to the L-level and the H-level, respectively, and applies intended address signal $A_i$ to SRAM 33. At the same time, MPU 32 raises operation request signal RS, which is supplied to the operation request signal input terminal of SRAM 33, from the L-level to the H-level. When data output fixing signal OA supplied from the output fixing signal output terminal of SRAM 33 attains the H-level, MPU 32 latches supplied data $D_j$ for taking in and processing the same. In this operation, MPU 32 accesses SRAM 33 without utilizing the clock signal.

MPU 32 does not raise operation request signal RS from the L-level to the H-level when busy signal BSG supplied from the busy signal output terminal of SRAM 33 is at the H-level. MPU 32 receives data output fixing signal OA at the H-level and raises a data reception completion signal AF from the L-level to the H-level for indicating the fact that it starts to latch supplied data $D_j$ for taking in and processing the same.

When writing data into SRAM 33, MPU 32 sets output enable signal $\overline{OE}$ and write enable signal $\overline{WE}$ to the H-level and the L-level, respectively, supplies write data $D_j$ and intended address signal $A_i$ to SRAM 11, and changes operation request signal RS from the L-level to the H-level.

SRAM 33 is an example of the memory means and semiconductor memory device of the invention, and receives address signal $A_i$, output enable signal $\overline{OE}$ and write enable signal $\overline{WE}$ from MPU 32. SRAM 33 supplies busy signal BSG to busy signal output terminal. Busy signal BSG thus supplied changes from the L-level to the H-level when output enable signal $\overline{OE}$ is at the L-level, write enable signal $\overline{WE}$ is at the H-level, and operation request signal RS supplied to the operation request signal input terminal changes from the L-level to the H-level. Further, SRAM 33 outputs data $D_j$ from the memory cell selected by address signal $A_i$ applied through address input terminal, and outputs data output fixing signal OA which attains the H-level when data $D_j$ has settled. When data reception completion signal AF applied to data reception completion signal input terminal changes from the L-level to the H-level, SRAM 33 changes busy signal BSG from the H-level to the L-level, sets data output fixing signal OA to the L-level, and sets output data $D_j$ to the high impedance state.

When output enable signal $\overline{OE}$ is at the H-level, write enable signal $\overline{WE}$ is at the L-level, and data request signal RS changes from the L-level to the H-level, data $D_j$ in written into the memory cell selected by address signal $A_i$.

Figure 20:
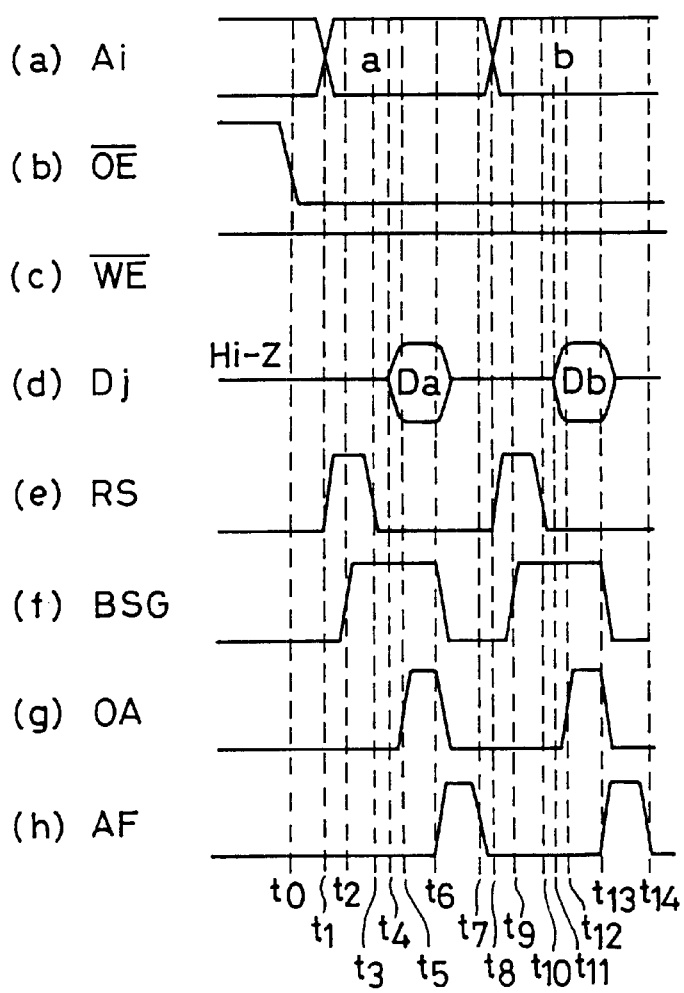
FIG. 20 is a timing chart showing an operation of the computer of the sixth embodiment of the invention.

FIG. 20 shows operation of the computer shown in FIG. 19 for reading data D from SRAM 33 to MPU 32 under conditions better than the worst conditions of a high temperature and a low power supply voltage.

While write enable signal $\overline{WE}$ supplied from MPU 32 is kept at the H-level as shown at (c) in FIG. 20, output enable signal $\overline{OE}$ is lowered to the L-level at time $t_0$ as shown at (b) in FIG. 20, an intended address signal $A_i$ (=a) is applied at time $t_1$ as shown at (a) in FIG. 20, and operation request signal RS is raised from the L-level to the H-level as shown at (e) in FIG. 20. In response, busy signal BSG supplied from SRAM 33 rises from the L-level to the H-level at time $t_2$ as shown at (f) in FIG. 20 so as to prevent the supply of a next operation request. In response, MPU 32 sets operation request signal RS to the L-level at time $t_3$ as shown at (e) in FIG. 20, and thereafter, prevents change of operation request signal RS from the L-level to the H-level while busy signal BSG is at the H-level.

Data $D_j$ (=Da) starts to be output from the memory cell selected by address signal $A_i$ at time $t_4$ as shown at (d) in FIG. 20. In accordance with this, data output fixing signal OA rises to the H-level to indicate fixing of data $D_j$ at time $t_5$ as shown at (g) in FIG. 20. In response, MPU 32 latches and takes in data Dj for processing the same. Further, MPU 32 raises data reception completion signal AF from the L-level to the H-level at time $t_6$ as shown at (h) in FIG. 20 for indicating the fact that it starts to latch and take in data $D_j$ for processing the same. In response, busy signal BSG and data output fixing signal OA supplied from SRAM 33 fall to the L-level as shown at (f) and (g) in FIG. 20. Output data $D_j$ attains the high impedance state for the next operation request as shown at (d) in FIG. 20.

Data reception completion signal AF falls to the L-level at time $t_7$ as shown at (h) in FIG. 20. Then, address signal $A_i$ (=b) is applied to SRAM 33 at time $t_8$ as shown at (a) in FIG. 20, and operation request signal RS rises from the L-level to the H-level. Thereby, MPU 32 and SRAM 33 perform the operations similar to those from time $t_1$ to time $t_7$, and SRAM 33 supplies data $D_j$ (=$D_b$) corresponding to address signal $A_i$ (=b) to MPU 32.

Figure 21B:
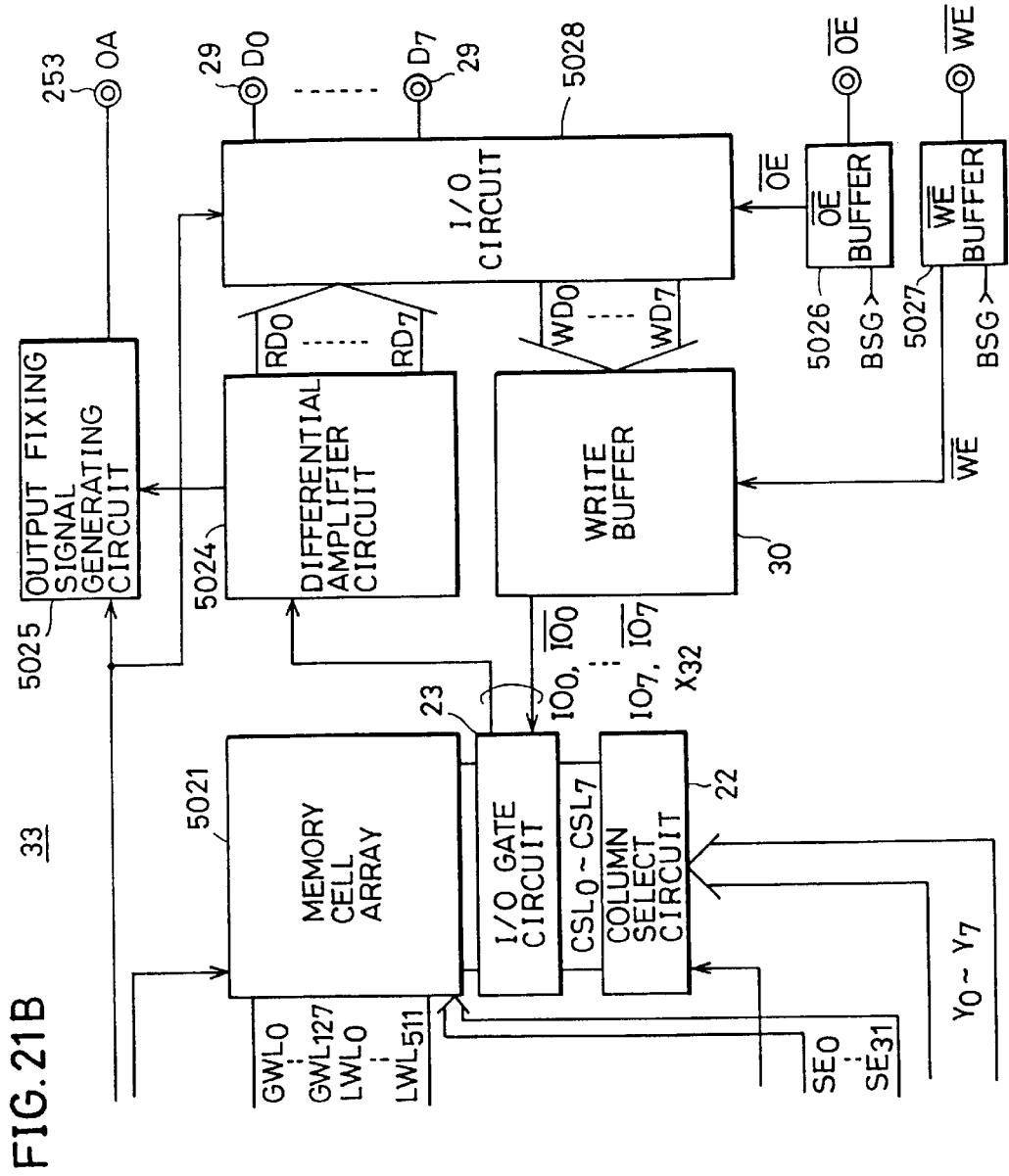

Now, structure of SRAM of the sixth embodiment shown in FIG. 19 will be described below with reference to FIGS. 21 to 25. FIG. 21 is a block diagram of SRAM 33. SRAM 33 differs from SRAM 11 of the first embodiment shown in FIGS. 6A and 6B in that SRAM 33 additionally includes a data reception completion signal input terminal 34a for receiving data reception completion signal AF, an operation request signal input terminal 34b for receiving operation request signal RS, and a busy signal output terminal 34c for outputting busy signal BSG, and that it includes a busy signal generating circuit 35, which is responsive to operation request signal RS and data reception completion signal AF to output busy signal BSG, which rises from the L-level to the H-level when data reception completion signal AF is at the L-level and operation request signal RS rises from the L-level to the H-level, and attains the L-level when data reception completion signal AF is at the H-level.

SRAM 33 in the sixth embodiment differs from SRAM 33 in the first embodiment in that SRAM 33 in the sixth embodiment is not provided with address buffer 12, block select signal generating circuit 16, memory cell array 21, output fixing signal generating circuit 25, I/O circuit 28, $\overline{OE}$ buffer 26 and $\overline{WE}$ buffer 27 in the first embodiment, and instead, is provided with address buffer 5012, block select signal generating circuit 5016, memory cell array 5021, output fixing signal generating circuit 5025, I/O circuit 5028, $\overline{OE}$ buffer 5026 and $\overline{WE}$ buffer 5027.

In SRAM 33 of the sixth embodiment, block select signal generating circuit 5016 receives busy signal BSG from busy signal generating circuit 35, and generates block select signals $BS_0$–$BS_{31}$, one of which attains the H-level in accordance with predecode signals $Z_0$–$Z_{11}$ sent from a Z-predecoder 14 when busy signal BSG is at the H-level, similarly to block select signal generating circuit 16 in SRAM 11 of the first embodiment. Block select signal generating circuit 5016 deactivates all 32 block select signals $BS_0$–$BS_{31}$ when busy signal BSG is at the L-level.

SRAM 33 of the sixth embodiment does not include address change detecting circuit 19 and precharge signal generating circuit 20 for generating precharge signal $\overline{\phi}_p$, which are provided at SRAM 11 of the first embodiment. Instead of precharge signal $\overline{\phi}_p$, SRAM 33 receives busy signal BSG for performing the precharging.

Address buffer 5012 has such a new function that it receives busy signal BSG, and latches address signal $A_i$ when busy signal BSG attains the H-level. Output fixing signal generating circuit 5025 has such a new function that it receives data reception completion signal AF, and sets data output fixing signal OA to the L-level when data reception completion signal AF is at the H-level. I/O circuit 5028 has such a new function that it receives data reception completion signal AF and sets output data $D_j$ to the high impedance state when data reception completion signal AF is at the H-level. $\overline{OE}$ buffer 5026 and $\overline{WE}$ buffer 5027 have such new functions that they receive output enable signal $\overline{OE}$ and write enable signal $\overline{WE}$, and latch them when busy signal BSG attains the H-level, respectively.

Figure 22:
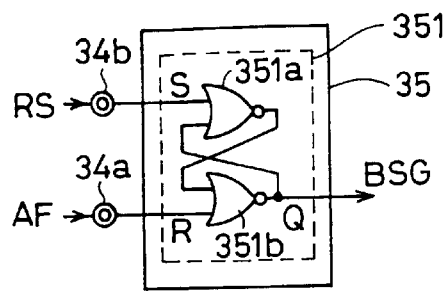
FIG. 22 is a circuit diagram showing a busy signal generating circuit of the SRAM in the sixth embodiment of the invention.

FIG. 22 is a circuit diagram of busy signal generating circuit 35. Referring to FIG. 22, busy signal generating circuit 35 includes an R-S flip-flop circuit 351 having a set input (S) connected to operation request signal input terminal 34b receiving operation request signal RS, a reset input (R) connected to data reception completion signal input terminal 34a receiving data reception completion signal, and an output side (Q) outputting busy signal BSG. R-S flip-flop circuit 351 is formed of two NOR circuits 351a and 351b each having inputs, one of which is connected to an output of the other NOR circuit 351b or 351a, and the other of which is connected to operation request signal input terminal 34b or data reception completion signal input terminal 34a. In R-S flip-flop circuit 351, when reset input (R) is at the L-level, and set input (S) rises from the L-level to the H-level, output (Q) is set (i.e., rises to the H-level). When reset input (R) is at the H-level, output (Q) is reset (i.e., falls to the L-level) regardless of the level of set input (S).

Figure 23:
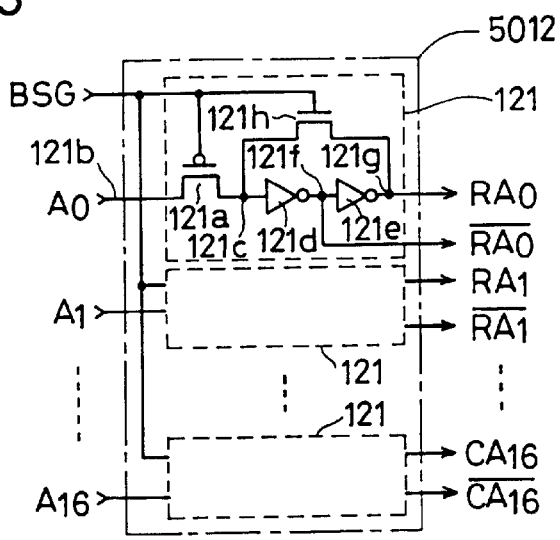
FIG. 23 is a circuit diagram showing an address buffer of the SRAM in the sixth embodiment of the invention.

FIG. 23 is a circuit diagram showing address buffer 5012 in SRAM 33. Referring to FIG. 23, address buffer 5012 includes partial address buffers 121, which receive address signals $A_i$ (i=0, 1, ..., 16) and busy signal BSG, and supply signals RAi (or BAi, CAi) of the same logic as address signal $A_i$ and their inverted signals $\overline{RAi}$ (or $\overline{BAi}$, $\overline{CAi}$) when busy signal BSG is at the L-level. When busy signal BSG is at the H-level, partial address buffers 121 latch the address signal $A_i$ (i=0, 1, ..., 16), and hold output signals RAi (BAi, CAi) and $\overline{RAi}$ (or $\overline{BAi}$, CAi).

Each partial address buffer 121 includes a p-channel MOS transistor 121a connected between a node 121b receiving the address signal and a node 121c, and receiving busy signal BSG on its gate electrode, an inverter 121d connected between node 121c and a node 121f outputting output signal $\overline{RAi}$ (or $\overline{BAi}$, $\overline{CAi}$), an inverter 121e connected between node 121f and a node 121g outputting output signal RAi (or $BA_i$, CAi), and an n-channel MOS transistor 121h connected between nodes 121c and 121g, and receiving busy signal on its gate electrode.

Figure 24:
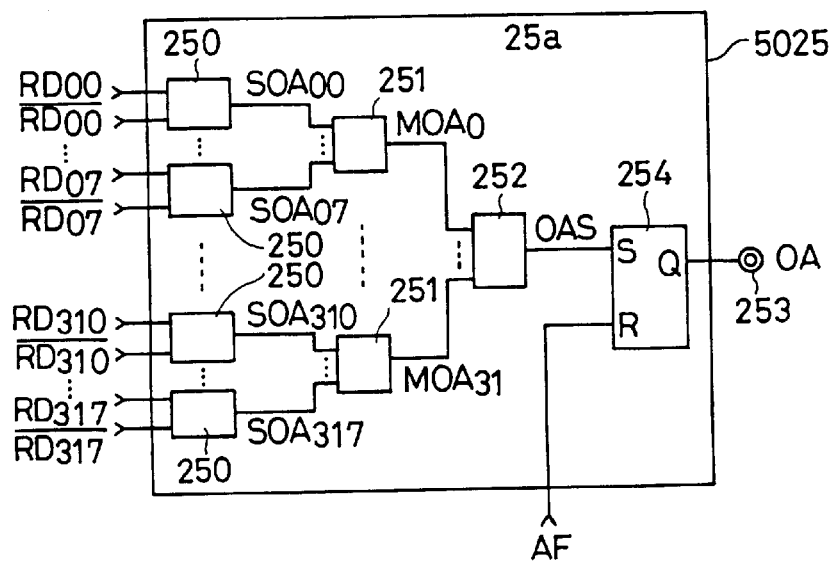
FIG. 24 is a circuit diagram showing an output fixing signal generating circuit of the SRAM in the sixth embodiment of the invention.
Figure 25:
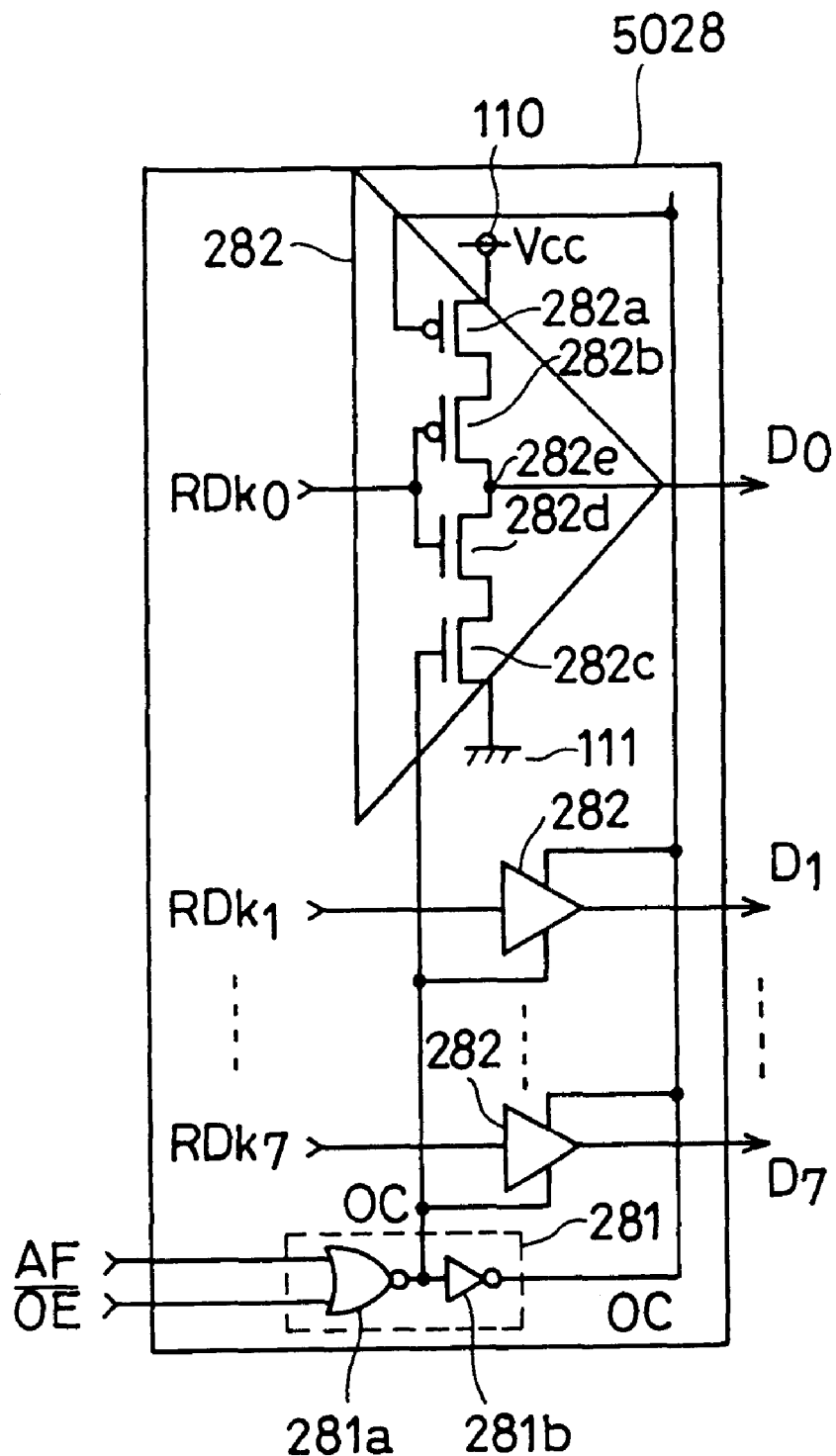
FIG. 25 is a circuit diagram showing an output portion of an input/output circuit of the SRAM in the sixth embodiment of the invention.

FIG. 24 is a block diagram showing output fixing signal generating circuit 5025 in SRAM 33. Referring to FIG. 25, output fixing signal generating circuit 5025 includes sub-output fixing signal generating circuits 250, array output fixing signal generating circuits 251 and data output fixing set signal generating circuit 252, which have the same circuit structures as sub-output fixing signal generating circuits 250, array output fixing signal generating circuits 251 and data output fixing set signal generating circuit 252 of output fixing signal generating circuit 25 in the first embodiment.

Output fixing signal generating circuit 5025 further includes an R-S flip-flop circuit 254 which has a set input side (S) receiving a data output fixing set signal OAS from data output fixing set signal generating circuit 252, a reset input side (R) receiving data reception completion signal AF and an output side (Q) outputting data output fixing signal OA. Data output fixing set signal generating circuit 252 and R-S flip-flop circuit 254 form the data output fixing signal generating circuit.

FIG. 25 shows an output portion of I/O circuit 5028 in SRAM 33. Referring to FIG. 25, I/O circuit 5028 includes an output control circuit 281 receiving data reception completion signal AF and output enable signal $\overline{OE}$, and producing an output control signal OC and its inverted signal $\overline{OC}$. Output control signal OC attains the H-level, when both received signals AF and $\overline{OE}$ are at the L-level, and otherwise attains the L-level. Output control circuit 281 is formed of an NOR circuit 281a receiving data reception completion signal AF and output enable signal $\overline{OE}$ on its input side and supplying output control signal OC from its output side, and an inverter 281b receiving output control signal OC from NOR circuit 281a and supplying inverted signal $\overline{OC}$.

I/O circuit 5028 further includes tristate buffers 282, which receive data $RD_{k0}, \ldots, RD_{k7}$ sent from memory cells selected by the address signal and output control signals OC and $\overline{OC}$ sent from output control circuit 281, and supply data $D_0, D_1, \ldots, D_7$, which are formed by inverting logic of $RD_{k0}, \ldots, RDk_7$ when output control signal OC is at the H-level and signal $\overline{OC}$ is at the L-level, and are at the high impedance state when output control signal OC is at the L-level and $\overline{OC}$ is at the H-level.

Tristate buffer 282 is formed of a p-channel MOS transistor 282a receiving output control signal $\overline{OC}$ on its gate electrode, a p-channel MOS transistor 282b, which is connected between a drain electrode of p-channel MOS transistor 282a and a data output node 282c outputting data $D_j$, and receives on its gate electrode data $RD_{kj}$ sent from the memory cell selected by the address signal, an n-channel MOS transistor 282c having a source electrode connected to ground potential node 111 and receiving output control signal OC on its gate electrode, and an n-channel MOS transistor 282d connected between a drain electrode of n-channel MOS transistor 282c and an output node 282e, and receiving data $RD_{kj}$ on its gate.

Operation of SRAM 33 of the sixth embodiment thus constructed will be described below with reference to FIG. 26 as well as FIGS. 9A–9D. While externally applied write enable signal $\overline{WE}$ is kept at the H-level, and output enable signal $\overline{OE}$ is kept at the L-level, data reception completion signal AF is lowered to the L-level at time $t_0$ as shown at (c) in FIG. 26. Output control signal OC supplied from output control circuit 281 in I/O circuit 5028 attains the H-level which enables data output as shown at (j) in FIG. 26. At this time, busy signal BSG remains at the L-level as shown at (c) in FIG. 26.

Bit line precharge circuit 213 and I/O line precharge circuit 232 receiving this busy signal BSG precharge bit line pair 212 and I/O line pair 230 to power supply potential $V_{cc}$. All block select signals $BS_k$ supplied from block select signal generating circuit 16 attain the L-level. Row sub-decode circuit 17 receiving block select signals $BS_k$ sets all row sub-decode signals $V_{k0}$–$V_{k3}$ to the L-level, so that local row decoders 182 in row decoder 18 set potentials $LWL_v$ of all local word lines 211 to the L-level.

Figure 26:
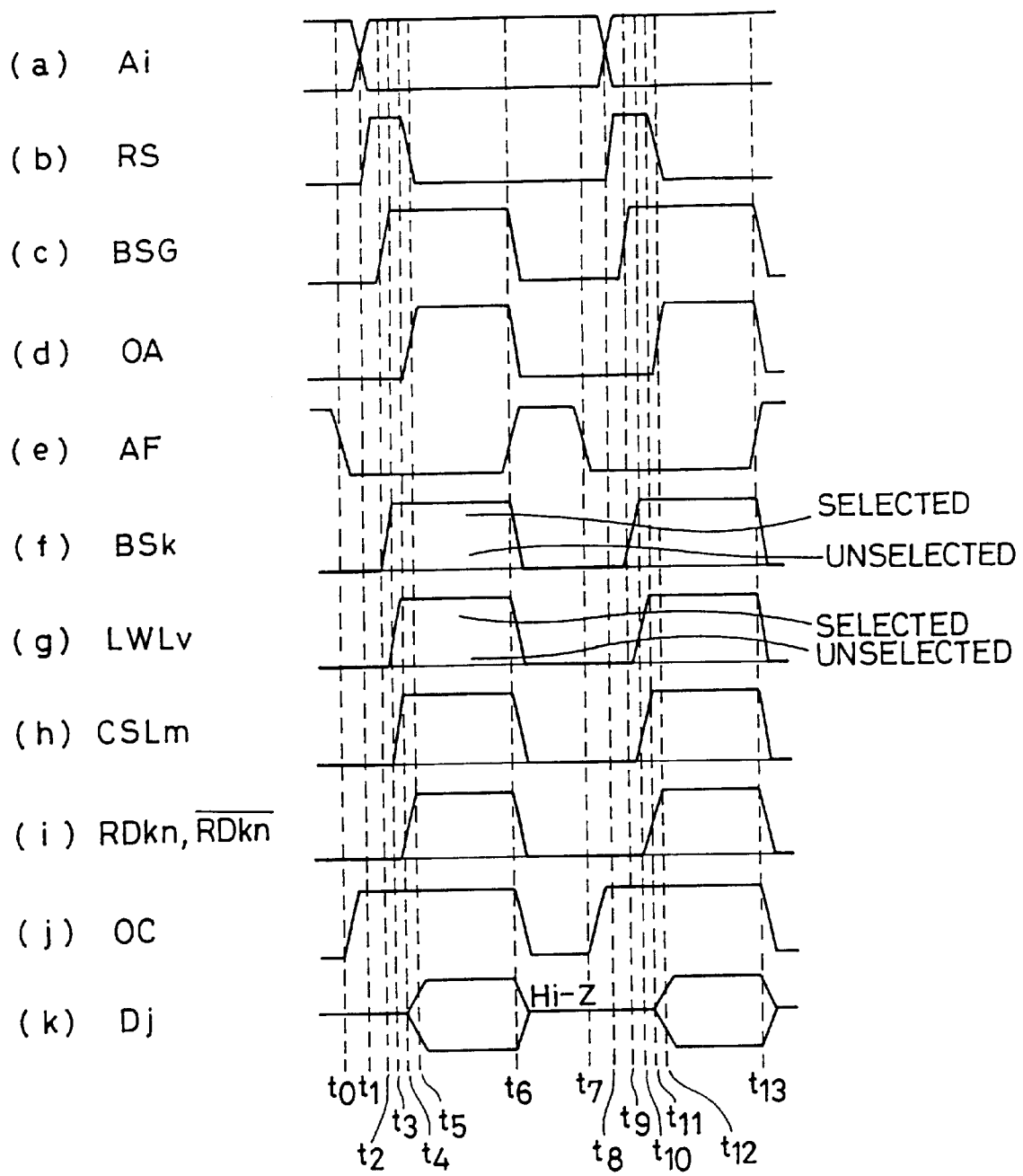
FIG. 26 is a timing chart showing an operation of the SRAM in the sixth embodiment of the invention.

Address signal $A_i$ is set to an intended address at time $t_1$ as shown at (a) in FIG. 26, so that operation request signal RS is changed from the L-level to the H-level. Busy signal BSG supplied from busy signal generating circuit 35 rises from the L-level to the H-level indicative of the fact that operation is being performed as shown at (c) in FIG. 26. In response to busy signal BSG, bit line precharge circuit 213 and I/O line precharge circuit 232 stop the precharging. Address buffer 5012 latches address signal $A_i$, and block select signal generating circuit 16 sets one of block select signals $BS_k$ selected by address signal $A_i$ to the H-level and sets other block select signals $BS_k$ to the L-level at time $t_2$ as shown at (f) in FIG. 26.

Potential $GWL_u$ of one global word line selected by global row decoder 181 is raised to the H-level. Local row decoder 182 corresponding to the block (memory array) selected by the block select signal raises potential $LWL_v$ of one local word line 211 to the H-level at time $t_3$ as shown at (g) in FIG. 26. One column select signal $CSL_m$ selected by column select circuit 22 corresponding to the selected block is raised to the H-level as shown at (h) in FIG. 26.

Thereby, the potentials corresponding to data stored in selected memory cell MC are transmitted to I/O line pair 230 via bit line pair 212 and I/O gate 231. At time $t_4$, amplified signals $RD_{kn}$ and $\overline{RD}_{kn}$ supplied from differential amplifier circuit 5024 receiving the above potentials attain the H- and L-level, or L- and H-level, respectively, as shown at (i) in FIG. 26. In response, I/O circuit 5028 supplies data $D_0$–$D_7$ corresponding to amplified signals $RD_{kn}$ and $\overline{RD}$ to I/O terminal 29 as shown at (k) in FIG. 26.

In response to the fact that amplified signals $RD_{kn}$ and $\overline{RD}_{kn}$ corresponding to the selected block attain one and the other of the H- and L-levels, respectively, sub-output fixing signal $SOA_{kn}$ supplied from sub-output fixing signal generating circuit 250 corresponding to the selected block attains the H-level. Array output fixing signal $MOA_k$, which is supplied from array output fixing signal generating circuit 251 receiving sub-output fixing signal $SOA_{kn}$ and corresponding to this block attains the H-level.

In response to array output fixing signals $MOA_0$–$MOA_{31}$ supplied from respective array output fixing signal generating circuits 251, data output fixing signal set signal generating circuit 252 supplies data output fixing set signal OAS. Data output fixing set signal OAS attains the H-level in response to the H-level of array output fixing signal $MOA_k$ corresponding to data supplied to I/O terminal 29. R-S flip-flop circuit 254 receives data output fixing set signal OAS on its set input side (S), and supplies to output fixing signal output terminal 253 data output fixing signal OA, which attains the H-level at time $t_5$ as shown at (d) in FIG. 26 to inform externally the fact that data output is fixed.

In response to rise of busy signal BSG to the H-level, externally applied operation request signal RS falls to the L-level as shown at (b) in FIG. 26 to allow the same to rise again to the H-level at time $t_8$. When data reception completion signal AF rises to the H-level at time $t_6$ as shown at (e) in FIG. 26, busy signal BSG supplied from busy signal generating circuit 35 receiving signal AF attains the L-level for waiting the next operation. Bit line precharge circuit 213 and I/O line precharge circuit 232 receiving busy signal BSG start precharging, and address buffer 5012 releases the latch of address signal $A_j$.

In response to rise of data reception completion signal AF to the H-level, R-S flip-flop circuit 254 in output fixing signal generating circuit 5025 resets data output fixing signal OA to the L-level as shown at (d) in FIG. 26. Output control signal OC supplied from output control circuit 281 in I/O circuit 5028 attains the L-level as shown at (j) in FIG. 26, and in response to this, data $D_j$ supplied from tristate buffer 282 attains the high impedance state (Hi-Z) as shown at (k) in FIG. 26.

Thereafter, data reception completion signal AF falls to the L-level at time $t_7$ as shown at (e) in FIG. 26, and next intended address signal $A_i$ is supplied at time $t_8$ as shown at (a) in FIG. 26. As shown at (b) in FIG. 26, operation request signal RS rises to the H-level. Thereby, outputting of data D in accordance with address signal $A_i$ is performed in a manner substantially similarly to that between time to to time $t_6$ already described.

In the computer of the sixth embodiment, as described above, SRAM 33 supplies data $D_0$–$D_7$ of memory cell corresponding to the address signal to data I/O terminal 29, and supplies data output fixing signal OA, which attains the H-level upon settling of output of data $D_0$–$D_7$, to output fixing signal output terminal 253 similarly to the first embodiment. MPU 32 receives data $D_0$–$D_7$ sent from data I/O terminal 29 of SRAM 33 and data output fixing signal OA from output fixing signal output terminal 253, and latches data $D_0$–$D_7$ for taking in and processing the same when data output fixing signal OA attains a predetermined level. Therefore, unless the computer is operated under the worst conditions of a high temperature and a low power supply voltage, the operation speed can be increased by suppressing a wasted wait time as compared with a conventional computer performing the operation in synchronization with the clock of a fixed frequency.

SRAM 33 in this sixth embodiment produces busy signal BSG externally indicating the fact that SRAM 33 is operating, so that operation request can be suppressed from being applied to SRAM 33 during operation.

When busy signal BSG attains the L-level, the bit line and I/O line are precharged, and busy signal BSG is set to the L-level for starting the precharging in response to the H-level of data reception completion signal AF. As compared with the case where the precharge starts upon input of the address signal, as is done in SRAM 11 of the first embodiment, precharging can be completed quickly, and thus data $D_j$ can be output quickly.

The sixth embodiment can also achieve the same effect as that by the first embodiment.

Seventh Embodiment

A seventh embodiment of the invention will be described below with reference to FIGS. 27A to 29.

Figure 27B:
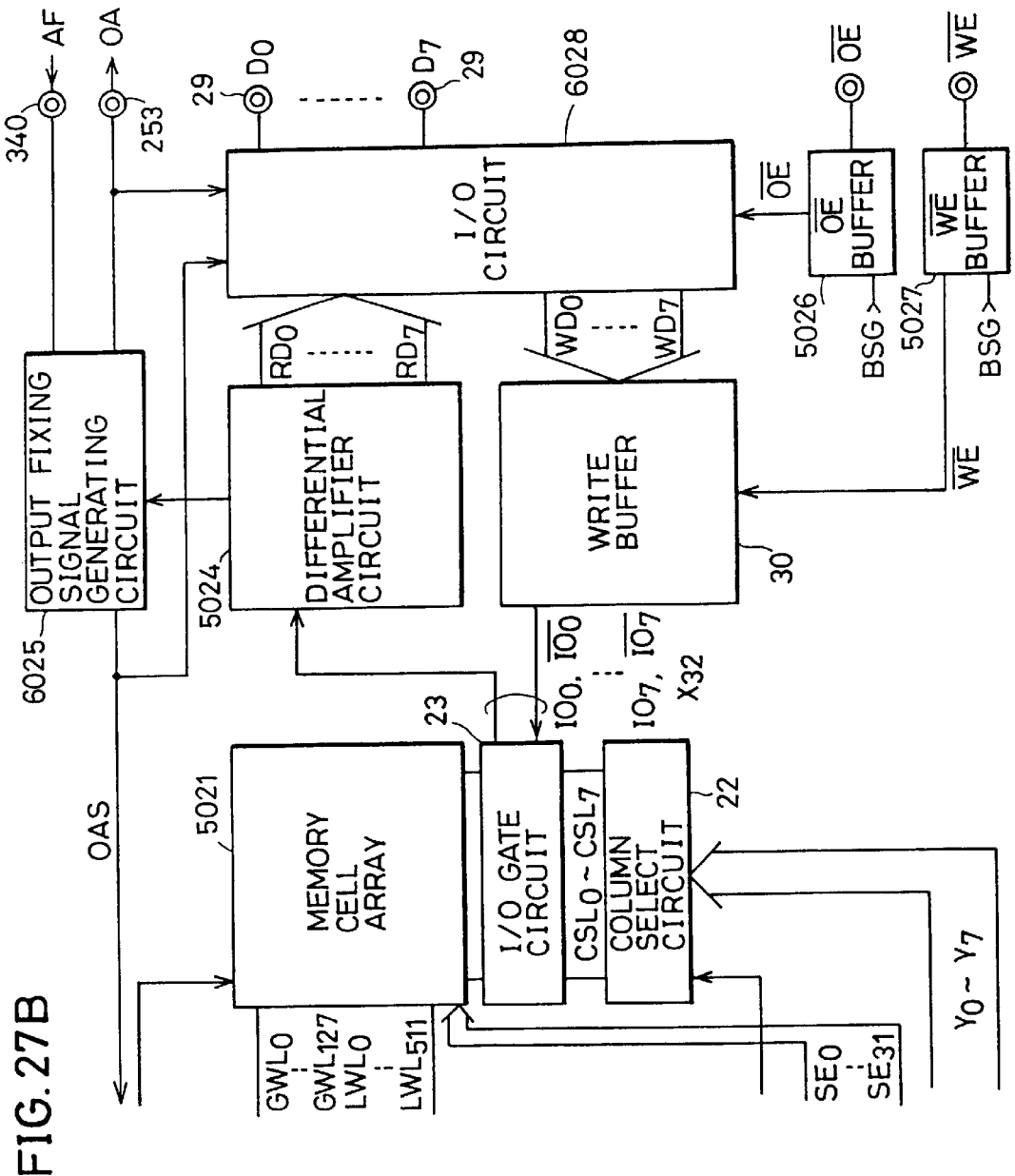

Referring to FIGS. 27A and 27B, an SRAM 6033 in this seventh embodiment differs from SRAM 33 of the sixth embodiment in that SRAM 6033 includes a busy signal generating circuit 6035, an output fixing signal generating circuit 6025 and I/O circuit 6028 instead of busy signal generating circuit 35, output fixing signal generating circuit 5025 and I/O circuit 5028 of SRAM 33.

Busy signal generating circuit 6035 receives operation request signal RS and output fixing signal set signal OAS from output fixing signal generating circuit 6025, and changes busy signal BSG from the L-level to the H-level when output fixing signal set signal OAS is at the L-level and operation request signal RS rises from the L-level to the H-level. When the data reception completion signal AF is at the H-level, busy signal generating circuit 6035 sets busy signal BSG to the L-level.

I/O circuit 6028 has such a new function that it receives data output fixing signal OA and data output fixing set signal OAS from output fixing signal generating circuit 6025, and sets output data $D_j$ to the high impedance state when data output fixing signal OA is at the H-level so as to take in data $RD_{kj}$ and hold output data $D_j$ in response to rise of data output fixing set signal OAS from the L-level to the H-level.

Figure 28:
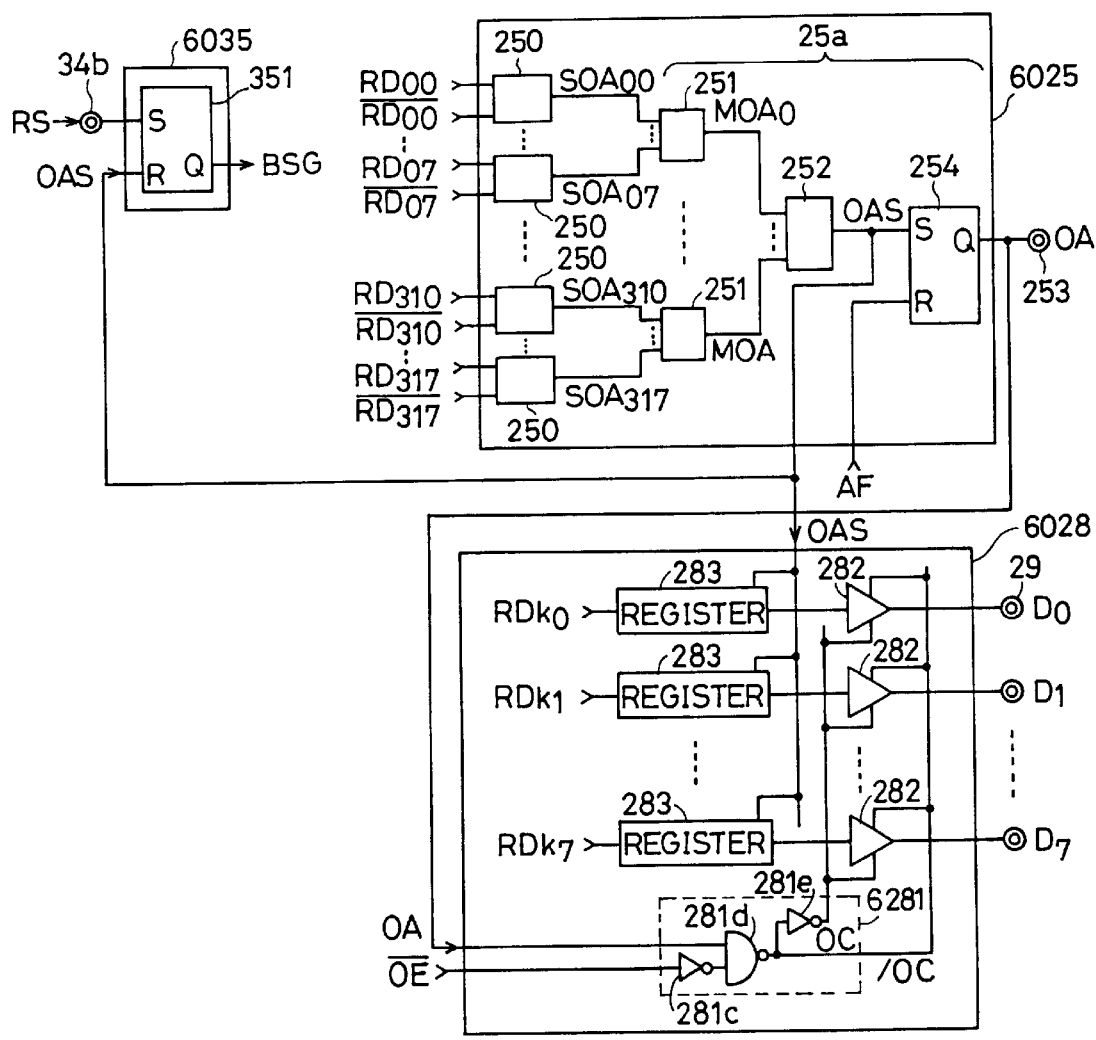
FIG. 28 is a circuit diagram showing a busy signal generating circuit, an output fixing signal generating circuit and an output portion of an input/output circuit of the SRAM in the seventh embodiment of the invention.

FIG. 28 is a circuit diagram showing busy signal generating circuit 6035, output fixing signal generating circuit 6025 and an output portion of I/O circuit 6028. As can be seen from FIG. 28, busy signal generating circuit 6035 has a circuit structure similar to that of busy signal generating circuit 35 of the sixth embodiment shown in FIG. 22. However, it differs from busy signal generating circuit 35 of the sixth embodiment in that reset input side (R) of R-S flip-flop circuit 351 receives data output fixing set signal OAS from output fixing signal generating circuit 5025.

I/O circuit 6028 includes, in addition to the structure of I/O circuit 5028 in FIG. 25, register circuits 283 which are arranged between nodes receiving data $RD_{kj}$ and tristate buffers 282. Each register circuit 283 receives data output fixing set signal OAS, and takes in data $RD_{kj}$ for holding output to tristate buffer 282 in response to rise of data output fixing set signal OAS from the L-level to the H-level.

Further, an output control circuit 6281 is provided instead of output control circuit 281 in FIG. 25. Output control circuit 6281 receives data output fixing signal OA from output fixing signal generating circuit 6025, which is different from output control circuit 281 receiving data reception completion signal AF shown in FIG. 25, and includes an inverter 281c receiving output enable signal $\overline{OE}$, an NAND circuit 281d receiving data output fixing signal OA and an output of inverter 281c, and supplying output control signal OC, and an inverter 281e receiving the output of NAND circuit 281d and supplying output control signal OC.

Operation of SRAM 6033 of the seventh embodiment thus constructed will be described below with reference to FIG. 29 as well as FIGS. 27A–28. While externally applied write enable signal $\overline{WE}$ is kept at the H-level, and output enable signal $\overline{OE}$ is kept at the L-level, data reception completion signal AF is lowered to the L-level at time $t_0$ as shown at (c) in FIG. 29. At this time, busy signal BSG remains at the L-level as shown at (c) in FIG. 29.

Bit line precharge circuit 213 and I/O line precharge circuit 232 receiving this busy signal BSG precharge bit line pair 212 and I/O line pair 230 to power supply potential $V_{cc}$. All block select signals $BS_k$ supplied from block select signal generating circuit 16 attain the L-level. Row sub-decode circuit 17 receiving block select signals $BS_k$ sets all row sub-decode signals $Vk_0$–$Vk_3$ to the L-level. Thereby, local row decoders 182 in row decoder 18 set potentials $LWL_v$ of all local word lines 211 to the L-level.

Figure 29:
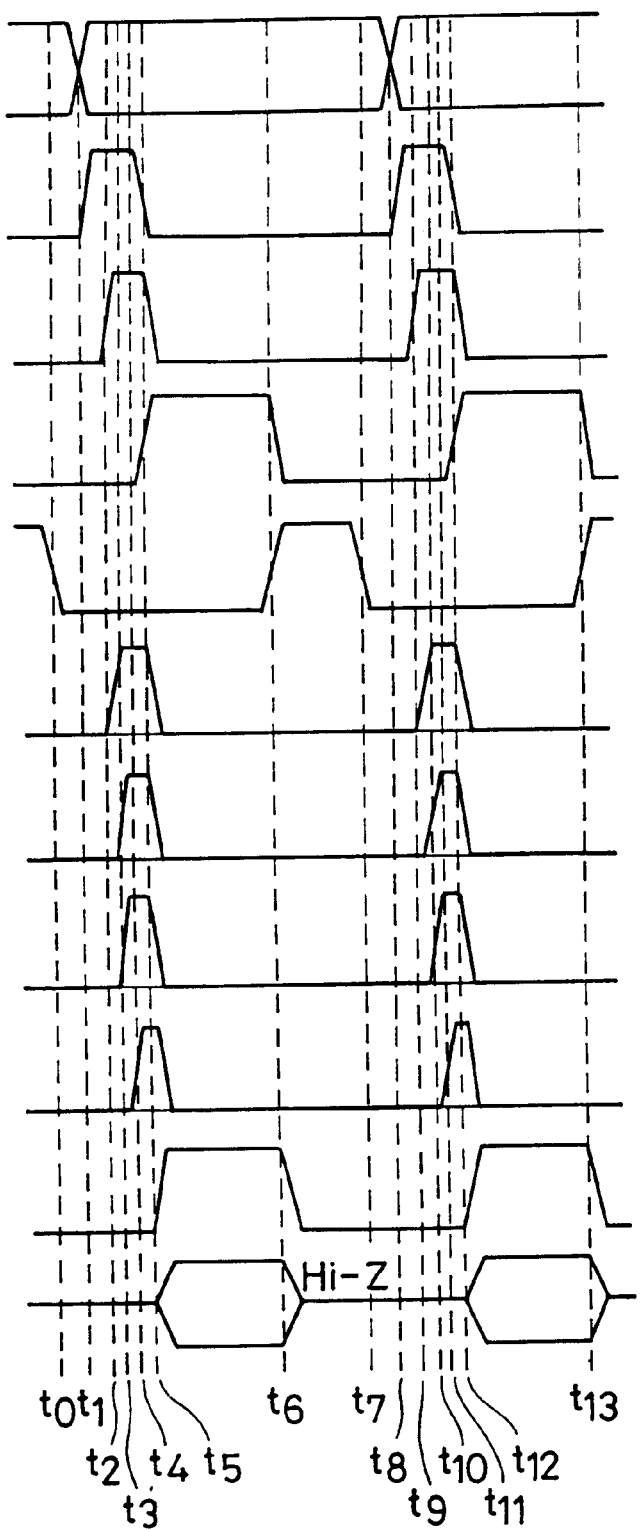
FIG. 29 is a timing chart showing an operation of the SRAM in the seventh embodiment of the invention.

Address signal $A_i$ is set to an intended address at time $t_1$ as shown at (a) in FIG. 29, so that operation request signal RS is changed from the L-level to the H-level. Busy signal BSG supplied from busy signal generating circuit 6035 rises from the L-level to the H-level indicative of the fact that operation is being performed as shown at (c) in FIG. 29. Bit line precharge circuit 213 and I/O line precharge circuit 232 receiving busy signal BSG stop the precharging. Address buffer 5012 latches address signal $A_i$. Block select signal generating circuit 5016 sets block select signal $BS_k$ selected by address signal $A_i$ to the H-level and sets other block select signals $BS_k$ to the L-level at time $t_2$ as shown at (f) in FIG. 29.

Potential $GWL_u$ of one global word line selected by global row decoder 181 is raised to the H-level. Local row decoder 182 corresponding to the block (memory array) selected by the block select signal raises potential $LWL_v$ of one local word line 211 to the H-level at time $t_3$ as shown at (g) in FIG. 29. One column select signal $CSL_m$ selected by column select circuit 22 corresponding to the selected block is raised to the H-level as shown at (h) in FIG. 29.

Thereby, the potentials corresponding to data stored in selected memory cell MC are transmitted to I/O line pair 230 via bit line pair 212 and I/O gate 231. At time $t_4$, amplified signals $RD_{kn}$ and $\overline{RD}_{kn}$ supplied from differential amplifier circuit 5024 receiving them attain the H- and L-level, or L- and H-level, respectively, as shown at (i) in FIG. 29. In response to the fact that amplified signals $RD_{kn}$ and $\overline{RD}_{kn}$ corresponding to the selected block attain one and the other of the H- and L-levels, respectively, sub-output fixing signal $SOA_{kn}$ supplied from sub-output fixing signal generating circuit 250 corresponding to the selected block attains the H-level. Array output fixing signal $MOA_k$, which is supplied from array output fixing signal generating circuit 251 receiving sub-output fixing signal $SOA_{kn}$ and corresponding to this block, attains the H-level.

In response to array output fixing signals $MOA_0$–$MOA_{31}$ supplied from respective array output fixing signal generating circuits 251, data output fixing signal set signal generating circuit 252 supplies data output fixing set signal OAS, which attains the H-level in response to the H-level of array output fixing signal $MOA_k$ corresponding to data supplied to I/O terminal 29. R-S flip-flop circuit 254 receives data output fixing signal OAS on its set input side (S), and supplies to output fixing signal output terminal 253 data output fixing signal OA, which attains the H-level at time $t_5$ as shown at (d) in FIG. 29 to inform externally the fact that data output has settled.

In response to rise from the L-level to the H-level of data output fixing set signal OAS supplied from output fixing signal generating circuit 6025, register circuits 283 in I/O circuit 6028 take in amplified signals $RD_{kj}$ and transmit the same to tristate buffers 282. In response to the H-level of data output fixing signal OA, output control circuit 6281 sets output control signal OC to the H-level substantially at $t_5$ as shown at (j) in FIG. 29. In response, tristate buffer 282 supplies to I/O terminal 29 data $D_0$–$D_7$ corresponding to amplified signals $RD_{kn}$ and $\overline{RD}_{kn}$ substantially at time $t_5$ as shown at (k) in FIG. 29.

In response to rise to the H-level of data output fixing set signal OAS supplied from output fixing signal generating circuit 6025, busy signal BSG supplied from busy signal generating circuit 6035 attains the L-level for waiting the next operation as shown at (c) in FIG. 29. In response to fall of busy signal BSG to the L-level, block select signal generating circuit 5016 sets all block select signals $BS_k$ to the L-level indicative of the inactive state as shown at (f) in FIG. 29. In response, all potentials $LWL_v$ of the local word lines and all column select signals $CSL_m$ are set to the L-level of the inactive state in all blocks (memory arrays).

In response to the L-level of busy signal BSG, bit line precharge circuit 213 and I/O line precharge circuit 232 start precharging. Thereby, all sub-output fixing signals $SOA_{kj}$ attain the L-level. Therefore, data output fixing set signal OAS attains the L-level. Owing to provision of R-S flip-flop circuit 254, data output fixing signal OA remains at the H-level as shown at (d) in FIG. 29. Owing to start of precharging, all amplified signals $RD_{kj}$ and $\overline{RD}_{kj}$ attain the L-level. However, output data $D_j$ is maintained as it was as shown at (k) in FIG. 29, because register circuit 283 in I/O circuit 6028 has held and sent last amplified signals $RD_{kj}$ and $\overline{RD}_{kj}$ to tristate buffer 282.

In response to rise of busy signal BSG to the H-level, externally applied operation request signal RS falls to the L-level as shown at (b) in FIG. 29 to allow the same to rise again to the H-level at time $t_8$. Data reception completion signal AF rises to the H-level at time $t_6$ as shown at (c) in FIG. 29. R-S flip-flop 254 in output fixing signal generating circuit 6025 resets data output fixing signal OA to the L-level as shown at (d) in FIG. 29. In response to output fixing signal OA, output control signal OC supplied from output control circuit 6281 in I/O circuit 6028 attains the L-level as shown at (j) in FIG. 29. In response, data $D_j$ supplied from tristate buffer 282 attains the high impedance state (Hi-Z) as shown at (k) in FIG. 29.

Thereafter, data reception completion signal AF falls to the L-level at time $t_7$ as shown at (e) in FIG. 29. Next intended address signal $A_i$ is supplied at time $t_8$ as shown at (a) in FIG. 29. As shown at (b) in FIG. 29, operation request signal RS rises to the H-level, whereby outputting of data $D_j$ in accordance with address signal $A_i$ is performed in a manner substantially similarly to that between time to to time $t_6$ already described.

In the computer of the seventh embodiment, as described above, SRAM 6033 supplies data $D_0$–$D_7$ of memory cells corresponding to the address signal to data I/O terminal 29, and data output fixing signal OA, which attains the H-level upon fixing of output of data $D_0$–$D_7$, to output fixing signal output terminal 253 similarly to the sixth embodiment. MPU 32 receives data $D_0$–$D_7$ sent from data I/O terminal 29 of SRAM 6033 and data output fixing signal OA sent from output fixing signal output terminal 253, and latches and takes in data $D_0$–$D_7$ for processing the same when data output fixing signal OA attains a predetermined level. Therefore, unless the computer is operated under the worst conditions of a high temperature and a low power supply voltage, the operation speed can be increased by suppressing a wasted wait time, as compared with a conventional computer performing the operation in synchronization with the clock of a fixed frequency.

Similarly to SRAM 33 in the sixth embodiment, SRAM 6033 in this seventh embodiment produces busy signal BSG externally indicating the fact that SRAM 6033 is operating. Therefore, operation request can be suppressed from being applied to SRAM 6033 during operation.

When busy signal BSG attains the L-level, bit lines and I/O lines are precharged. When data output fixing set signal OAS attains the H-level indicative of fixing of output data $D_j$, busy signal BSG is set to the L-level, which indicates the fact that next operation is being waited, for starting the precharging. As compared with the case where the precharge starts upon input of the address signal, as is done in SRAM 11 of the first embodiment, precharging can be completed quickly, and thus data $D_j$ can be output quickly. Further, SRAM 6033 can complete precharging more quickly than the sixth embodiment in which precharging is started by setting busy signal BSG to the L-level in response to data reception completion signal AF, and hence data $D_j$ can be output further quickly.

I/O circuit 6028 takes in data $RD_{kj}$ from the selected memory cell in response to the rise of data output fixing set signal OAS, and continues to hold output data $D_j$. Even when precharging can be started immediately after fixing of output data $D_j$, output data $D_j$ continues to be held, and data output can be surely performed. Further, reception of next operation request and next reading can be started during outputting of output data $D_j$, so that throughput is improved.

Further, the seventh embodiment can also achieve the same effect as that by the first embodiment.

Eighth Embodiment

Figure 30:
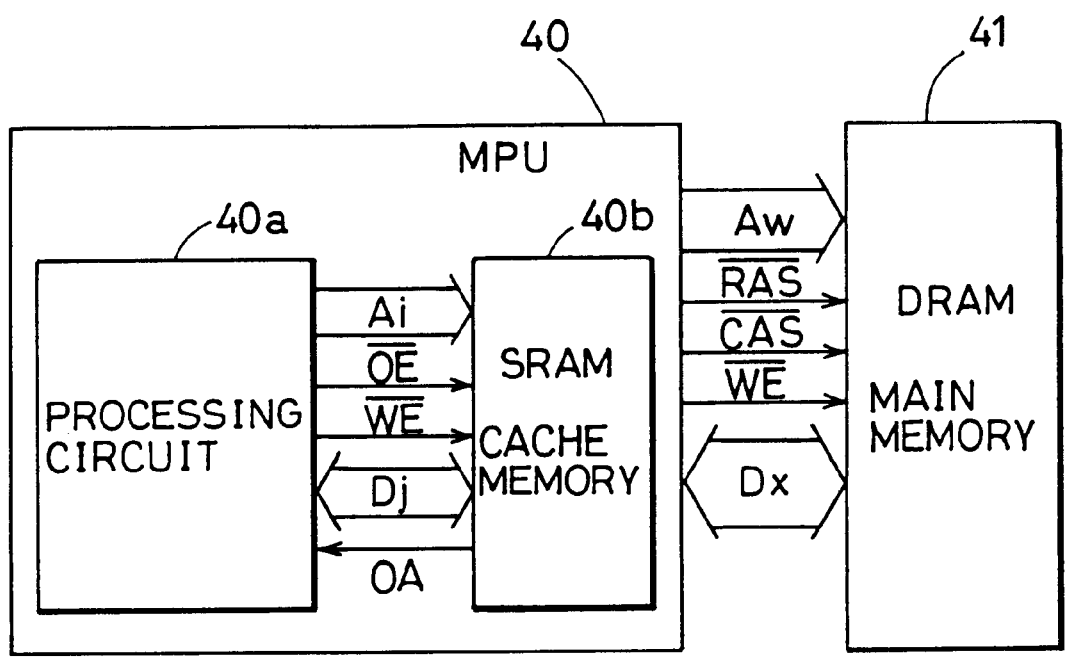
FIG. 30 is a block diagram of a computer system of an eighth embodiment of the invention.

A computer system of an eighth embodiment will be described below with reference to FIG. 30. Referring to FIG. 30, a computer system includes an MPU 40, which is an example of the computer of the invention, and specifically is a computer corresponding to that of the first embodiment shown in FIG. 4 but constructed in one-chip.

Figure 1:
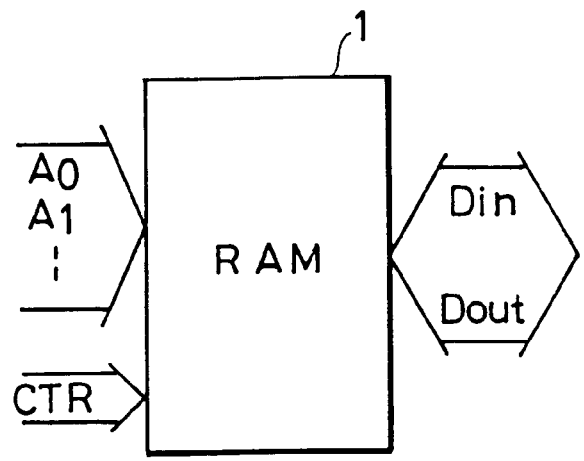
FIG. 1 is a block diagram showing a conventional RAM.
Figure 2:
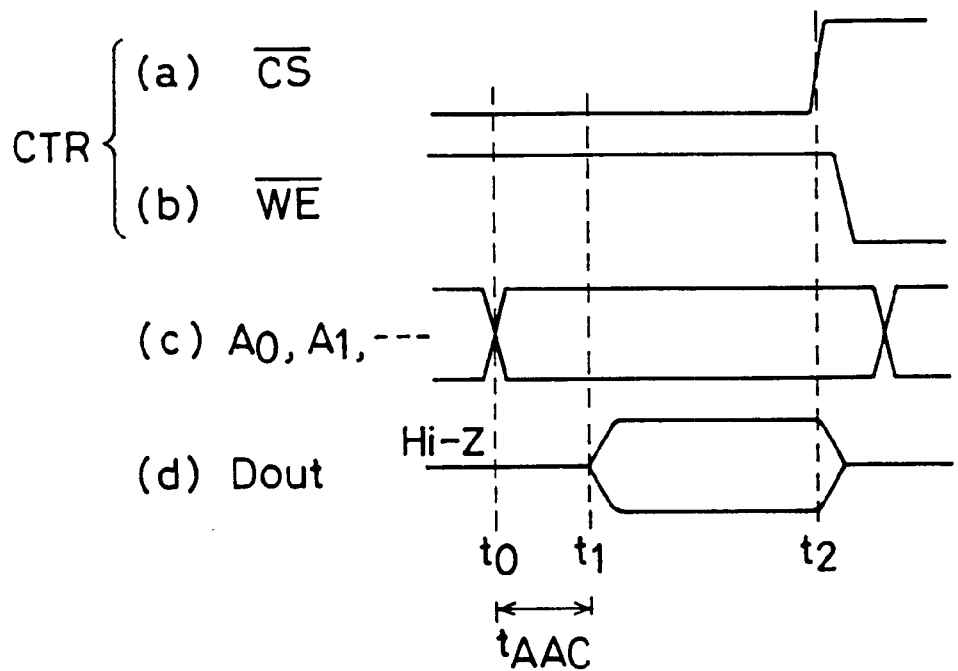
FIG. 2 is a timing chart showing an operation of a conventional SRAM.
Figure 3:
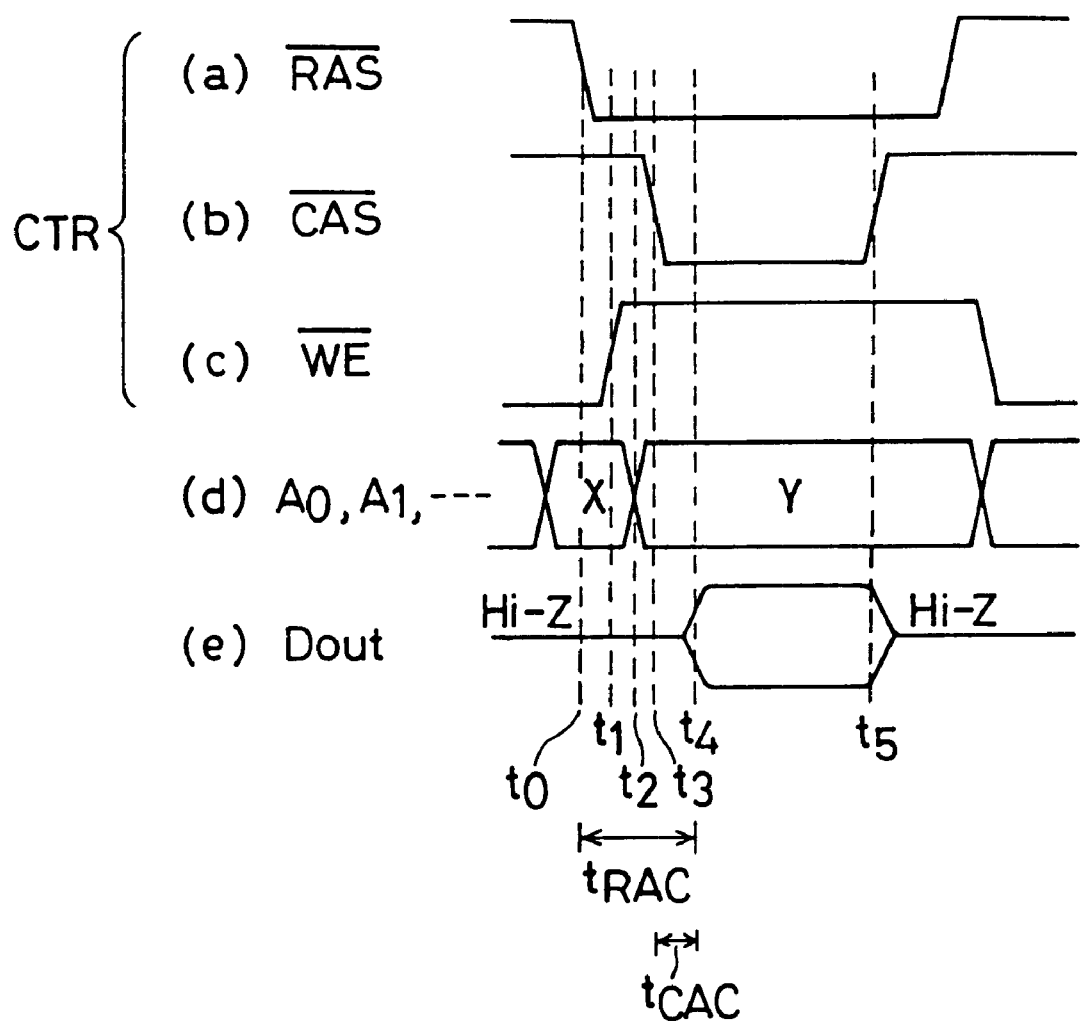
FIG. 3 is a timing chart showing an operation of a conventional DRAM.

MPU 40 includes a processing circuit 40a including the circuitry of MPU 10 shown in FIG. 4, and a cache memory 40b of the same structure as the circuitry of SRAM 11 shown in FIG. 1. The computer system further includes a main memory 41 formed of a DRAM, which receives address signals $A_i$, row address strobe signal $\overline{RAS}$, column address strobe signal $\overline{CAS}$ and write enable signal $\overline{WE}$ from MPU 40, and performs reading and writing of data $D_x$ in accordance with these signals. Upon cache-hit, cache memory 40b is accessed. Upon mis-hit, main memory 41 is accessed.

In the computer of this eighth embodiment, cache memory 40b in MPU 40 supplies data $D_0$–$D_7$ to processing circuit 40a from the memory cell corresponding to the address signal, and also supplies to processing circuit 40a data output fixing signal OA which attains the H-level when the output of data $D_0$–$D_7$ is fixed. Processing circuit 40a, which receives data $D_0$–$D_7$ and data output fixing signal OA from cache memory 40b, latches and takes in data $D_0$–$D_7$ for processing the same when data output fixing signal OA attains a predetermined level.

Unless the computer is operated under the worst conditions of a high temperature and a low power supply voltage, data output fixing signal OA attains the H-level upon elapse of time $t_{AAC}$ shorter than maximum address access time $t_{AAC}(\text{max})$ of the cache memory. It is not necessary to perform the operation of latching, taking in and processing data $D_0$–$D_7$ by processing circuit 40a after elapse of maximum address access time $t_{AAC}(\text{max})$, i.e., in synchronization with a clock signal having a frequency longer than that determined in accordance with maximum address access time $t_{AAC}(\text{max})$ on the assumption that reading is completed only after elapse of maximum address access time $t_{AAC}(\text{max})$, as is done in the prior art. Therefore, this embodiment can suppress a wasted wait time equal to $(t_{AAC}(\text{max})-t_{AAC})$, and thus can increase the operation speed.

Since processing circuit 40a and cache memory 40b are provided at MPU 40 in one-chip, interface using data output fixing signal OA is restricted within the chip. With respect to external main memory 41, interface synchronized with a fixed frequency is used, as is done in the prior art. Therefore, MPU 40 can be used in a system using a conventional interface. By replacing an MPU in the conventional system with MPU 40 allowing fast cache access in the eighth embodiment, an operation speed of the whole system can be easily increased without increasing the numbers of data buses between MPU 40 and main memory 41 or pins.

Ninth Embodiment

Figure 31:
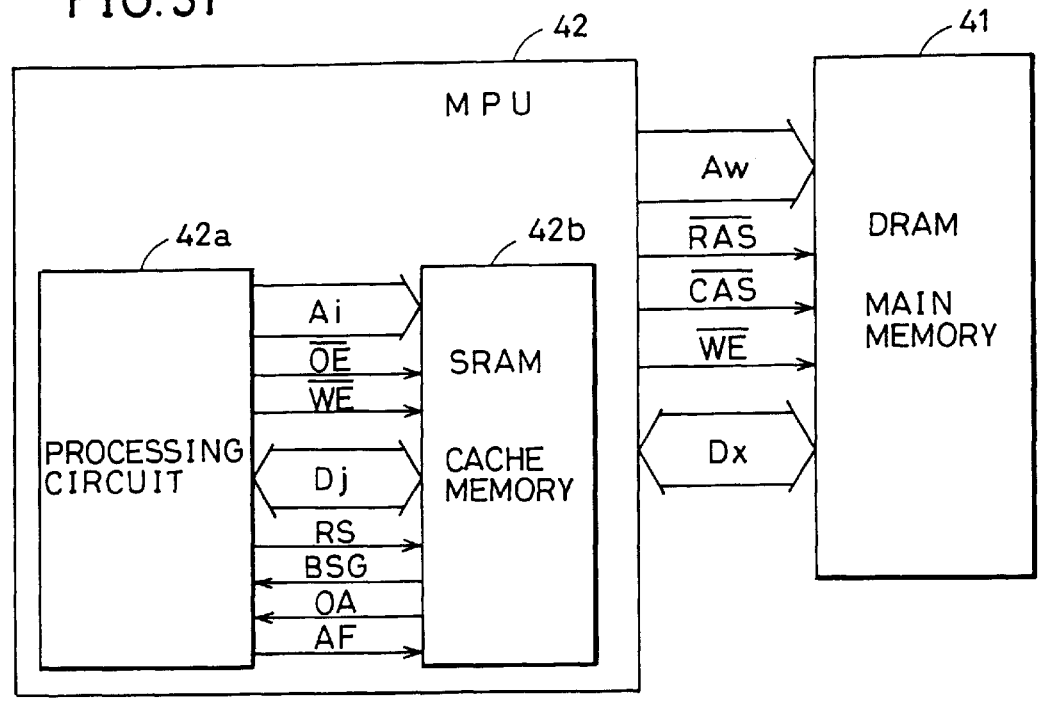
FIG. 31 is a block diagram of a computer system of a ninth embodiment of the invention.

A computer system of a ninth embodiment of this invention will be described below with reference to FIG. 31. Referring to FIG. 31, the computer system includes an MPU 42, which is an example of the computer of the invention, and specifically is a computer corresponding to that of the sixth embodiment shown in FIG. 19 but constructed in one-chip. MPU 42 includes a processing circuit 42a including the circuitry of MPU 32 shown in FIG. 19, and a cache memory 42b of the same structure as the circuitry of SRAM 33 shown in FIG. 19.

Similarly to the eighth embodiment, the system further includes main memory 41 formed of a DRAM, which receives address signals $A_w$, row address strobe signal $\overline{RAS}$, column address strobe signal $\overline{CAS}$ and write enable signal $\overline{WE}$ from MPU 42, and performs reading and writing of data $D_x$ in accordance with these signals. Upon cache-hit, cache memory 42b is accessed. Upon mis-hit, main memory 41 is accessed.

In the computer of this ninth embodiment, cache emory 42b in MPU 42 supplies data $D_0$–$D_7$ to processing circuit 42a from the memory cell corresponding to the address signal, and also supplies to processing circuit 42a data output fixing signal OA which attains the H-level when the output of data $D_0$–$D_7$ has settled. Processing circuit 42a receives data $D_0$–$D_7$ and data output fixing signal OA from cache memory 42b, and latches data $D_0$–$D_7$ for taking in and processing the same when data output fixing signal OA attains a predetermined level. Unless the computer is operated under the worst conditions of a high temperature and a low power supply voltage, this embodiment can suppress a wasted wait time, and thus can increase the operation speed.

Similarly to the eighth embodiment, since processing circuit 42a and cache memory 42b are provided at MPU 42 of one-chip, interface using data output fixing signal OA is restricted within the chip. With respect to external main memory 41, interface synchronized with a fixed frequency is used, as is done in the prior art. Therefore, MPU 42 can be used in a system using a conventional interface. By replacing an MPU in the conventional system with MPU 42 allowing fast cache access in the ninth embodiment, an operation speed of the whole system can be easily increased without increasing the numbers of data buses between MPU 42 and main memory 41, or pins.

Tenth Embodiment

A cache DRAM (which will be referred to as a "CDRAM") of a direct mapping type, which is an example of a semiconductor memory device of the invention, will be described below with reference to FIGS. 32–35. According to the direct mapping, blocks on a main memory is mapped in a specific block on a cache memory, and thus comparators can be reduced in number, resulting in reduction of a cost.

Figure 32:
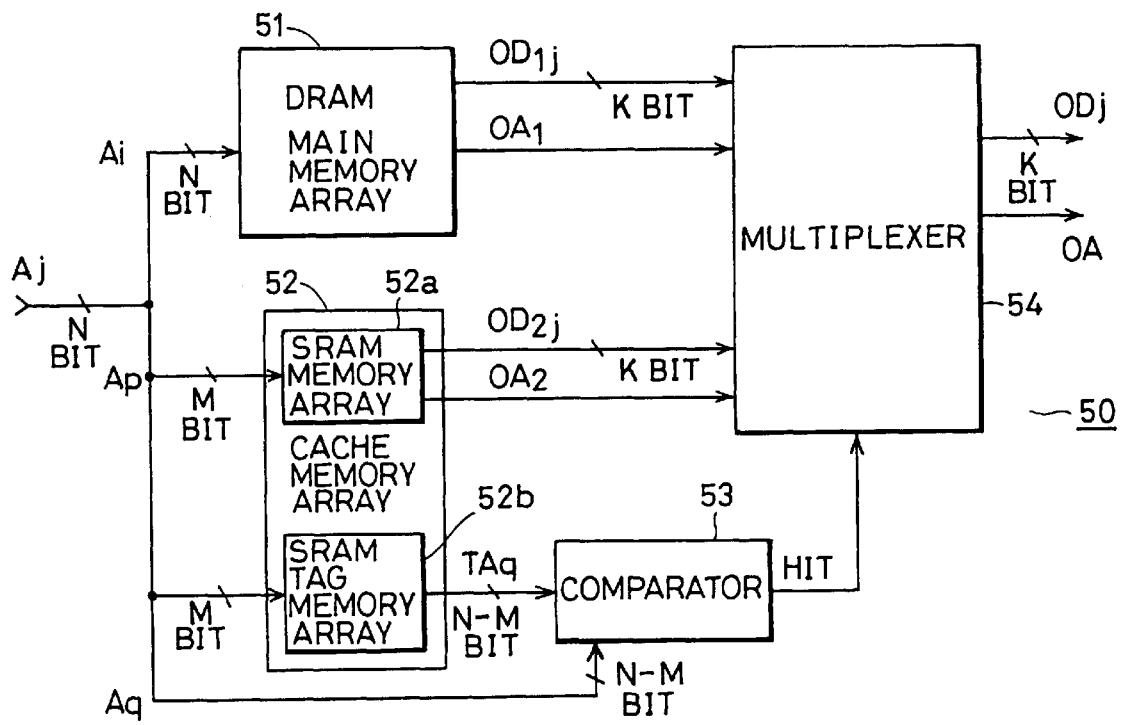
FIG. 32 is a block diagram showing a cache DRAM in the tenth embodiment of the invention.

Referring to FIG. 32, the cache DRAM includes a main memory array 51, which is formed of a plurality of DRAM memory cells, and receives main memory address signal $A_i$ of n-bits. Main memory array 51 produces data $OD_j$ of k (e.g., 1, 4, 8 or 16) bits stored in the DRAM memory cells selected in accordance with address signal $A_i$, and also produces a main memory output fixing signal $OA_j$ which attains the H-level in accordance with the output (i.e., fixing) of data $OD_j$.

Cache DRAM further includes a cache memory cell array 52.

Cache memory array 52 includes an SRAM memory array 52a which is a data memory portion, and a tag memory array 52b which is a directory portion.

SRAM memory array 52a is formed of a plurality of SRAM memory cells. SRAM memory array 52a receives a cache memory address signal $A_p$ formed of lower m bits of address signal $A_i$ of n bits, and produces data $OD2_j$ of k bits stored in SRAM memory cells selected by address signal $A_p$. At the same time, SRAM memory array 52a produces a cache memory output fixing signal $OA_2$, which attains the H-level in accordance with output (fixing) of data $OD2_j$.

SRAM tag array 52b is formed of a plurality of SRAM memory cells. SRAM tag array 52b receives cache memory address signal $A_p$ formed of lower m bits of address signal of n bits, and produces a tag address data $TA_q$ of (n-m) bits stored in SRAM memory cells selected in accordance with address signal $A_p$.

Cache DRAM further includes a comparator circuit 53, which receives block address $A_q$ of (n-m) bits corresponding to tag address data $TA_q$, of main memory address signal $A_i$ as well as tag address data $TA_q$, and supplies a cache-hit signal HIT, and a multiplexer 54 which receives data $OA_j$ of k bits and main memory output fixing signal $OA_1$ sent from main memory 51, data $OD_{2j}$ of k bits and cache memory output fixing signal $OA_2$ sent from cache memory 52, and cache-hit signal HIT sent from comparator circuit 53, and supplies output data $OD_j$ of k bits.

Comparator circuit 53 produces cache-hit signal HIT, which attains the H-level indicative of cache-hit when two inputs match together, and otherwise attains the L-level indicative of mis-hit.

Multiplexer circuit 54 outputs, as output data $OD_j$ of k bits, data $OD2_j$ sent from cache memory 52 when cache-hit signal HIT is at the H-level, and also outputs cache memory output fixing signal $OA_2$ as data output fixing signal OA. Multiplexer circuit 54 outputs, as output data $OD_j$ of k bits, data $OD1_k$ sent from main memory 51 when cache-hit signal HIT is at the L-level, and also outputs main memory output fixing signal $OA_1$ as data output fixing signal OA.

Figure 33:
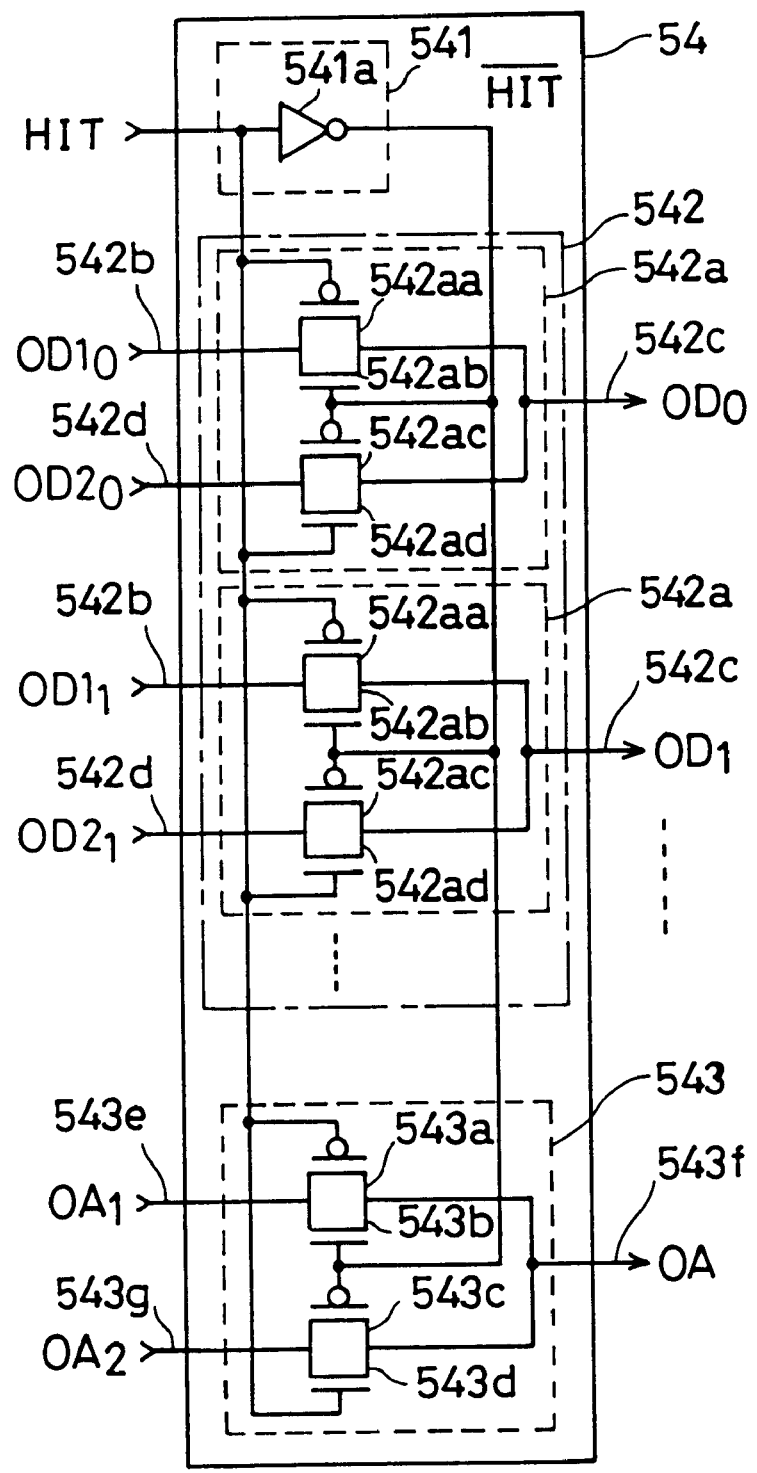
FIG. 33 is a circuit diagram showing a multiplexer of the cache DRAM in the tenth embodiment of the invention.

FIG. 33 is a circuit diagram of multiplexer 54. Referring to FIG. 33, multiplexer 54 includes a multiplexer control circuit 541, which receives cache-hit signal HIT and outputs cache-hit signal HIT and its inverted signal $\overline{HIT}$ for controlling multiplexer 54. Multiplexer control circuit 541 is formed of an inverter 541a, which receives cache-hit signal HIT and outputs its inverted signal $\overline{HIT}$.

Multiplexer 541 further includes an output data multiplexer 542, which receives cache-hit signals HIT and $\overline{HIT}$ sent from multiplexer control circuit 541 and data $OD_{1j}$ of k bits sent from main memory 51 as well as data $OD2_j$ of k bits sent from cache memory 52, and outputs one of them as output data $OD_j$. Multiplexer 542 outputs, as output data $OD_j$ of k bits, data $OD2_j$ sent from cache memory 52 when cache-hit signal HIT is at the H-level, and outputs, as output data $OD_j$ of k bits, data $OD1_j$ sent from main memory 51 when cache-hit signal HIT is at the L-level.

Output data multiplexer 542 includes k output data sub-multiplexers 542a. Each sub-multiplexer 542a receives cache-hit signal HIT and $\overline{HIT}$, data $OD2_j$ sent from main memory 51 to its input node 542b, and data $OD2_j$ sent from cache memory 52 to its input node 542d, and supplies data $OD2_j$ sent from cache memory 52 as output data $OD_j$ to an output node 542c when cache-hit signal HIT is at the H-level, or data $OD1_j$ sent from main memory 51 as output data $OD_j$ of k bits to output node 542c.

Each output data sub-multiplexer 542a includes a p-channel MOS transistor 542aa connected between input node 542b and output node 542c, and receiving cache-hit signal HIT on its gate electrode, an n-channel MOS transistor 542ab connected between input node 542b and output node 542c, and receiving cache-hit signal $\overline{HIT}$ on its gate electrode, a p-channel MOS transistor 542ac connected between input node 542d and output node 542c, and receiving cache-hit signal $\overline{HIT}$ on its gate electrode, and an n-channel MOS transistor 542ac connected between input node 542d and output node 542c, and receiving cache-hit signal HIT on its gate electrode.

Multiplexer 54 further includes a fixing signal multiplexer 543, which receives cache-hit signals HIT and $\overline{HIT}$ sent from multiplexer control circuit 541, main memory output fixing signal $OA_1$ sent from main memory 51 and cache memory output fixing signal $OA_2$ sent from cache-hit 52, and supplies signal $OA_1$ or $OA_2$ as data output fixing signal OA to an output node 543f in accordance with cache-hit signal HIT.

As data output fixing signal OA supplied to output node 543f, fixing signal multiplexer 543 selects main memory output fixing signal $OA_1$ when cache-hit signal HIT is at the H-level, and selects cache memory output fixing signal $OA_2$ when cache-hit signal is at the L-level.

Fixing signal multiplexer 543 includes a p-channel MOS transistor 543a connected between input node 543e and output node 543f, and receiving cache-hit signal HIT on its gate electrode, an n-channel MOS transistor 543b connected between input node 543e and output node 543f, and receiving cache-hit signal $\overline{HIT}$ on its gate electrode, a p-channel MOS transistor 543c connected between an input node 543g and output node 543f, and receiving cache-hit signal $\overline{HIT}$ on its gate electrode, and an n-channel MOS transistor 543d connected between input node 543g and output node 543f, and receiving cache-hit signal HIT on its gate electrode.

Figure 34:
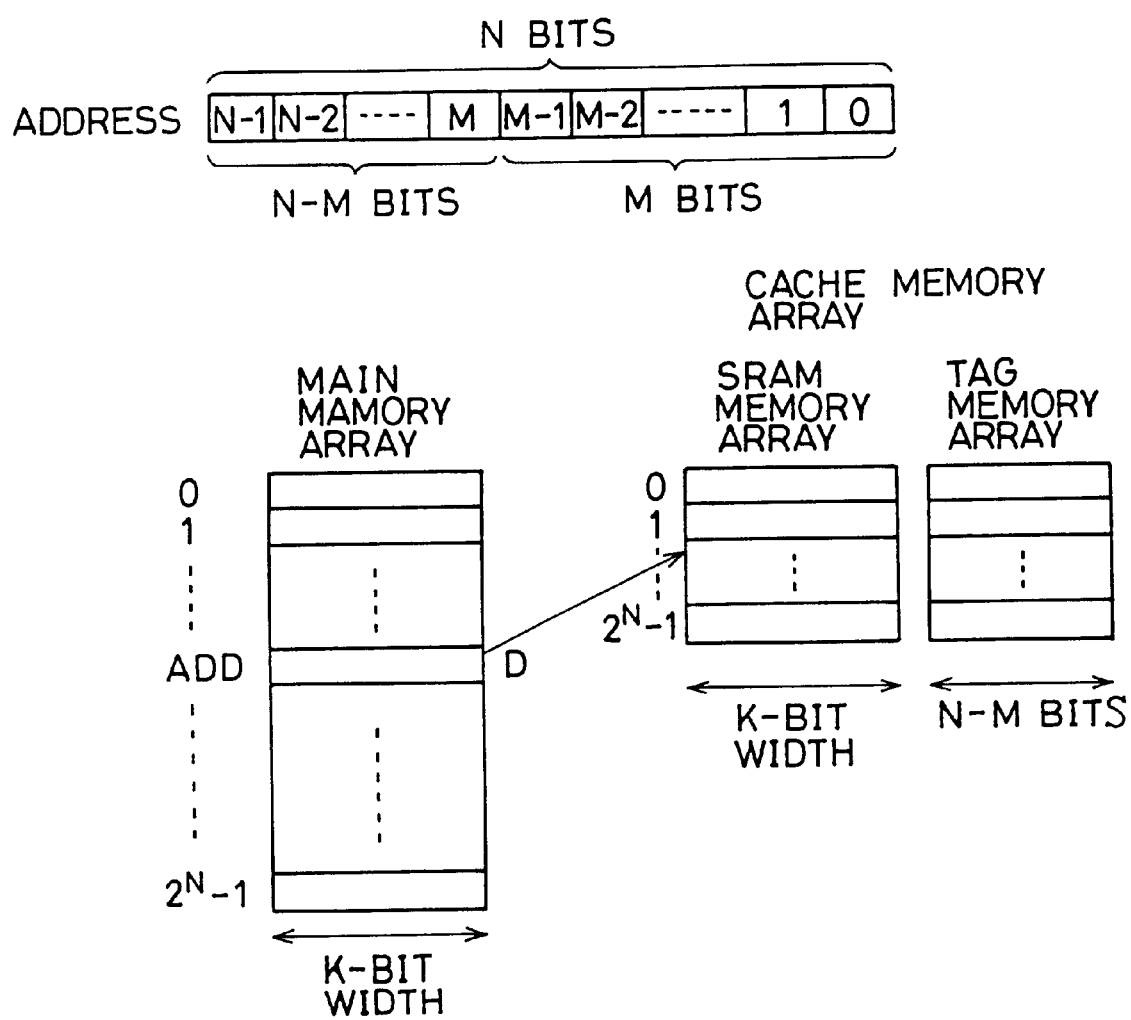
FIG. 34 shows a memory space of the cache DRAM in the tenth embodiment of the invention.

FIG. 34 shows a memory space of the direct mapping system. Referring to FIG. 34, data D of a k-bit width on the main memory is externally supplied upon mis-hit. At the same time, data D is copied to an address of the SRAM memory array designated by cache memory address signal $A_p$ formed of lower m bits of main memory address signal $A_i$ of n bits designating the address at which data D is stored. Upper (n-m) bits of main memory address signal $A_i$ for specifying the address in the main memory corresponding to data D are stored as tag address data at the address in the tag memory array designated by cache memory address signal $A_p$.

When the same address signal is supplied again thereafter, cache-hit occurs and data D is supplied from the corresponding address in the SRAM memory array, because the tag address data equal to the upper (n-m) bits of the address signal is stored at the address in the tag memory array designated by the supplied address signal.

Operation of CDRAM 50 thus constructed will be described below with reference to FIG. 35. More specifically, description will be given on reading in such a case that cache-hit occurs at the first access and mis-hit occurs at the subsequent access.

Figure 35:
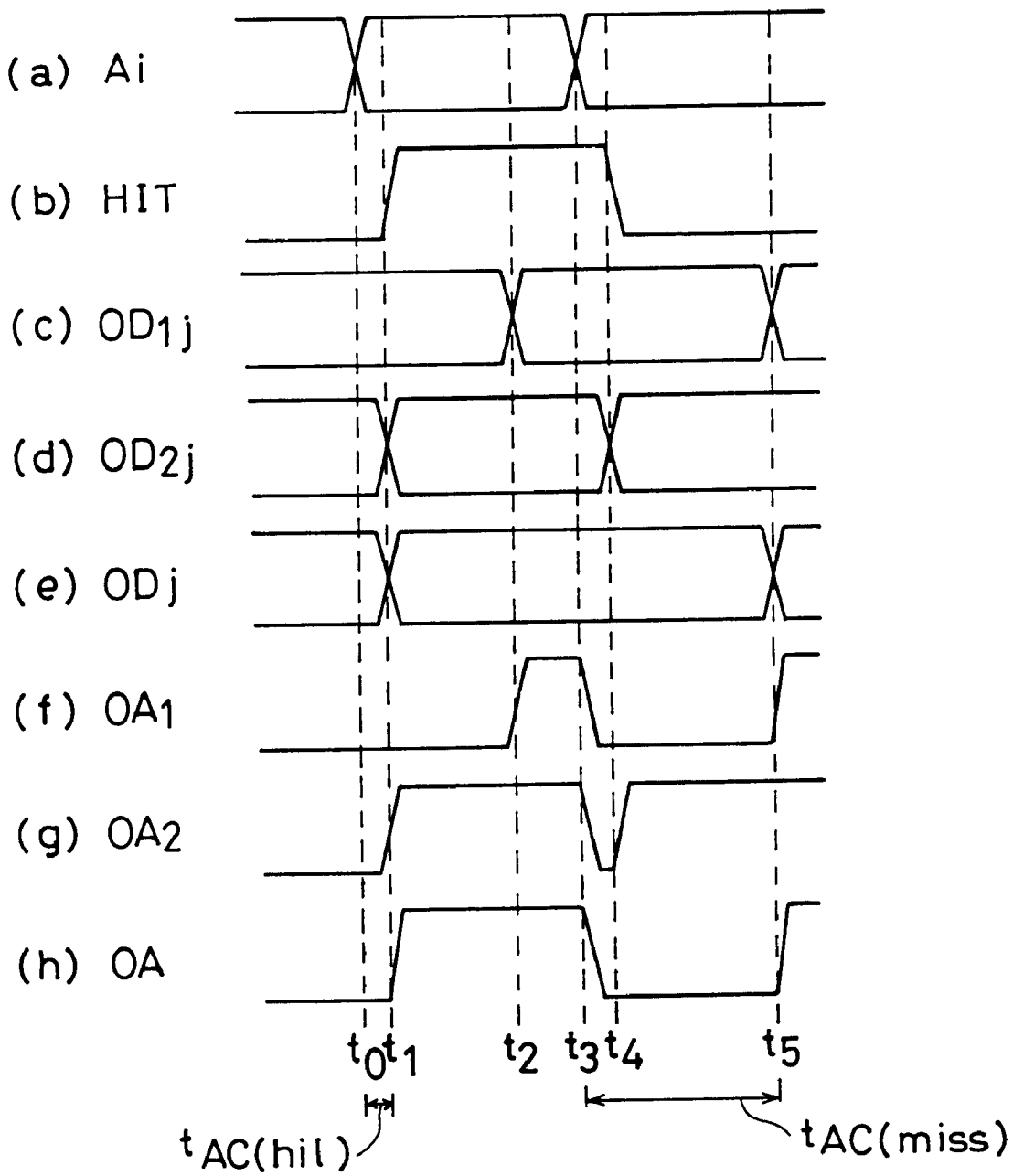
FIG. 35 is a circuit diagram showing an operation of the cache DRAM in the tenth embodiment of the invention.

First, intended address signal $A_i$ (in the case of time sharing, a column address after application of a row address signal) is applied at time $t_0$ as shown at (a) in FIG. 35. In response to lower m bits of address signal $A_i$, tag memory array 52b outputs tag address data $TA_q$. Comparator 53 receiving this compares the upper (n-m) bits of address signal $A_i$ and tag address data $TA_q$, and sets cache-hit signal HIT to the H-level indicative of the cache-hit at time $t_j$ as shown at (b) in FIG. 35.

Data $OD2_j$ of k bits is supplied from the selected memory cells in SRAM memory array 52a substantially at time $t_1$ as shown at (d) in FIG. 35. At the same time, cache memory output fixing signal $OA_2$ is set to the H-level as shown at (g) in FIG. 35. Multiplexer 54 receives cache-hit signal HIT at the H-level, and outputs data $OD2_j$ sent from SRAM memory array 52a as output data $OD_j$ substantially at time $t_1$ as shown at (e) in FIG. 35. At the same time, multiplexer 54 supplies cache memory output fixing signal $OA_2$ as data output fixing signal OA as shown at (h) in FIG. 35.

Data $OD1_j$ is supplied from main memory 51, of which reading speed is lower than that of the cache memory, at time $t_2$ as shown at (c) in FIG. 35. Main memory output fixing signal $OA_1$ rises to the H-level as shown at (f) in FIG. 35. However, data $OD1_j$ and main memory output fixing signal $OA_1$ are not output, because cache-hit signal HIT supplied to multiplexer 54 is at the H-level.

When next address signal $A_i$ is applied at time $t_3$ as shown at (a) in FIG. 35, tag memory array 52b outputs tag address data $TA_q$ in response to the lower m bits of address signal $A_i$. Comparator 53 receiving the same compares the upper (n-m) bits of address signal $A_i$ and tag address data $TA_q$ with each other, and sets cache-hit signal HIT to the L-level indicative of mis-hit at time $t_4$ as shown at (b) in FIG. 35.

Data $OD2_j$ of k bits is supplied from the selected memory cells in SRAM memory array 52a substantially at time $t_4$ as shown at (d) in FIG. 35. At the same time, cache memory output fixing signal $OA_2$ is set to the H-level as shown at (g) in FIG. 35. However, cache-hit signal HIT received by multiplexer 54 is at the L-level, so that multiplexer 54 neither supplies data $OD2_j$ sent from SRAM memory array 52a as output data $OD_j$ nor supplies cache memory output fixing signal $OA_2$ as data output fixing signal OA.

Data $OD1_j$ is supplied from main memory 51, of which reading speed is lower than that of the cache memory, at time $t_5$ as shown at (c) in FIG. 35, and main memory output fixing signal $OA_1$ rises to the H-level as shown at (f) in FIG. 35. Multiplexer 54 receiving cache-hit signal HIT at the L-level outputs data $OD1_j$ as output data $OD_j$ at time $t_5$ as shown at (e) in FIG. 35. At the same time, multiplexer 54 outputs main memory output fixing signal $OA_1$ as data output fixing signal OA as shown at (h) in FIG. 35.

As described above, CDRAM 50 of the tenth embodiment outputs data output fixing signal OA, which attains the H-level in response to cache memory output fixing signal $OA_2$ when cache-hit signal HIT is at the H-level indicative of cache-hit, and attains the H-level in response to main memory output fixing signal $OA_1$ when cache-hit signal HIT is at the L-level indicative of mis-hit.

In response to the H-level of data output fixing signal OA, a device receiving data $D_j$ of CDRAM 50 may be operated, in which case data output fixing signal OA attains the H-level in a time shorter than the maximum access time equal to the access time required under the worst conditions of a high temperature and a low power supply voltage regardless of cache-hit and mis-hit, unless the operation is performed under the worst condition. Therefore, a wasted wait time is suppressed, and the operation speed can be increased.

According to the conventional interface synchronized with the clock signal of a fixed frequency, the cache memory of a high speed is accessed when cache-hit occurred, so that data can be taken in response to rise of the next clock signal applied after start of access with no wait. In this conventional system, however, the main memory of a low speed is accessed when mis-hit occurred, so that it is necessary to set the wait state by externally indicating the mis-hit with the cache-hit signal so as to prevent taking in of data for cycles of the clock signal. In contrast to this, CDRAM 50 of the tenth embodiment can take the data into the processing device in response to rise of data output fixing signal OA, so that it is not necessary to indicate externally whether cache-hit occurs or not.

Eleventh Embodiment

Figure 36A:
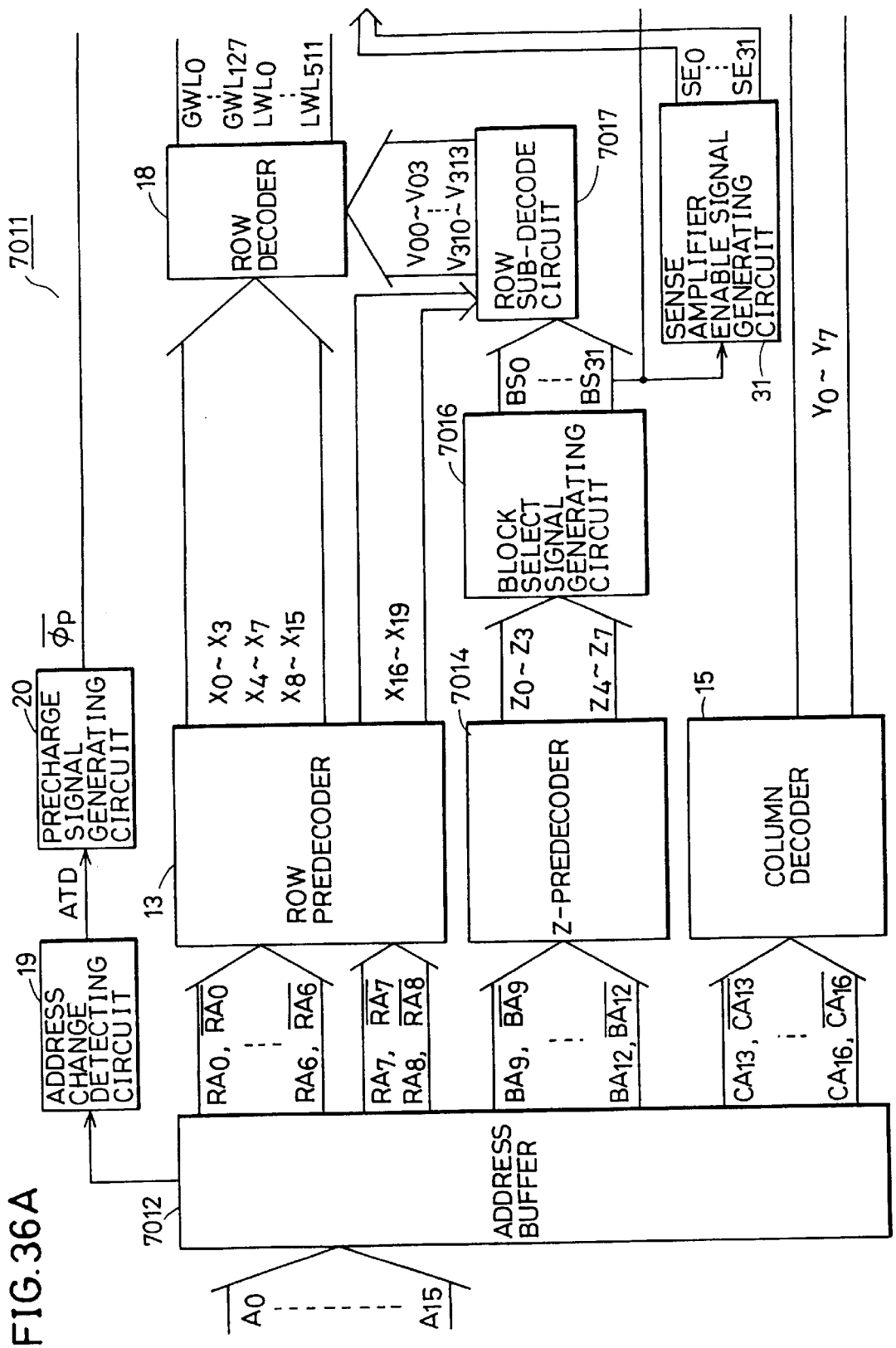
FIGS. 36A and 36B are block diagrams of an SRAM in the eleventh embodiment of the invention.
Figure 36B:
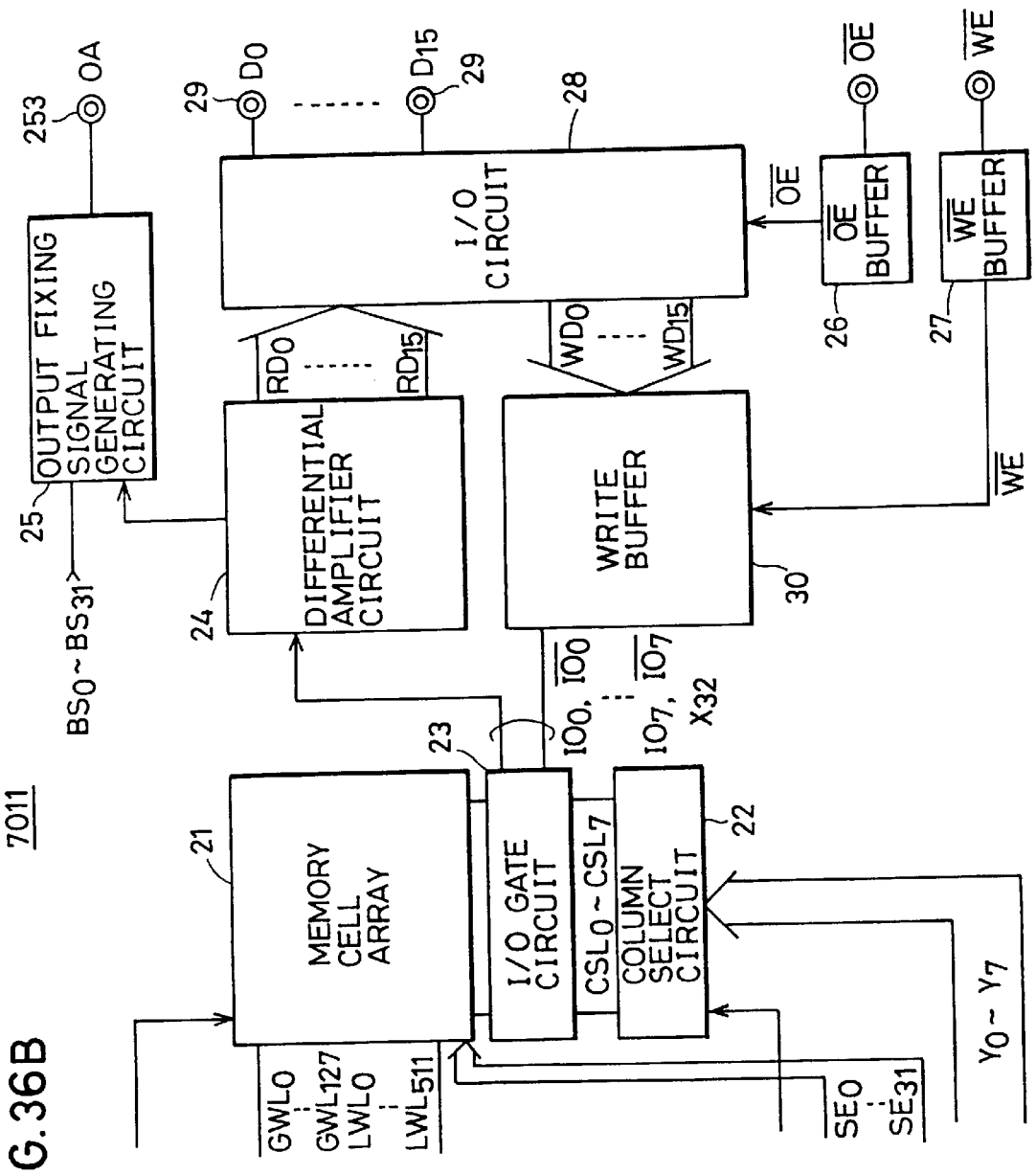

A computer of the eleventh embodiment of the invention will be described below with reference to FIGS. 36A and 36B. In the eleventh embodiment, the multiplexer used in the tenth embodiment is applied to output fixing signal generating circuit 25 of SRAM 11 in the first embodiment. FIGS. 36A and 36B are block diagrams of an SRAM 7011 of the eleventh embodiment.

A major difference between SRAM 7011 and SRAM 11 of the first embodiment is as follows. Although input/output data in the first embodiment is data $D_0$–$D_7$ of 8 bits, input/output data in this eleventh embodiment is data $D_0$–$D_{15}$ of 16 bits. In accordance with this, externally applied address signal $A_i$ is reduced by one bit to $A_0$–$A_{15}$, and block address $BA_1$ supplied from address buffer 12 is reduced by one bit to $BA_9$, $\overline{BA_9}$–$BA_{12}$, $\overline{BA_{12}}$.

In accordance with the above, SRAM 7011 of the eleventh embodiment includes a Z-predecoder 7014, a block select signal generating circuit 7016 and output fixing signal generating circuit 25 in place of Z-predecoder 14, block select signal generating circuit 16 and output fixing signal generating circuit 25 in SRAM 11 of the first embodiment.

Z-predecoder 7014 outputs Z-predecode signals $Z_0$–$Z_3$, one of which attains the H-level in accordance with logic of $BA_9$, $\overline{BA_9}$, $BA_{10}$, and $\overline{BA_{10}}$, and also outputs Z-predecode signals $Z_4$–$Z_7$, one of which attains the H-level in accordance with logic of $BA_{11}$, $\overline{BA_{11}}$, $BA_{12}$ and $\overline{BA_{12}}$.

Block select signal generating circuit 7016 receiving Z-predecode signals $Z_0$–$Z_7$ produces block select signals $BS_0$–$BS_{31}$. Based on Z-predecode signals $Z_0$–$Z_7$, one of block select signals $BS_0$–$BS_{15}$ attains the H-level, and one of block select signals $BS_{16}$–$BS_{31}$ attain the H-level. Based on them, two of 32 memory cell arrays 21 of #0–#31 are activated.

Information of data $RD_j$ and $WD_j$ are transmitted 16 bits at a time between differential amplifier circuit 24 and I/O circuit 28, and between I/O circuit 28 and write buffer 30. Thus, 8 bits of $RD_{k0}$–$RD_{k7}$ and 8 bits of $WD_{k0}$–$WD_{k7}$ are transmitted for each memory cell array. Since two memory cell arrays are selected, 16 bits are transmitted in total.

Output fixing signal generating circuit 7025 receives block select signals $BS_0$–$BS_{31}$, and produces data output fixing signal OA, which attains the H-level at least when both array output fixing signals $MOA_k$ sent from two memory cell arrays 21 selected by block select signals $BS_0$–$BS_{31}$ attain the H-level.

Figure 37:
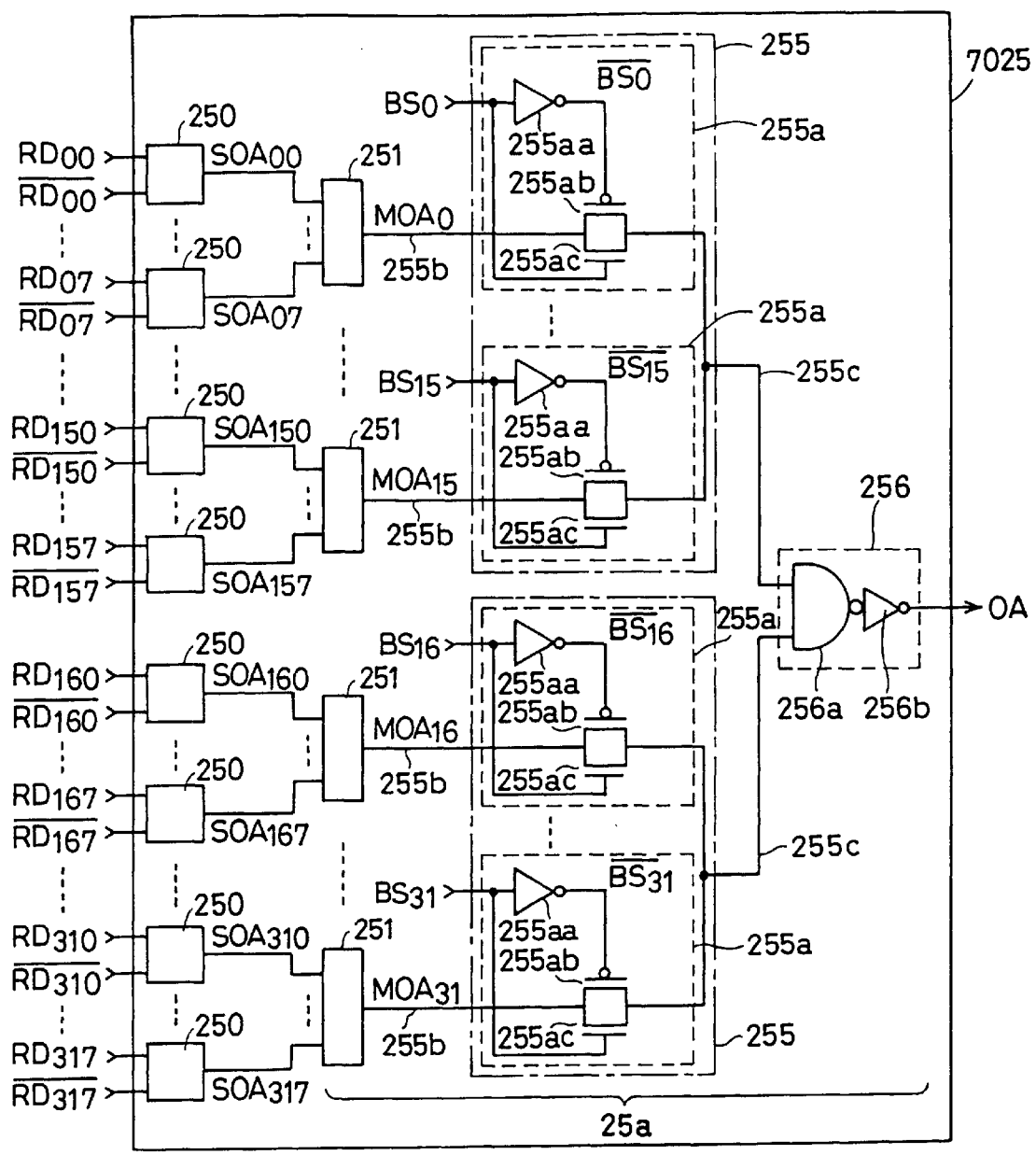
FIG. 37 is a circuit diagram showing an output fixing signal generating circuit of the SRAM in the eleventh embodiment of the invention.

FIG. 37 is a circuit diagram of output fixing signal generating circuit 7025. Referring to FIG. 37, output fixing signal generating circuit 7025 includes sub-output fixing signal generating circuits 250 and array output fixing signal generating circuits 251 which are the same as the circuits 250 and 251 in output fixing signal generating circuit 25 in the first embodiment shown in FIG. 11, and further includes two multiplexers 255, each of which receives block select signals $BS_0$–$BS_{15}$ and array output fixing signals $MOA_0$–$MOA_{15}$, or block select signals $BS_{16}$–$BS_{31}$ and array output fixing signals $MOA_{16}$–$MOA_{31}$, and supplies array output fixing signal $MOA_k$ corresponding to block select signal $BS_k$ at the H-level.

Each multiplexer 255 includes a plurality of sub-multiplexers 255a provided correspondingly to block select signals $BS_k$. Each sub-multiplexer 255a includes an inverter 255aa, which receives corresponding block select signal $BS_k$ and outputs its inverted signal $\overline{BS_k}$, a p-channel MOS transistor 255ab connected between input node 255b receiving array output fixing signal $MOA_K$ and output node 255c, and an n-channel MOS transistor 255ac connected between input node 255b and output node 255c.

Output fixing signal generating circuit 7025 further includes an AND circuit 256. AND circuit 256 receives array output fixing signals $MOA_k$ from two multiplexers 255, and outputs data output fixing signal OA which attains the H-level when both the received signals attain the H-level.

AND circuit 256 includes an NAND circuit 256a receiving array output fixing signals $MOA_k$ from two multiplexers 255, and an inverter 256b which receives an output of NAND circuit 256a and outputs data output fixing signal OA. AND circuit 256 forms the data output fixing signal generating circuit together with multiplexers 255. AND circuit 256, multiplexers 255 and array output fixing signal generating circuits 251 form main output fixing signal generating circuit 25a.

The eleventh embodiment of the invention thus constructed can achieve the effect similar to that by the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A computer comprising:

a memory having a plurality of memory cells, receiving a first signal indicative of existence and absence of request of operation and responding to predetermined change of said first signal indicative of generation of the request of the operation and an address signal, for outputting a busy signal at a predetermined level, data from the memory cell corresponding to said address signal and a data output fixing signal attaining a predetermined level in accordance with the output of said data; and processing means for applying said address signal and the first signal indicative of the request of the operation to said memory only when said busy signal is at a level other than said predetermined level, and taking in said data supplied from said memory in response to said data output fixing signal supplied from said memory attaining said predetermined level for processing the same.

2. The computer according to claim 1, wherein said first signal changes between first and second levels, said busy signal changes from a third level to a fourth level in response to the request of the operation, and said processing means suppresses the request of the operation from being applied to said memory when said busy signal is at said fourth level.

3. The computer according to claim 2, wherein said memory and said processing means are formed on a single chip.

4. A semiconductor memory device comprising:

a main memory having a plurality of DRAM memory cells, and receiving a main memory address signal to output data stored in said DRAM memory cells selected by said main memory address signal and a main memory output fixing signal attaining a first predetermined level in response to the output of said data; and a cache memory, said cache memory including, an SRAM memory array including a plurality of SRAM memory cells, and receiving a cache memory address signal for outputting the data stored in the SRAM memory cell selected in accordance with said cache memory address signal and outputting a cache memory output fixing signal attaining a second predetermined level in response to the output of said data, and a tag memory array including a plurality of SRAM memory cells, and receiving said cache memory address signal, for outputting tag address data stored in the SRAM memory cell selected in accordance with said cache memory address signal; wherein said semiconductor memory device further comprises:

comparator means for receiving a portion of said main memory address signal corresponding to said tag address data and outputting a cache-hit signal attaining a first level or a second level depending on whether both match together; and select means for receiving the data sent from said main memory, said main memory output fixing signal, the data sent from said cache memory, said cache memory output fixing signal and said cache-hit signal sent from said comparator means, for selecting, depending on said cache-hit signal, said data and said cache memory data output fixing signal sent from said cache memory, or said data and said main memory output fixing signal sent from said main memory for outputting the same as output data and a data output fixing signal.

5. The semiconductor memory device according to claim 4, wherein said select means outputs output data corresponding to the data sent from said cache memory and the data output fixing signal attaining a third predetermined level in response to the second predetermined level of said cache memory output fixing signal when said cache-hit signal is at said first level, and outputs output data corresponding to the data sent from said main memory and the data output fixing signal attaining a third predetermined level in response to the first predetermined level of said main memory output fixing signal when said cache-hit signal is at said second level.

6. A computer comprising:

storage means, having a plurality of memory cells, for outputting (a) a busy signal being set to one level indicating a busy state in response to an operation request signal being at one level indicating that an operation of said storage means is requested, and (b) data from the memory cell corresponding to an address signal; and processing means for applying the operation request signal and the address signal, the operation request signal being rendered said one level when the busy signal is at another level indicating non-busy state, for taking in data outputted from said storage means in response to a data strobe signal indicating that data outputted from said storage means is valid, and for processing data taken in.

7. The computer according to claim 6, wherein said storage means applies the data strobe signal to said processing means.

8. The computer according to claim 6, wherein the operation request signal is rendered another level when the busy signal is at said one level.

9. The computer according to claim 6, wherein said storage means and said processing means are formed on a single chip.

* * * * *